United States Patent
Lin et al.

(10) Patent No.: US 10,115,808 B2
(45) Date of Patent: Oct. 30, 2018

(54) FINFET DEVICE AND METHODS OF FORMING

(71) Applicant: Taiwan Semiconductor Manufacturing Company, Ltd., Hsinchu (TW)

(72) Inventors: Yu-Chang Lin, Hsinchu (TW); Chun-Feng Nieh, Hsinchu (TW); Huicheng Chang, Tainan (TW); Tien-Shun Chang, New Taipei (TW); Wei-Ting Chien, Hsinchu (TW); Chih-Pin Tsao, Zhubei (TW); Hou-Ju Li, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/611,599

(22) Filed: Jun. 1, 2017

(65) Prior Publication Data
US 2018/0151706 A1 May 31, 2018

Related U.S. Application Data

(60) Provisional application No. 62/427,589, filed on Nov. 29, 2016.

(51) Int. Cl.
*H01L 29/66* (2006.01)
*H01L 21/225* (2006.01)
(Continued)

(52) U.S. Cl.
CPC .... *H01L 29/66803* (2013.01); *H01L 21/2254* (2013.01); *H01L 21/324* (2013.01);
(Continued)

(58) Field of Classification Search
CPC ........... H01L 29/66803; H01L 29/7851; H01L 29/7833; H01L 29/0847; H01L 21/324;
(Continued)

(56) References Cited

U.S. PATENT DOCUMENTS

| 8,836,016 B2 | 9/2014 | Wu et al. |
| 8,841,701 B2 | 9/2014 | Lin et al. |

(Continued)

FOREIGN PATENT DOCUMENTS

| CN | 102956445 A | 3/2013 |
| JP | 2007514294 A | 5/2007 |
| WO | 2005043591 A2 | 5/2005 |

*Primary Examiner* — Jarrett Stark
(74) *Attorney, Agent, or Firm* — Slater Matsil, LLP

(57) ABSTRACT

A finFET device and methods of forming a finFET device are provided. The method includes depositing a dummy gate over and along sidewalls of a fin extending upwards from a semiconductor substrate, forming a first gate spacer along a sidewall of the dummy gate, and plasma-doping the first gate spacer with carbon to form a carbon-doped gate spacer. The method further includes forming a source/drain region adjacent a channel region of the fin and diffusing carbon from the carbon-doped gate spacer into a first region of the fin to provide a first carbon-doped region. The first carbon-doped region is disposed between at least a portion of the source/drain region and the channel region of the fin.

20 Claims, 68 Drawing Sheets

(51) Int. Cl.
 *H01L 21/324* (2006.01)
 *H01L 29/08* (2006.01)
 *H01L 29/78* (2006.01)
(52) U.S. Cl.
 CPC .... *H01L 29/0847* (2013.01); *H01L 29/66492* (2013.01); *H01L 29/66545* (2013.01); *H01L 29/66636* (2013.01); *H01L 29/7833* (2013.01); *H01L 29/7851* (2013.01)
(58) Field of Classification Search
 CPC ......... H01L 29/66492; H01L 29/66636; H01L 29/66545; H01L 21/2254
 See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,362,407 B1* | 6/2016 | Basker | H01L 21/823821 |
| 9,520,482 B1 | 12/2016 | Chang et al. | |
| 9,576,814 B2 | 2/2017 | Wu et al. | |
| 9,685,334 B1* | 6/2017 | Ke | H01L 21/2254 |
| 2006/0234488 A1 | 10/2006 | Kim et al. | |
| 2008/0006908 A1 | 1/2008 | Lin et al. | |
| 2010/0099247 A1* | 4/2010 | Balseanu | H01L 21/28282 438/591 |
| 2014/0015104 A1* | 1/2014 | Su | H01L 21/225 257/611 |
| 2016/0240651 A1* | 8/2016 | Lee | H01L 29/785 |
| 2017/0317213 A1* | 11/2017 | Park | H01L 21/0214 |

\* cited by examiner

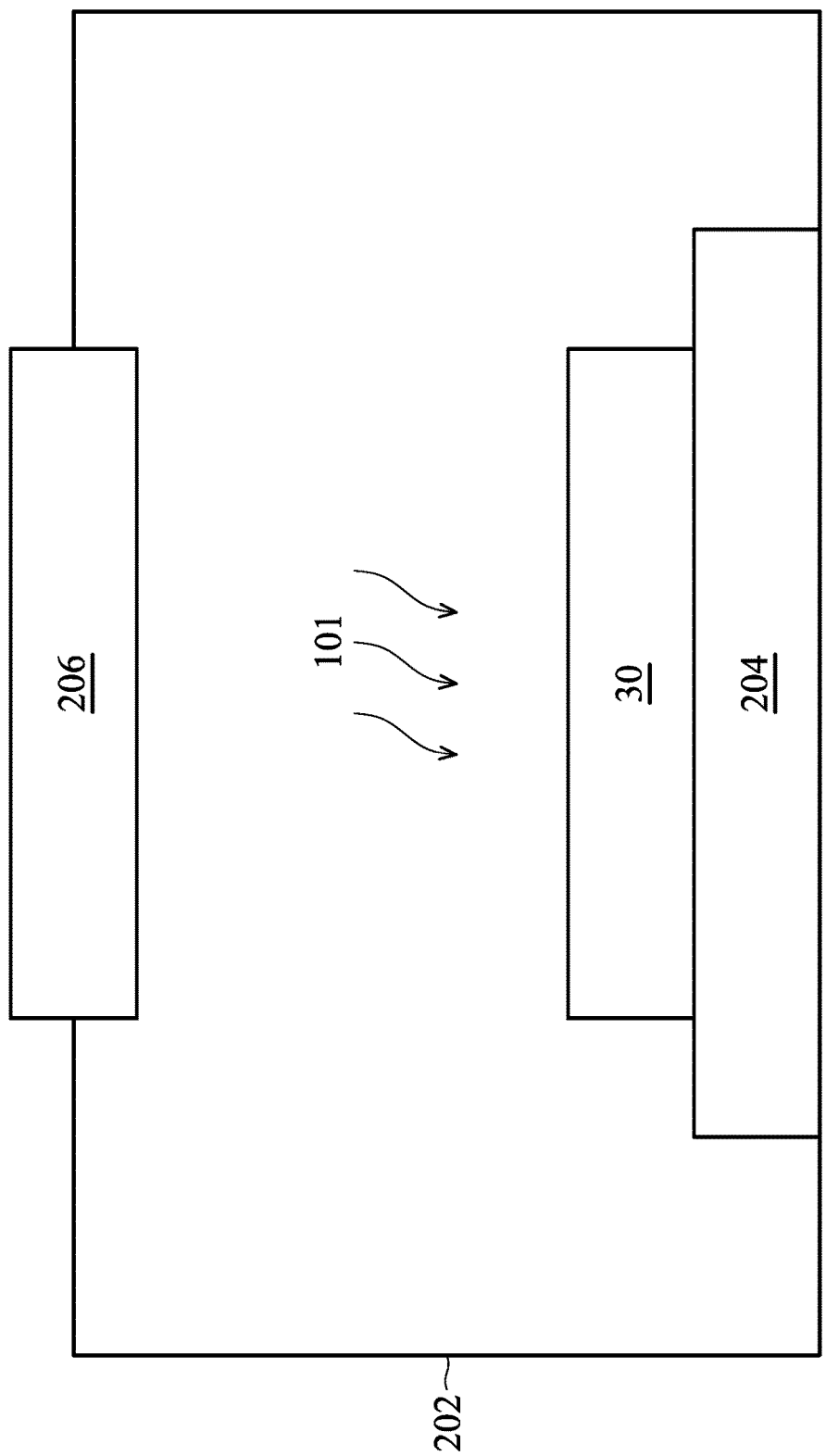

FINFET DEVICE AND METHODS OF FORMING

PRIORITY

This application claims the benefit of U.S. Provisional Application No. 62/427,589, filed on Nov. 29, 2016, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10D is a cross-sectional depiction of a finFET device in a process chamber in accordance with some embodiments.

DETAILED DESCRIPTION

Figure 1:
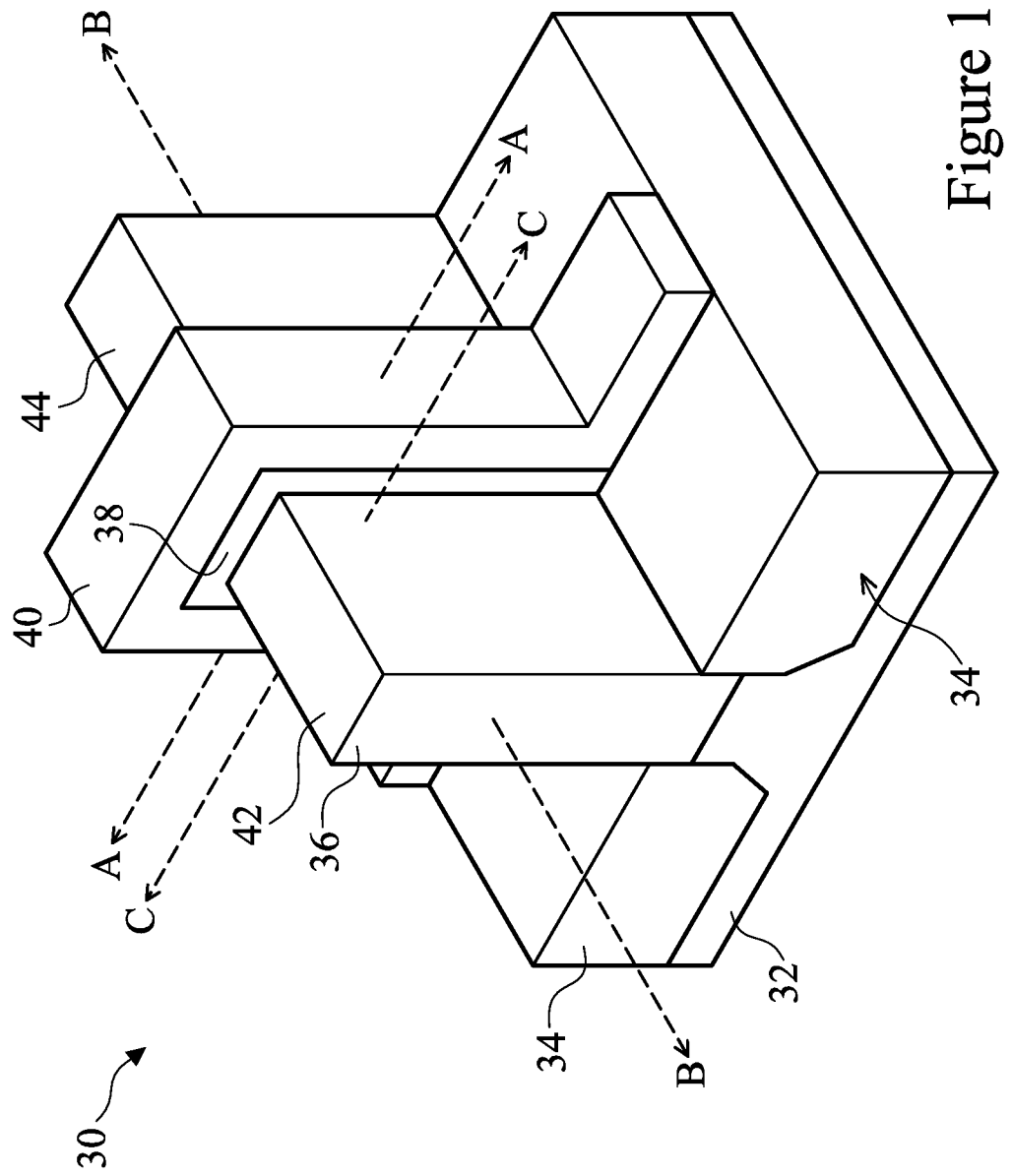
FIG. 1 is a perspective view of a fin field effect transistor ("finFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a fin field-effect transistor (finFET) 30 in a three-dimensional view. The finFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is across a channel, gate dielectric 38, and gate electrode 40 of the finFET 30. Cross-section C-C is in a plane that is parallel to cross section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

Some embodiments discussed herein are discussed in the context of finFETs formed using a gate-last process. In other embodiments, a gate-first process may be used. Also, some embodiments contemplate aspects used in planar devices, such as planar FETs.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

FIGS. 2 through 29 are cross-sectional views of intermediate stages in the manufacturing of finFETs in accordance with an exemplary embodiment. FIGS. 2 through 5, 28, and 29 illustrate reference cross-section A-A illustrated in FIG. 1, except for multiple finFETs. In FIGS. 6 through 27B, figures ending with an "A" designation are illustrated along a similar cross-section A-A; figures ending with a "B" designation are illustrated along a similar cross-section B-B; and figures ending with a "C" designation are illustrated along a similar cross-section C-C. FIGS. 17 and 22 illustrate reference cross-section C-C illustrated in FIG. 1.

Figure 2:
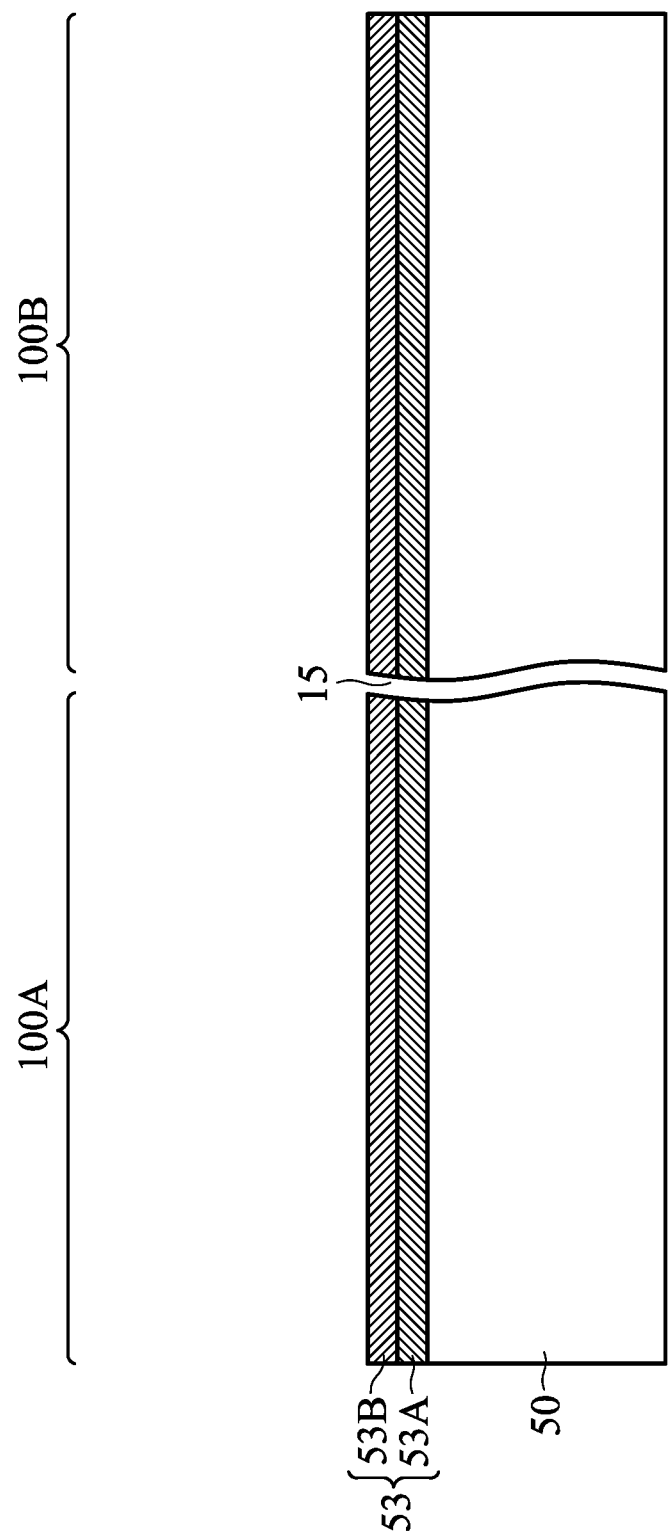
FIGS. 2-5 are cross-sectional views of intermediate stages in the manufacture of a finFET device in accordance with some embodiments.

FIG. 2 illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 100A and a second region 100B. The first region 100A can be for forming n-type devices, such as NMOS transistors, such as n-type finFETs. The second region 100B can be for forming p-type devices, such as PMOS transistors, such as p-type finFETs. The divider 15 between the first region 100A and the second region 100B indicates a physical separation between the first region 100A and the second region 100B. Components of first region 100A may be physically separated from components of second region 100B, but are illustrated side by side in subsequent figures for purposes of illustration.

FIG. 2 also shows the forming of mask 53 over substrate 50. In some embodiments, mask 53 may be used in a subsequent etching step to pattern substrate 50 (See FIG. 3). As shown in FIG. 2, mask 53 may include first mask layer 53A and second mask layer 53B. Mask layer 53A may be a hard mask layer, such as silicon nitride or the like, and may be formed using any suitable process, such as a deposition, atomic layer deposition (ALD) or physical vapor deposition (PVD). Mask layer 53A may be used to prevent or minimize an etching of substrate 50 underlying mask layer 53A in the subsequent etch step (See FIG. 3). Mask layer 53B may comprise photoresist, and in some embodiments may be used to pattern mask layer 53A for use in the subsequent etching step discussed above. Mask layer 53B can be formed by using a spin-on technique and can be patterned using acceptable photolithography techniques. In some embodiments, three or more masks 53 may be used.

Figure 3:
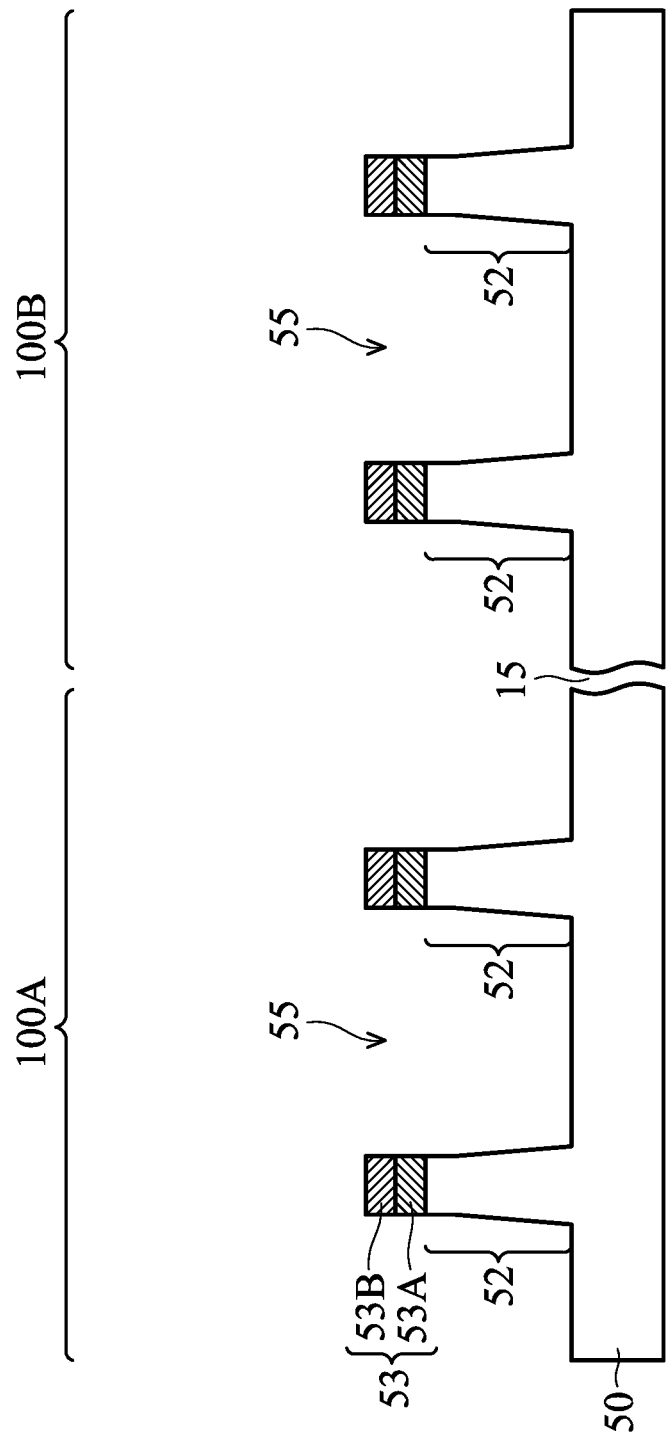

FIG. 3 illustrates the formation of semiconductor strips 52 in the substrate 50. First, mask layers 53A and 53B may be patterned, where openings in mask layers 53A and 53B expose areas of substrate 50 where trenches will be formed. Next, an etching process may be performed, where the etching process creates trenches in substrate 50 through openings in mask 53. The remaining sections of substrate 50 underlying patterned mask 53 form a plurality of semiconductor strips 52. The etching may be any acceptable etch process, such as a reactive ion etch (RIE), neutral beam etch (NBE), the like, or a combination thereof. The etch may be anisotropic.

Figure 4:
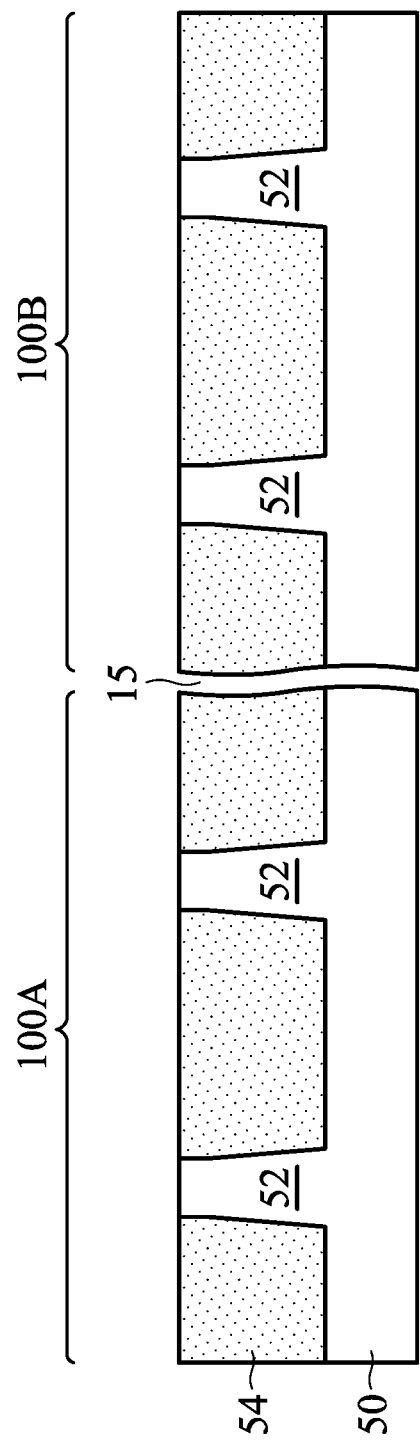

In FIG. 4 an insulation material is formed between neighboring semiconductor strips 52 to form isolation regions 54. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used.

Furthermore, in some embodiments, isolation regions 54 may include a conformal liner (not illustrated) formed on sidewalls and a bottom surface of trenches 55 (see FIG. 3) prior to the filling of trenches 55 with an insulation material of isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of the liner may include any suitable method, such as, ALD, CVD, high density plasma (HDP) CVD, PVD, and the like. In such embodiments, the liner may prevent (or at least reduce) the diffusion of semiconductor material from semiconductor strips 52 (e.g., Si and/or Ge) into the surrounding isolation regions 54 during the subsequent annealing of isolation regions 54. For example, after isolation regions 54 are deposited, an annealing process may be performed on the insulation material of isolation regions 54.

Further in FIG. 4, a planarization process, such as a chemical mechanical polish (CMP), may remove any excess insulation material and form top surfaces of the isolation regions 54 and top surfaces of the semiconductor strips 52 that are coplanar. In some embodiments, the CMP may also remove mask 53. In other embodiments mask 53 may be removed using a wet cleaning process separate from the CMP.

Figure 5:
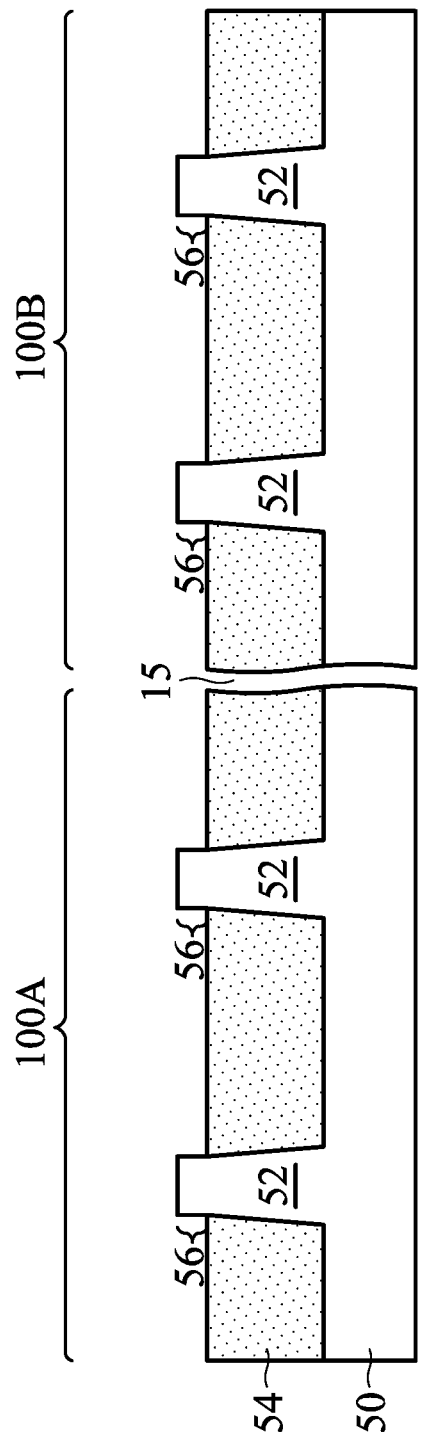

FIG. 5 illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 5 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 4 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
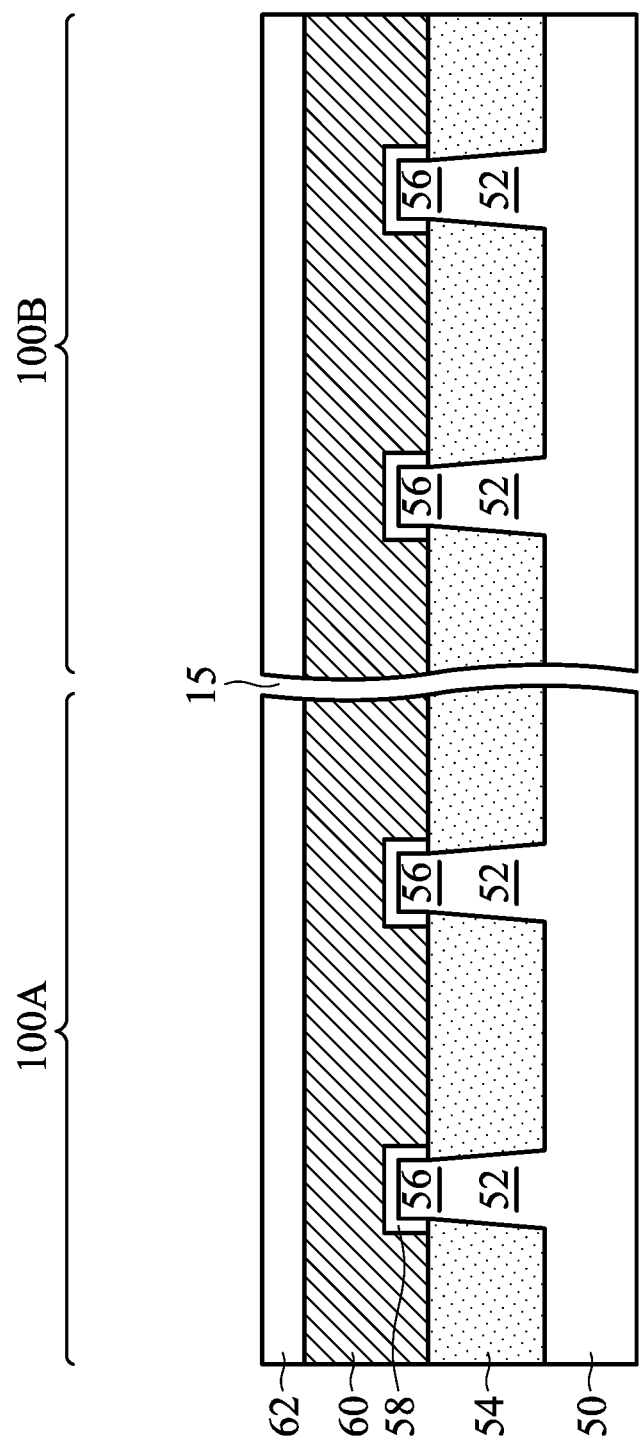
FIGS. 6A and 6B are cross-sectional views of intermediate stages in the manufacture of a finFET device in accordance with some embodiments.
Figure 6B:
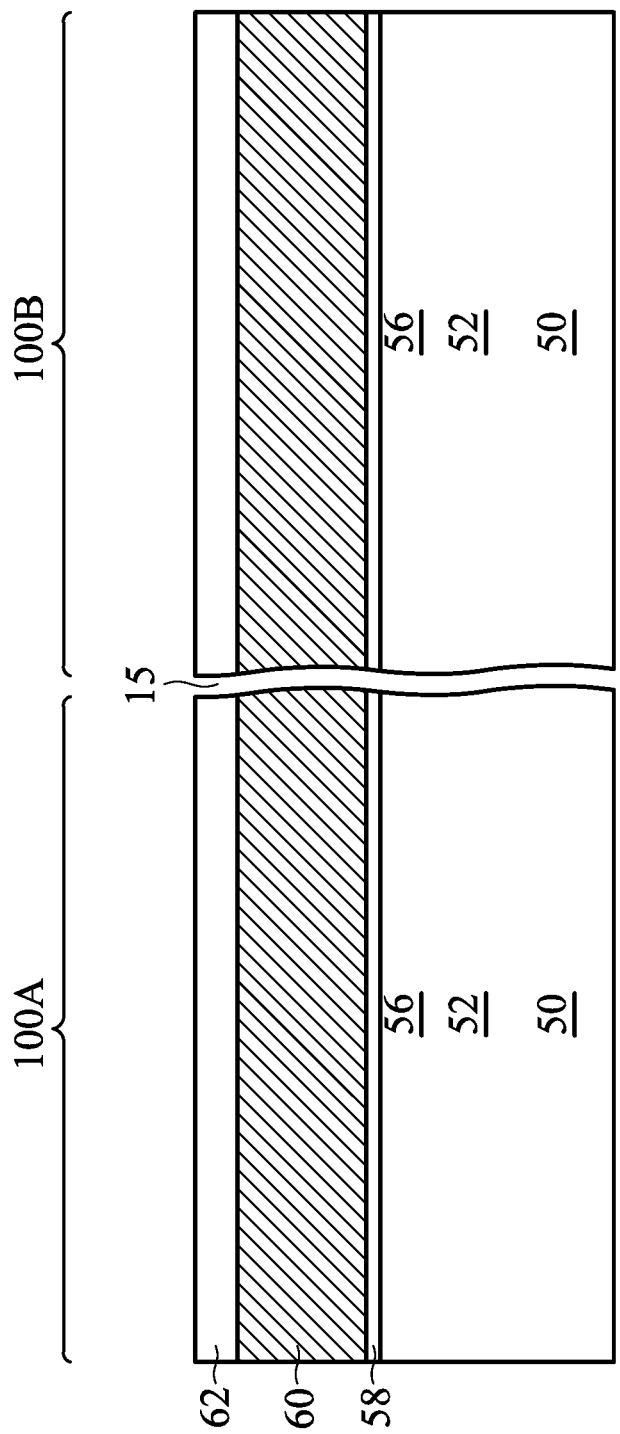

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, or the like) or thermally grown (for example, using thermal oxidation or the like) according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 100A and the second region 100B. In other embodiments, separate dummy gate layers may be formed in the first region 100A and the second region 100B, and separate mask layers may be formed in the first region 100A and the second region 100B.

Figure 7A:
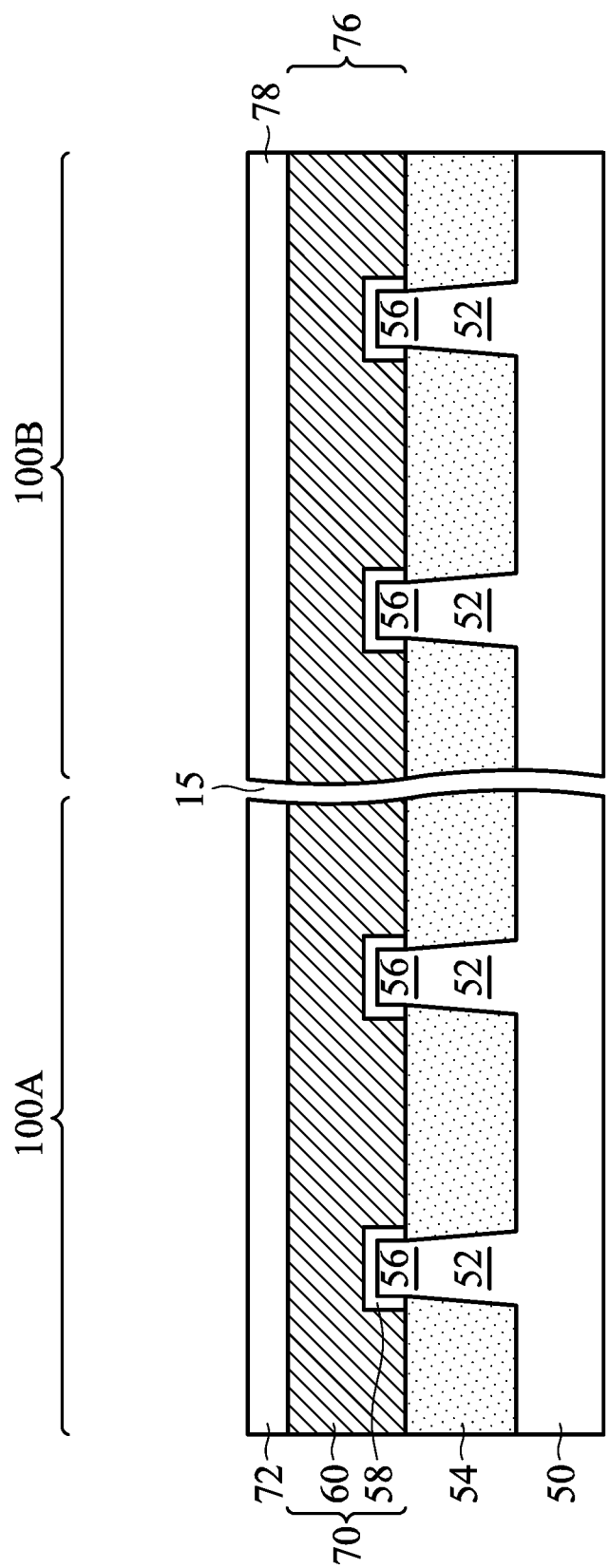
FIGS. 7A, 7B, and 7C are cross-sectional views of intermediate stages in the manufacture of a finFET device in accordance with some embodiments.
Figure 7B:
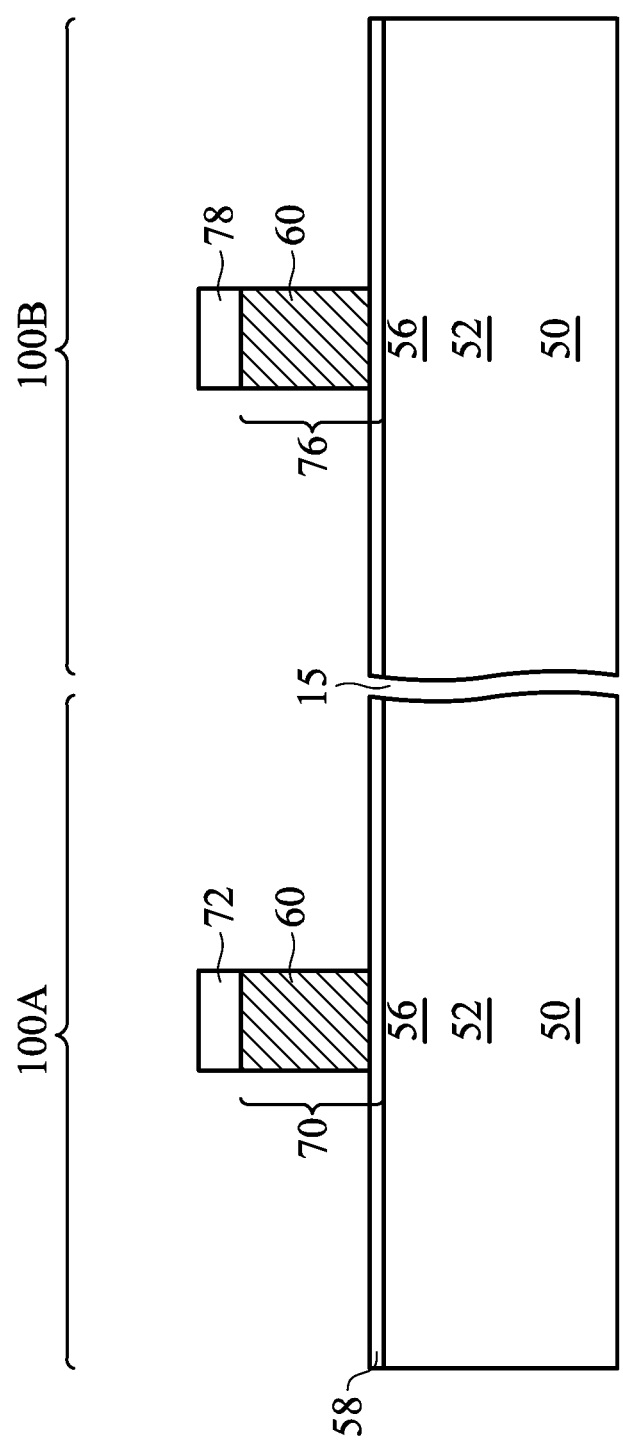
Figure 7C:
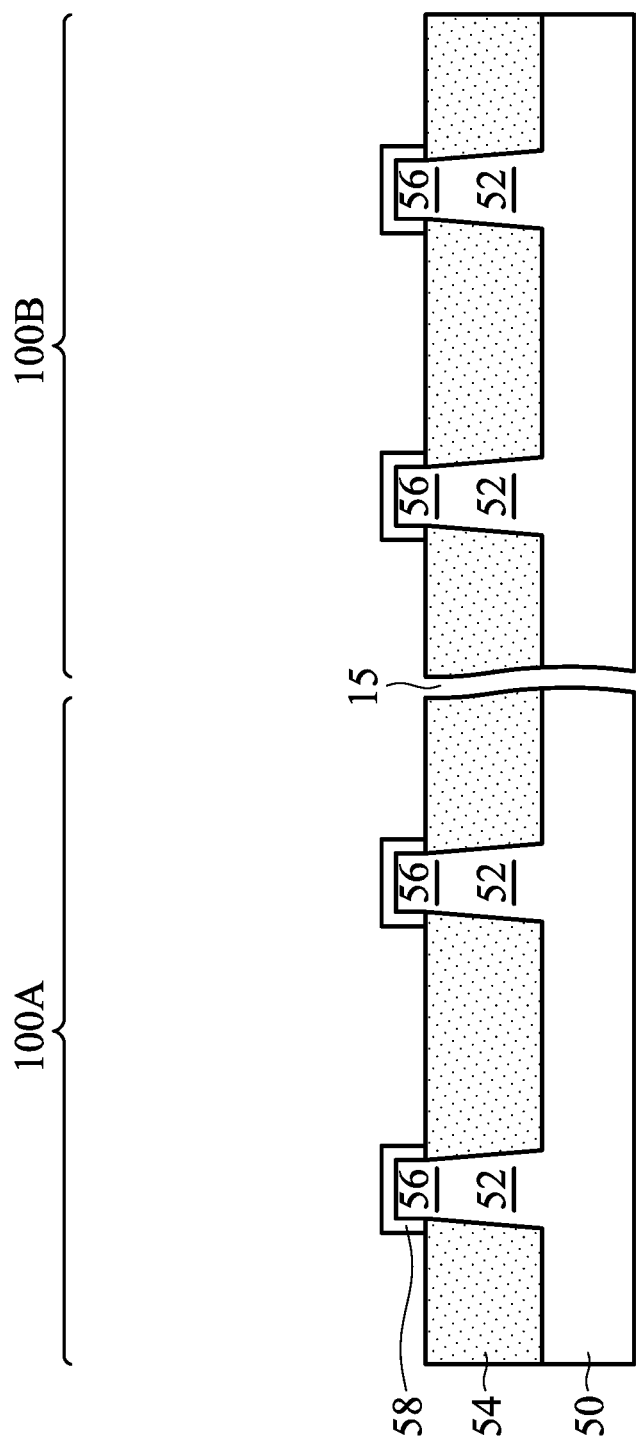

In FIGS. 7A, 7B, and 7C, the mask layer 62 may be patterned using acceptable photolithography and etching techniques to form mask 72 in the first region 100A and mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of masks 72 and 78 may similarly be transferred to dummy dielectric layer 58. The pattern of dummy gates 70 and 76 cover respective channel regions of the fins 56 while exposing source/drain regions of the fins 56. The dummy gates 70 and 76 may also have a lengthwise direction substantially perpendicular to the lengthwise direction of respective epitaxial fins.

Furthermore, although not explicitly illustrated, masks 72 and 78 may be used to pattern dummy gate layer 60 and optionally dummy dielectric layer 58 in cross section A-A of FIGS. 1 and 7A. Specifically, the dummy gate layer 60 may be patterned to physically separate dummy gates of adjacent finFET devices within each region 100A and 100B. For example, dummy gates 70 and 76 may be physically separated from each other as well as dummy gates of adjacent finFET devices (not explicitly illustrated). In other embodiments, different masks (e.g., other than masks 72 and 78) may be used to pattern the dummy gate layer 60 in different cross sections (e.g., cross section A-A versus cross section B-B of FIGS. 1, 7A, and 7B). A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die (e.g., where input/output circuitry is disposed) than when located in a logic region of a die (e.g., where logic circuitry is disposed).

In FIGS. 7A, 7B and 7C, appropriate wells (not shown) may be formed in the fins 56, semiconductor strips 52, and/or substrate 50. For example, a P well may be formed in the first region 100A, and an N well may be formed in the second region 100B.

The different implant steps for the different regions 100A and 100B may be achieved using a photoresist or other masks (not shown). For example, a photoresist is formed over the fins 56 and the isolation regions 54 in the first region 100A. The photoresist is patterned to expose the second region 100B of the substrate 50, such as a PMOS region. The photoresist can be formed by using a spin-on technique and can be patterned using acceptable photolithography techniques. Once the photoresist is patterned, an n-type impurity implant is performed in the second region 100B, and the photoresist may act as a mask to substantially prevent n-type impurities from being implanted into the first region 100A, such as an NMOS region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

Following the implanting of the second region 100B, a photoresist is formed over the fins 56 and the isolation regions 54 in the second region 100B. The photoresist is patterned to expose the first region 100A of the substrate 50, such as the NMOS region. The photoresist can be formed by using a spin-on technique and can be patterned using acceptable photolithography techniques. Once the photoresist is patterned, a p-type impurity implant may be performed in the first region 100A, and the photoresist may act as a mask to substantially prevent p-type impurities from being implanted into the second region, such as the PMOS region. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist may be removed, such as by an acceptable ashing process.

After the implants of the first region 100A and the second region 100B, an anneal may be performed to activate the p-type and n-type impurities that were implanted. The implantations may form a p-well in the first region 100A, e.g., the NMOS region, and an n-well in the second region 100B, e.g., the PMOS region. In some embodiments, the grown materials of epitaxial fins may be in situ doped during growth, which may obviate the implantations, although in situ and implantation doping may be used together.

Figure 8A:
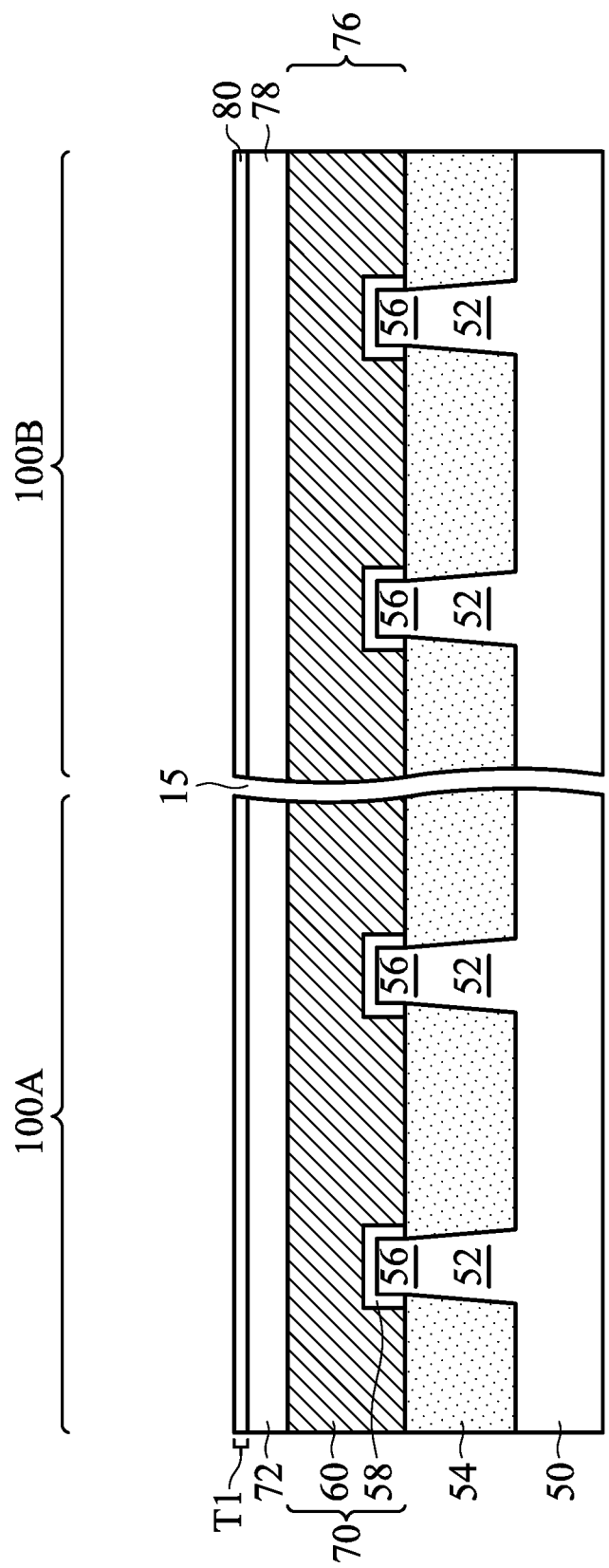
FIGS. 8A, 8B, and 8C are cross-sectional views of intermediate stages in the manufacture of a finFET device in accordance with some embodiments.
Figure 8B:
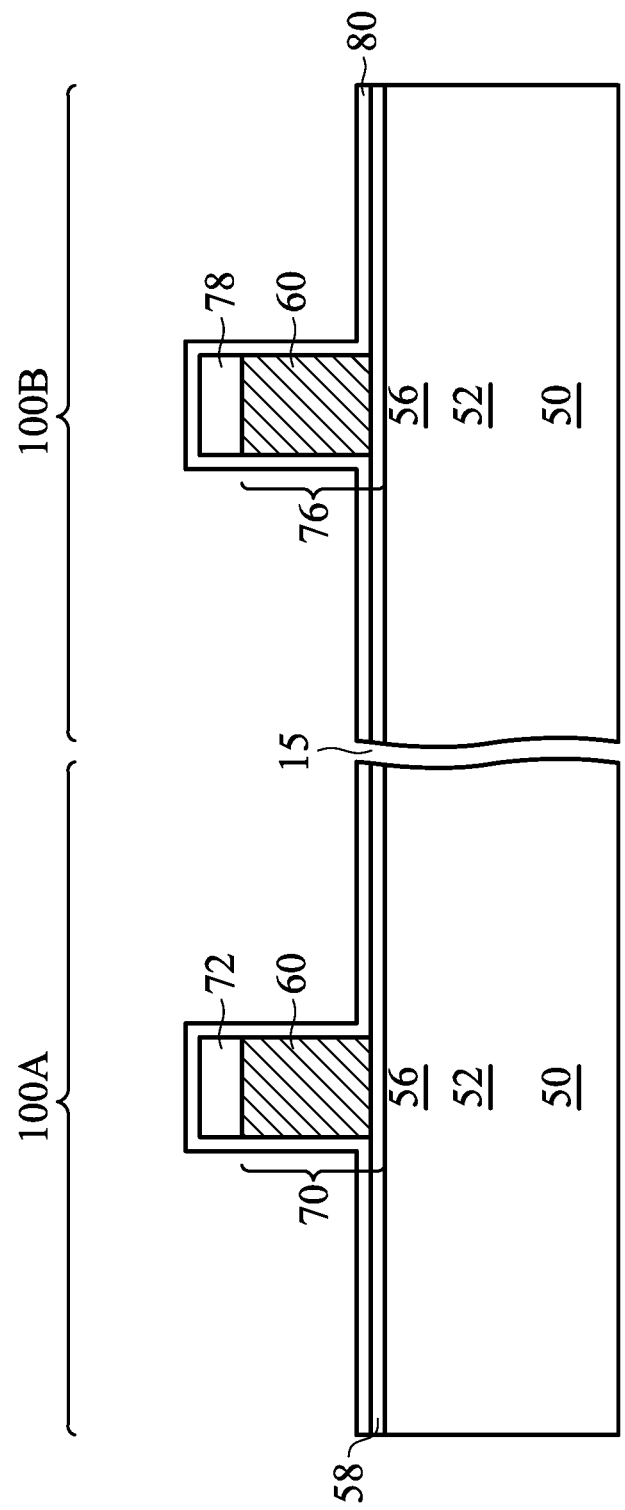
Figure 8C:
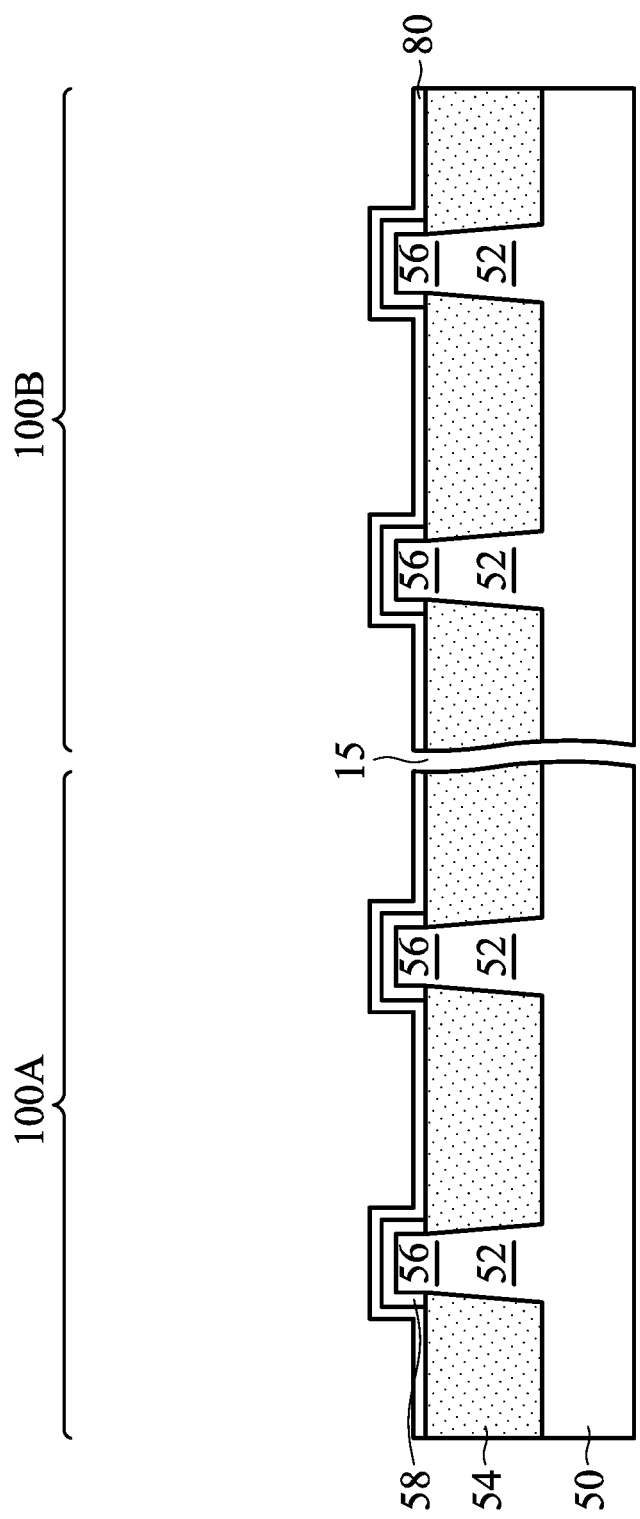

In FIGS. 8A, 8B, and 8C, a first gate spacer 80 is formed on exposed surfaces of respective dummy gates 70 and 76 (FIGS. 8A and 8B) and/or dummy dielectric layer 58 over fins 56 (FIG. 8C). Any suitable methods of forming the first gate spacer 80 may be used. In some embodiments, a deposition (such as CVD, ALD, or the like) may be used form the first gate spacer 80. In some embodiments, as shown in FIG. 8A, the first gate spacer may have a thickness T1 of about 30 Å. The first gate spacer 80 may comprise any suitable material. In some embodiments, the first gate spacer 80 may comprise a combination of silicon, oxygen, carbon, and nitrogen (e.g., SiOCN).

Figure 9A:
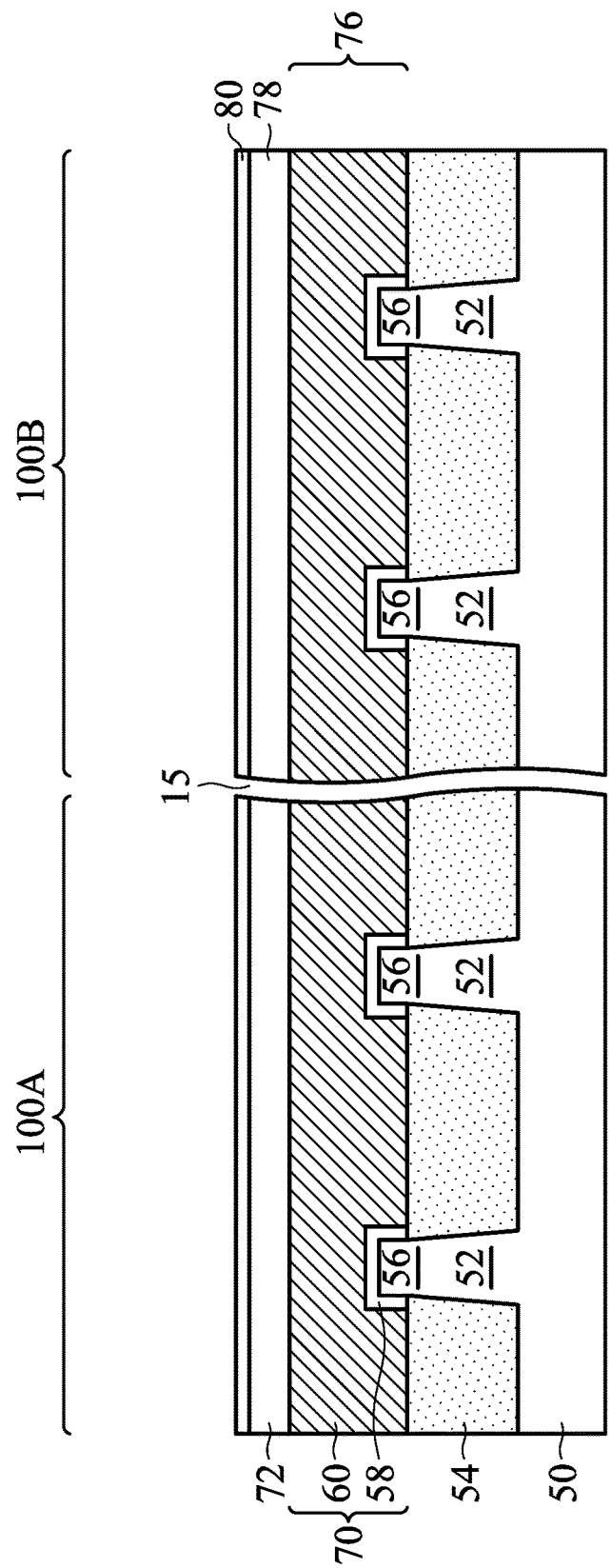
FIGS. 9A, 9B, and 9C are cross-sectional views of intermediate stages in the manufacture of a finFET device in accordance with some embodiments.
Figure 9B:
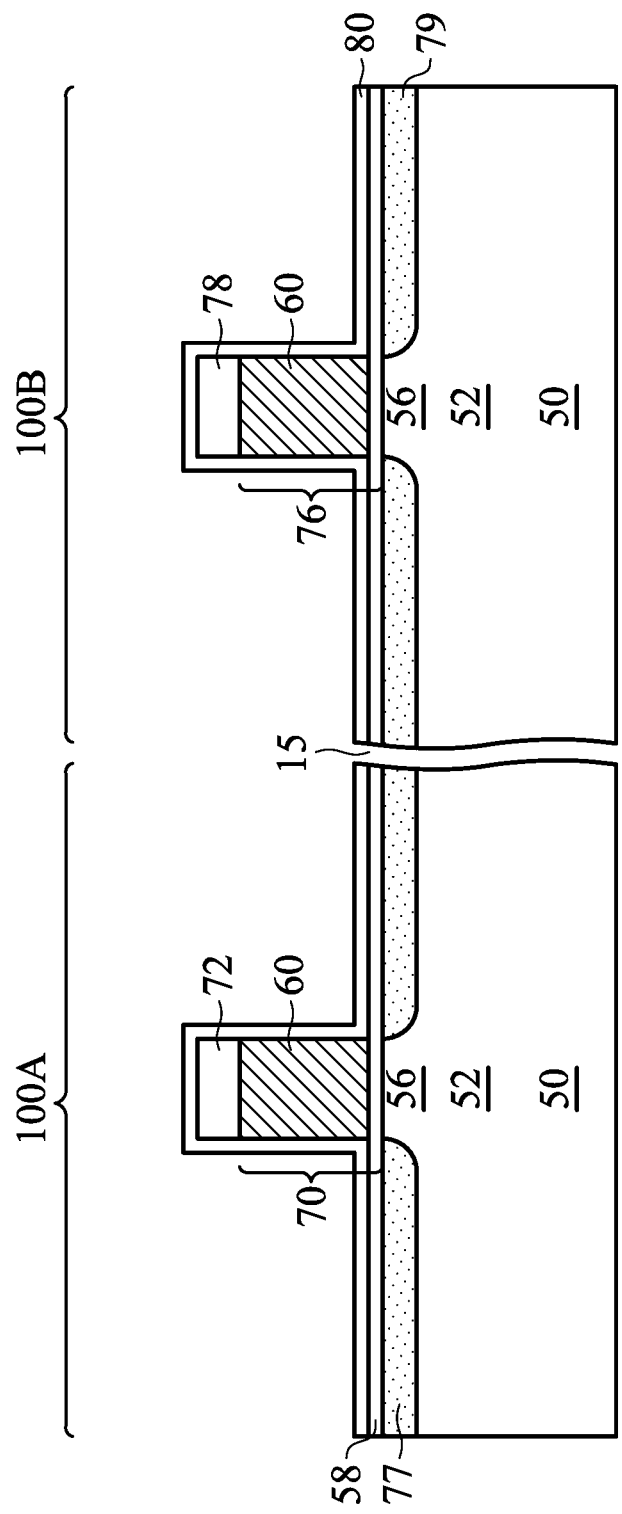
Figure 9C:
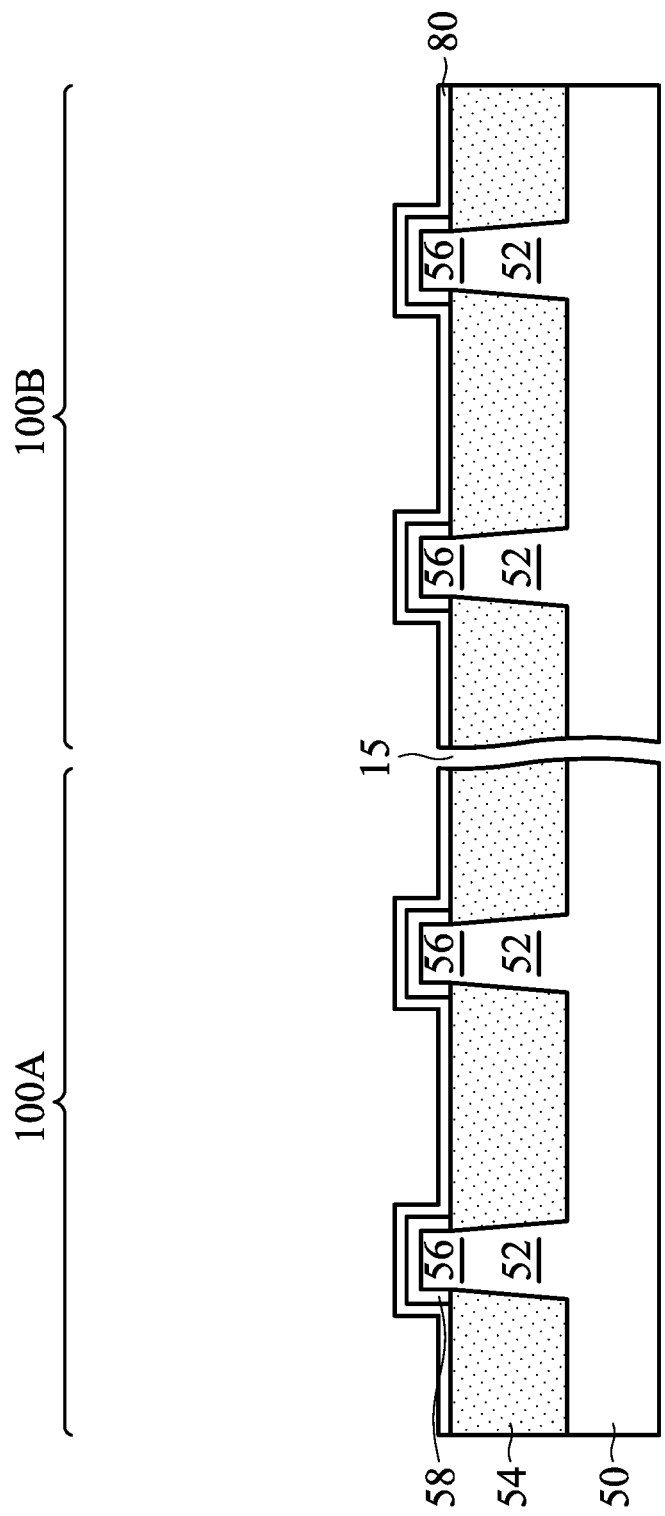

In FIGS. 9A, 9B, and 9C, implants for lightly doped source/drain (LDD) regions 77 and 79 may be performed. Similar to the implants discussed above in FIGS. 7A, 7B and 7C, a mask (not shown), such as a photoresist, may be formed over the first region 100A, e.g., NMOS region, while exposing the second region 100B, e.g., PMOS region, and p-type impurities may be implanted into the exposed fins 56 in the second region 100B to created LDD regions 79. During implantation of the LDD regions 79, the dummy gate 76 may act as a mask to prevent (or at least reduce) dopants from implanting into a channel region of exposed fins 56. Thus, the LDD regions 79 may be formed substantially in source/drain regions of the exposed fins 56. The mask may then be removed. Subsequently, a mask (not shown), such as a photoresist, may be formed over the second region 100B while exposing the first region 100A, and n-type impurities may be implanted into the exposed fins 56 in the first region 100A to create LDD regions 77. During implantation of the LDD regions 77, the dummy gate 70 may act as a mask to prevent (or at least reduce) dopants from implanting into a channel region of exposed fins 56. Thus, the LDD regions 77 may be formed substantially in source/drain regions of the exposed fins 56. The mask may then be removed. The n-type impurities may be the any of the n-type impurities previously discussed, and the p-type impurities may be the any of the p-type impurities previously discussed. The LDD regions 77 and 79 may each have a concentration of impurities of from about $10^{15}$ cm$^{-3}$ to about $10^{16}$ cm$^{-3}$. An anneal may be used to activate the implanted impurities.

Next, referring to FIGS. 10A, 10B, 10C, and 10D, a carbon treatment 101 may be performed on the first gate spacer 80. Carbon treatment 101 may implant carbon in the first gate spacer 80 (see FIGS. 8A-8C), thereby forming a carbon-doped gate spacer 80B. Carbon treatment 101 may help strengthen the first gate spacer 80 by providing the carbon-doped gate spacer 80B with increased etch resistivity. Thus, defects to the carbon-doped gate spacer 80B during subsequent etching processes (e.g., during a replacement gate process to replace the dummy gates 70/76 with a functional gate stacks, see FIGS. 25A through 26C) can be reduced. In some embodiments, carbon treatment 101 may further cause the doping of the dummy dielectric 58 with carbon and also reduce an etch rate of the dummy dielectric 58 in subsequent process steps (e.g., during a replacement gate process).

Referring to FIG. 10D, in some embodiments carbon treatment 101 comprises placing the wafer on which finFET 30 is being formed in a plasma chamber 202 on a wafer chuck 204 under RF coil 206. Any suitable plasma chamber 202 may be used. For example, the VARIAN VIISTA® PLAD from Applied Materials may be suitable for use in some embodiments. A carbon plasma conformal doping may be performed on the finFET 30 in plasma chamber 202 using a gas source and an RF coil that are configured to create carbon plasma in plasma chamber 202. In some embodiments, the gas source generates a gas during the carbon plasma conformal doping. The gas may be a carbon hydride in some embodiments, such as CH$_4$, C$_2$H$_2$, C$_2$H$_4$, or C$_2$H$_6$, which may be applied at a rate of about 40 standard cubic centimeters per minute (sccm) of about 60 sccm and a dosage of about $1 \times 10^{14}$ cm$^{-2}$ to about $1 \times 10^{15}$ cm$^{-2}$ in the plasma chamber 202 during carbon treatment 101. In some embodiments, a RF power of about 800 W, a DC bias of about 1 kV to about 3 kV, a pulse width (PW) of about 30 µs to about 60 µs, and a pressure of about 20 mT to about 30 mT may be applied to the plasma chamber during carbon treatment 101. In an embodiment carbon plasma conformal doping process, plasma containing carbon ions is created in the plasma chamber 202. The carbon ions are targeted toward the finFET 30 and implanted in exposed surfaces of finFET 30 according to the process parameters of plasma chamber 202.

In some embodiments, the use of a carbon plasma conformal doping of the gate spacers 80 may enable a more uniform doping in the resulting carbon-doped gate spacer 80B. For example, it may be possible to dope the first gate spacer 80 (see FIGS. 8A-8C) using beamline implantation. However, due to high aspect ratios of some dummy gates and/or fins, a line of sight from the beamline to all areas of the first gate spacer 80 may be unavailable. Therefore, a beamline implantation may result in a failure to dope some sections of the first gate spacer 80, leading to a non-uniform doping of the carbon-doped gate spacer 80B particularly for aspect ratios (e.g., a ratio of height to pitch) greater than about 10:1 for the dummy gates and/or fins. The use of a carbon plasma conformal doping of the first gate spacer 80 may allow for a more uniform doping of the first gate spacer 80. For example, after carbon treatment 101 of the first gate spacer 80, a carbon concentration in the carbon-doped gate spacer 80B may be substantially similar in different sections of the carbon-doped gate spacer 80B. In some embodiments, a carbon concentration in sections of the carbon-doped gate spacer 80B that extend along upper surfaces of dummy gates 70 and 76 may be substantially the same as a carbon concentration of sections of the carbon-doped gate spacer 80B that extend along sidewalls of dummy gates 70 and 76 and the fin 56.

In some embodiments, the use of carbon plasma conformal doping of the carbon-doped gate spacer 80B may further provide a high concentration of carbon with reduced surface damage to the underlying substrate 50, semiconductor strips 52, and/or fins 56 compared to embodiment beamline dopant processes. Furthermore, the carbon plasma conformal doping process may not require additional cleaning and/or annealing processes to drive the carbon into the first gate spacer 80, thereby reducing manufacturing costs compared to other embodiment processes. After the carbon treatment 101, the carbon-doped gate spacer 80B may have increased amounts of carbon compared to the first gate spacer 80. For example, the concentration of carbon in carbon-doped gate spacer 80B may be about $3 \times 10^{20}$ cm$^{-3}$ or greater, such as about $4 \times 10^{20}$ cm$^{-3}$ to about $3 \times 10^{21}$ cm$^{-3}$, in some embodiments.

Figure 10A:
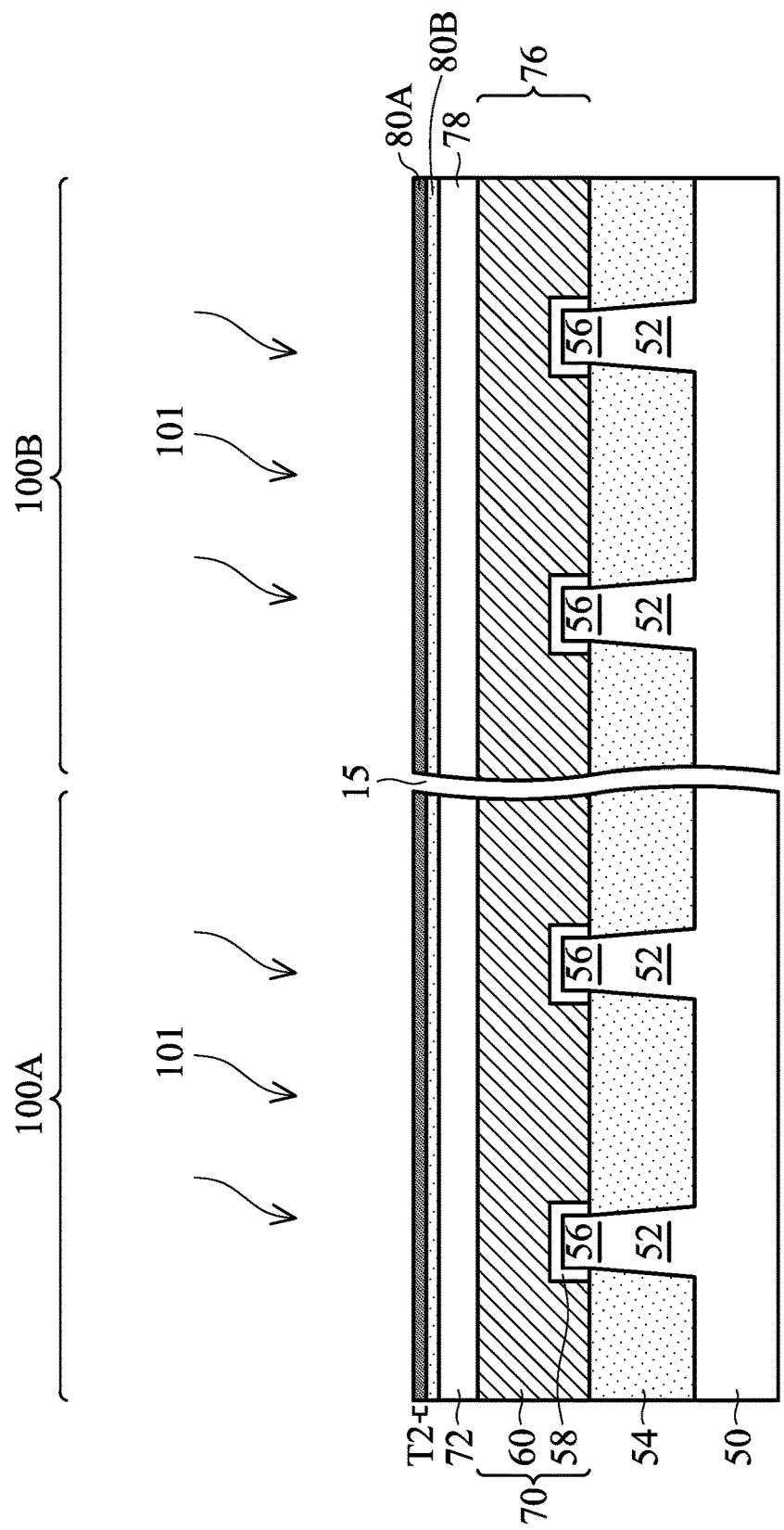
FIGS. 10A, 10B, and 10C are cross-sectional views of intermediate stages in the manufacture of a finFET device in accordance with some embodiments.
Figure 10B:
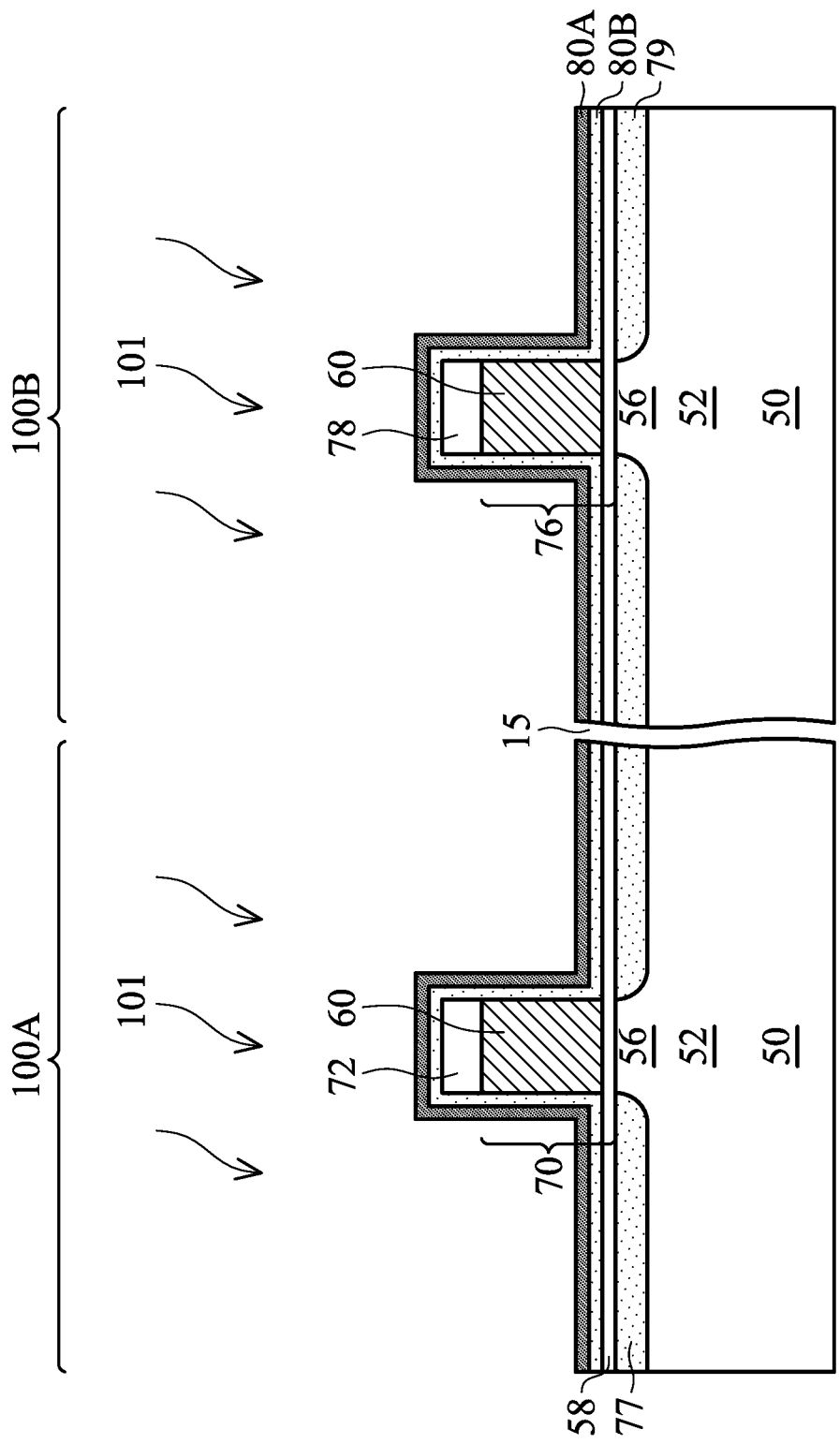
Figure 10C:
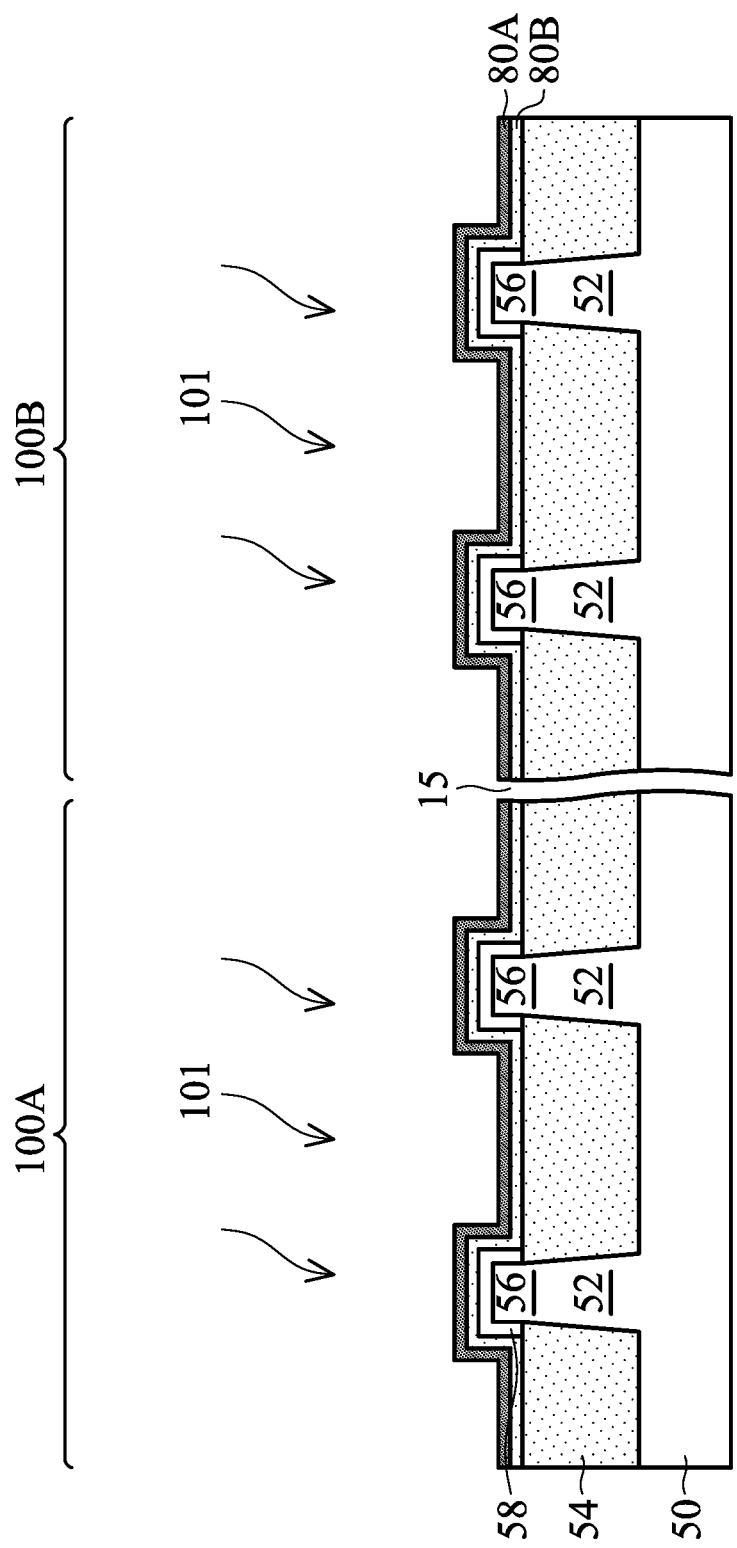

After the carbon treatment 101 a thin film of carbon 80A may have built up on a surface of the carbon-doped gate spacer 80B to which the carbon plasma was incident during the carbon treatment 101. Carbon film 80A may have a thickness T2 of about 5 Å to about 20 Å as shown in FIG. 10A. In some embodiments, after the carbon treatment 101, the first gate spacer 80 may have a gradient of carbon density, with a greatest density of carbon being present at the surface of the carbon-doped gate spacer 80B to which carbon plasma was incident during the carbon treatment 101 and a smallest density of carbon being present at the surface of the carbon-doped gate spacer 80B that is opposite to the surface to which carbon plasma was incident during the carbon treatment 101. In some embodiments, carbon treatment 101 may also result in increased carbon concentration in the dummy dielectric layer 58.

FIGS. 10A through 10D depict embodiments in which carbon treatment 101 is performed after the LDD regions 77 and 79 are formed. (See FIGS. 9A through 9C). In some embodiments, carbon treatment 101 may be performed after the forming of first gate spacer 80 (See FIGS. 8A-C) but before the forming of the LDD regions 77 and 79.

Figure 11A:
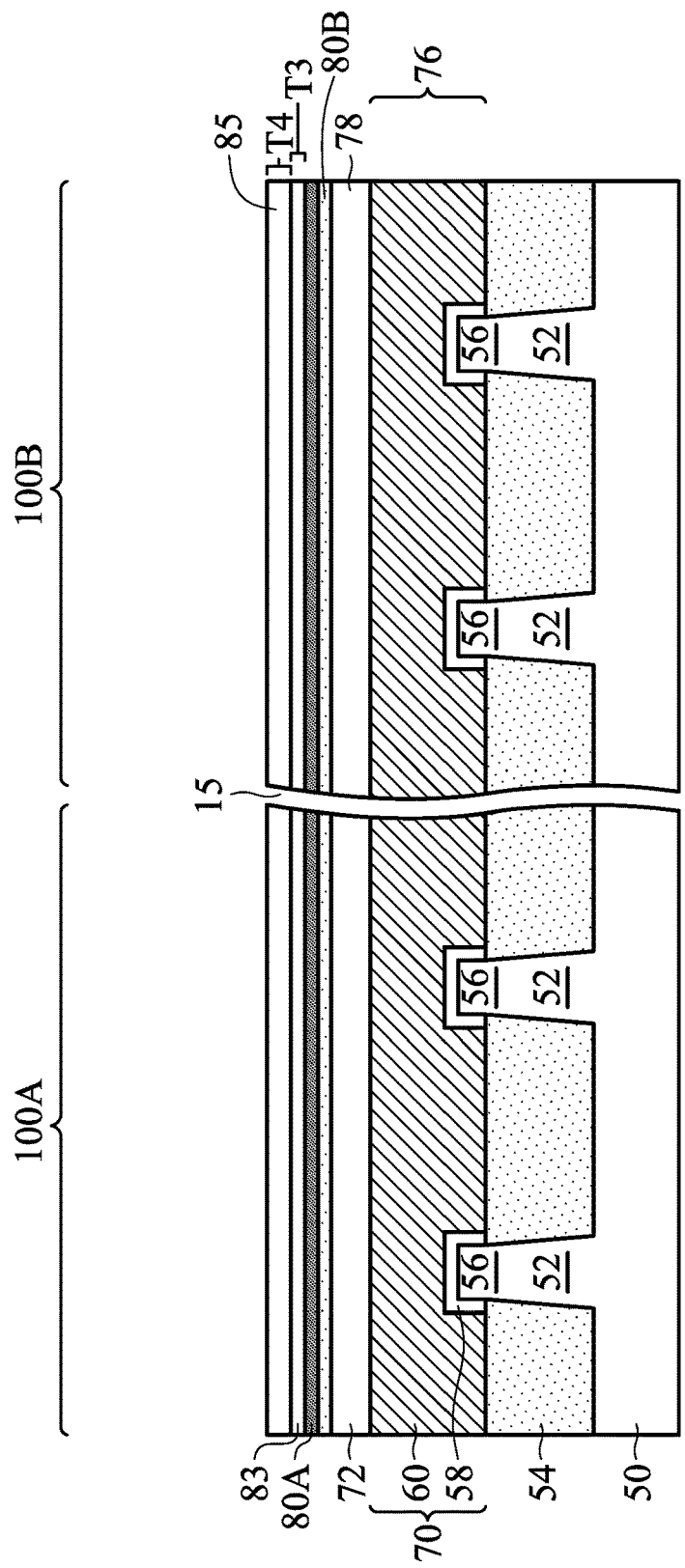
FIGS. 11A, 11B, and 11C are cross-sectional views of intermediate stages in the manufacture of a finFET device in accordance with some embodiments.
Figure 11B:
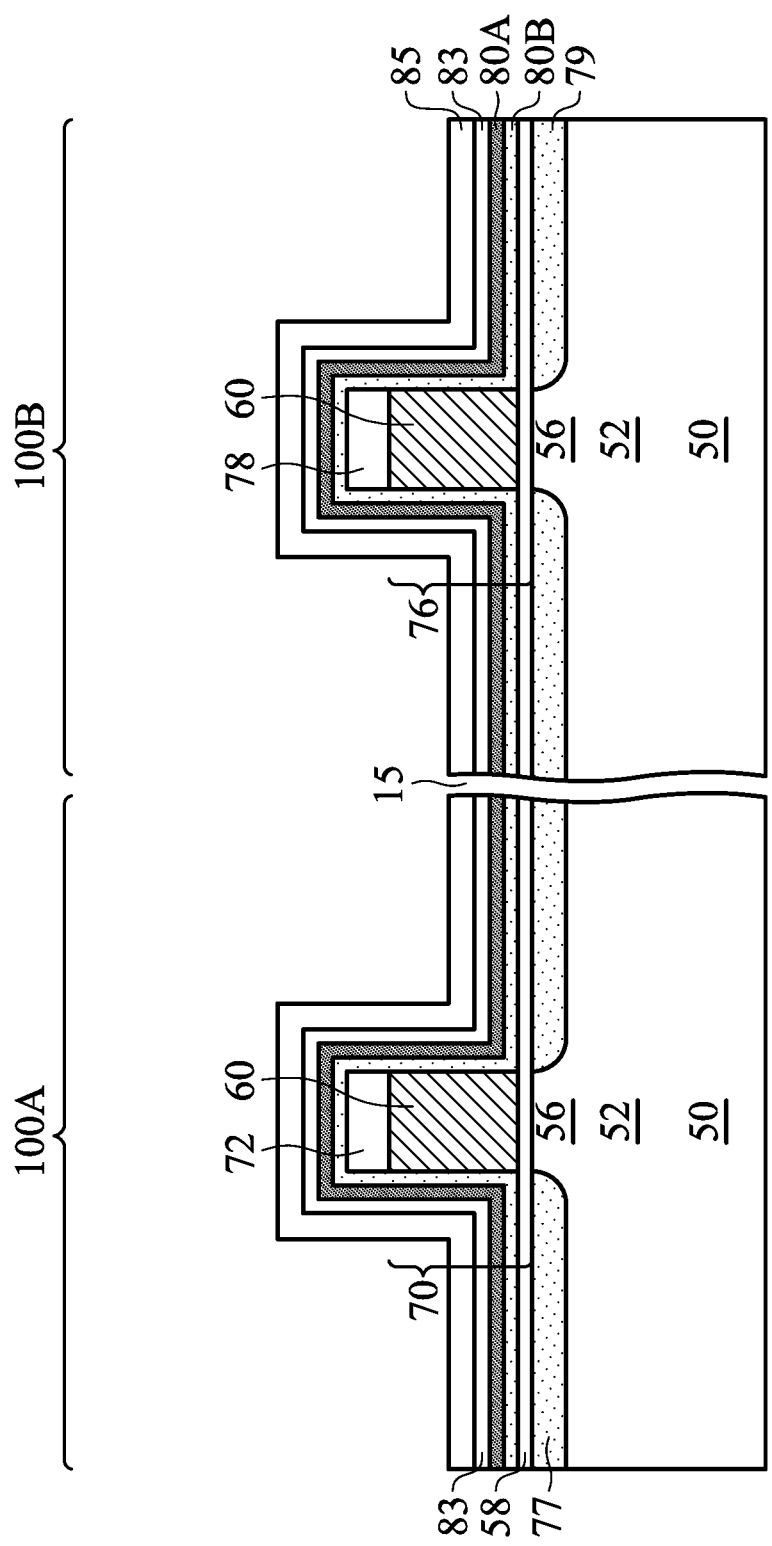
Figure 11C:
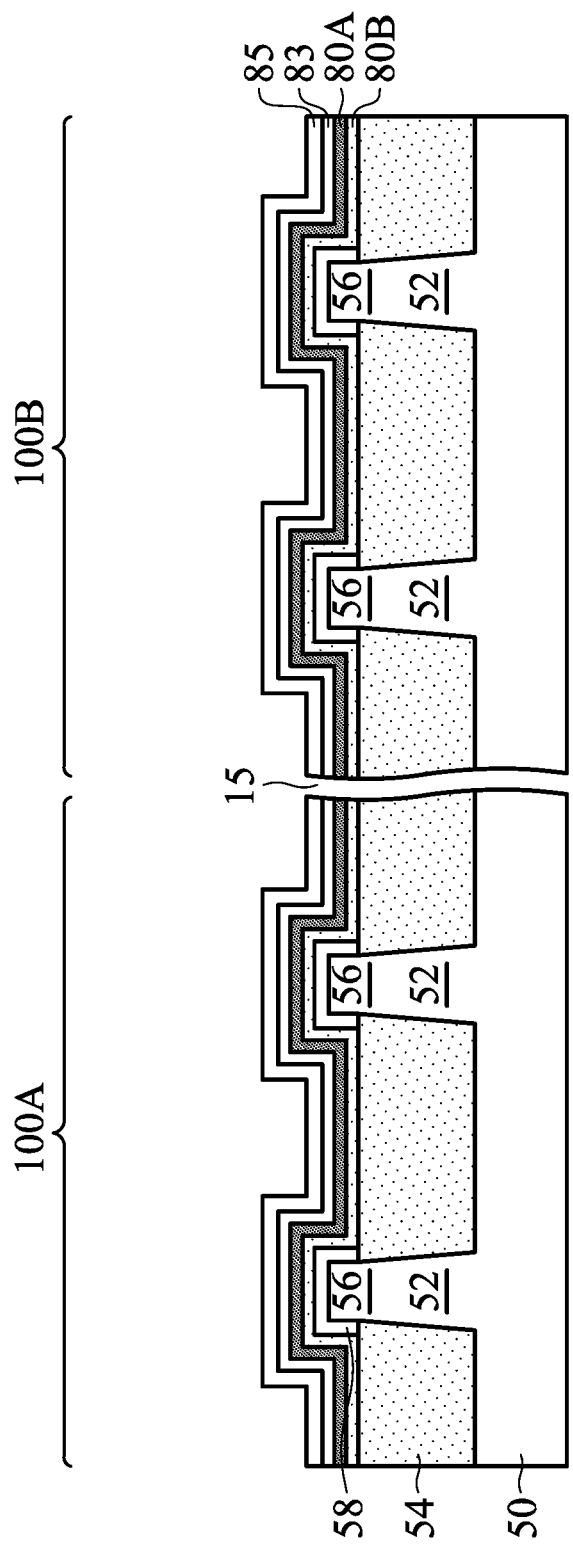

Referring to FIGS. 11A through 11C, additional gate spacers may be formed over the carbon-doped gate spacer 80B and the carbon film 80A. First, a second gate spacer 83 may be formed over the carbon-doped gate spacer 80B and carbon film 80A. Any suitable methods of forming the second gate spacer 83 may be used. In some embodiments, a deposition (such as ALD, CVD, or the like) may be used form the second gate spacer 83. Any suitable material may be used to form second gate spacer 83. In some embodiments, the second gate spacer 83 may comprise SiOCN. As shown in FIG. 11A, in some embodiments, the second gate spacer 83 may have a thickness T3 of about 30 Å. After second gate spacer 83 is formed, a third gate spacer 85 is formed over the second gate spacers 83. Any suitable methods of forming the third gate spacer 85 may be used. In some embodiments, a deposition (such as ALD, CVD, or the like) may be used form the third gate spacers 85. Any suitable material may be used to form the third gate spacer 85. In some embodiments, the third gate spacer 85 may comprise silicon nitride (SiN), or the like. The third gate spacer 85 may have a thickness T4 of about 40 Å in some embodiments, as shown in FIG. 11A.

Figure 12A:
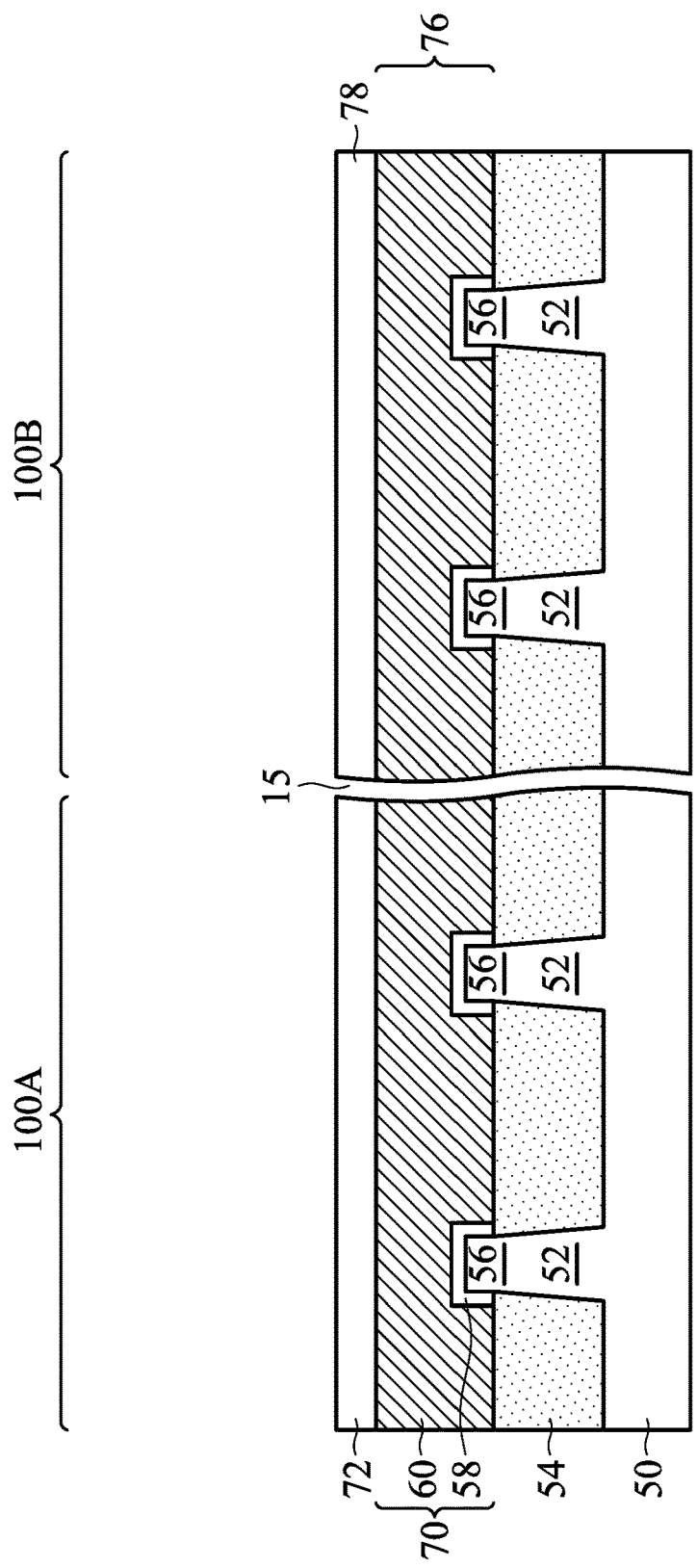
FIGS. 12A, 12B, and 12C are cross-sectional views of intermediate stages in the manufacture of a finFET device in accordance with some embodiments.
Figure 12B:
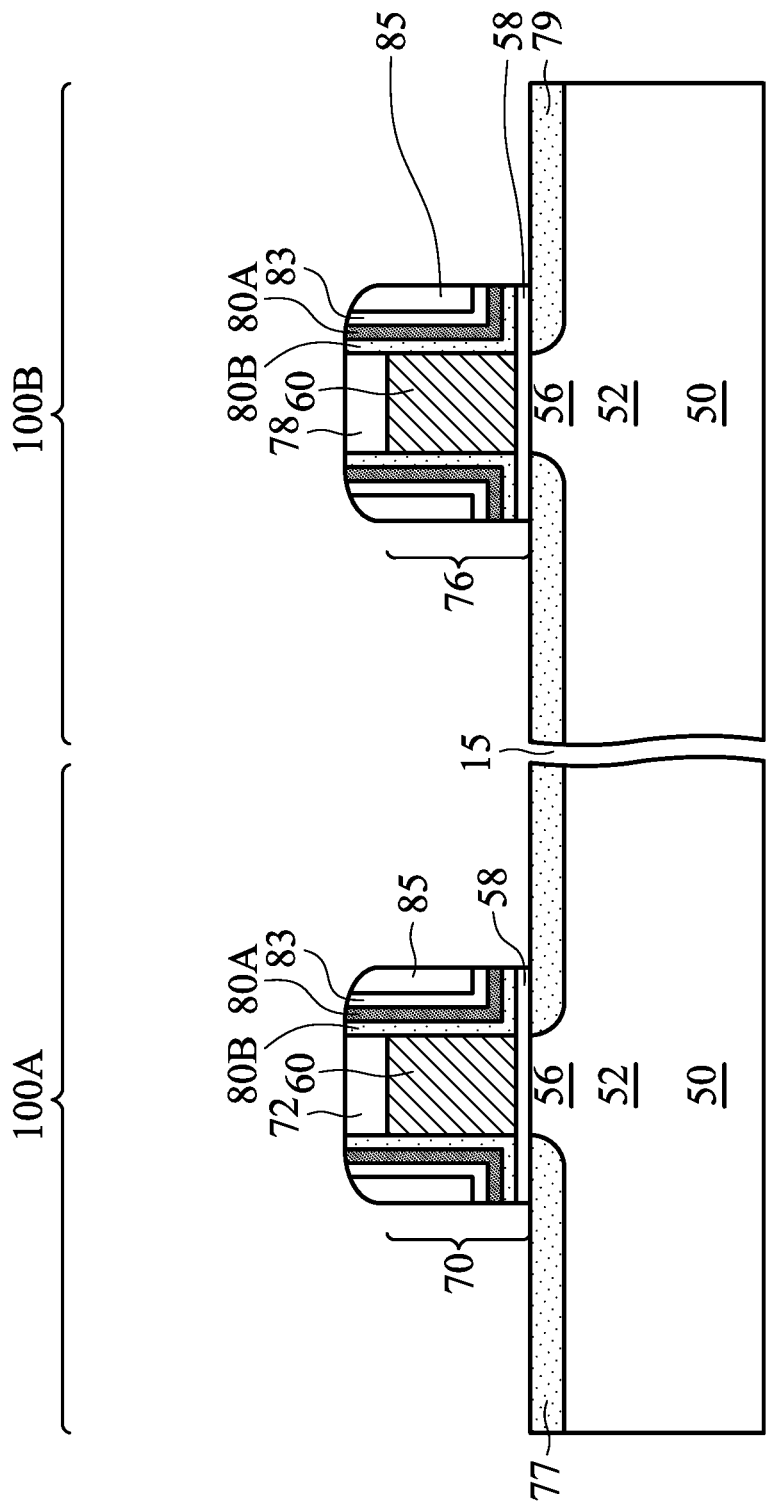
Figure 12C:
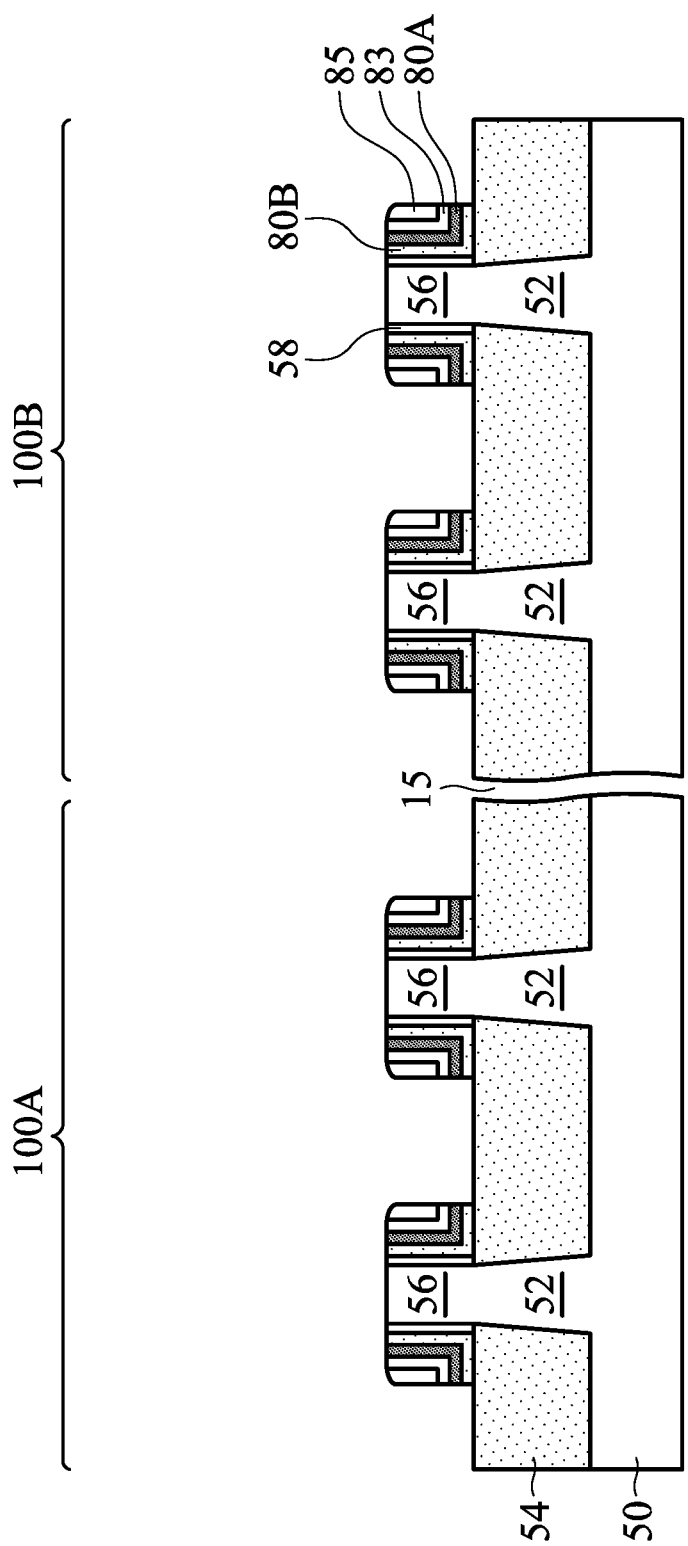

Next, a patterning process is performed to remove excess sections of the carbon-doped gate spacer 80B, carbon film 80A, second gate spacer 83, and third gate spacer 85. Any acceptable patterning process may be used. In some embodiments, a photoresist may be deposited (not shown) and patterned using acceptable lithograph techniques, where openings in the photo resist expose sections of the carbon-doped gate spacer 80B, carbon film 80A, second gate spacer 83, and third gate spacer 85 to be removed. An etching process may be performed using the photoresist as a mask. The etching process may be anisotropic. After the etching, lateral sections of the carbon-doped gate spacer 80B, carbon film 80A, second gate spacer 83, and third gate spacer 85 over LDD regions and over isolation regions 54 may be removed to expose portions of the fins 56 and to expose the hard masks 72/78 above dummy gate stacks 70/76. Sections of the carbon-doped gate spacer 80B, carbon film 80A, second gate spacer 83, and third gate spacer 85 along sidewalls of the dummy gates 70/76 may remain after the etching. The resulting structure is depicted in FIGS. 12A through 12C.

FIGS. 13A through 22 depict the formation of epitaxial source/drain regions 82 and 84 in first region 100A and second region 100B. In some embodiments, the epitaxial source/drain regions 82 in the first region 100A may be formed before the epitaxial source/drain regions 84 are formed in the second region 100B. It is also possible to form the epitaxial source/drain regions 84 in the second region 100B before forming the epitaxial source/drain regions 82 in the first region 100A.

FIGS. 13A through 17 depict the formation of an epitaxial source/drain region in first region 100A. During the formation of the epitaxial source/drain region in first region 100A, e.g., the NMOS region, the second region 100B, e.g., the PMOS region may be masked (not shown).

Figure 13A:
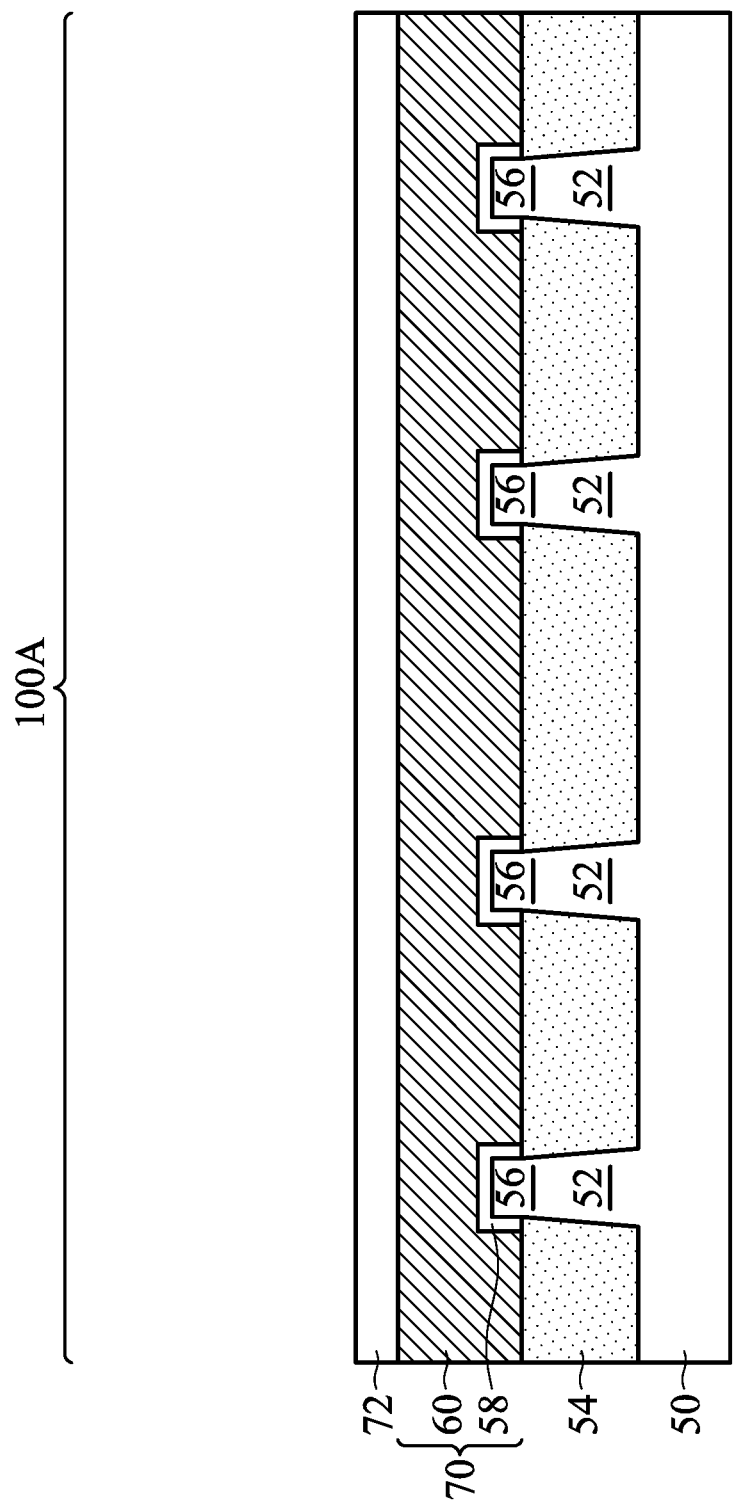
FIGS. 13A, 13B, and 13C are cross-sectional views of intermediate stages in the manufacture of a finFET device in accordance with some embodiments.
Figure 13B:
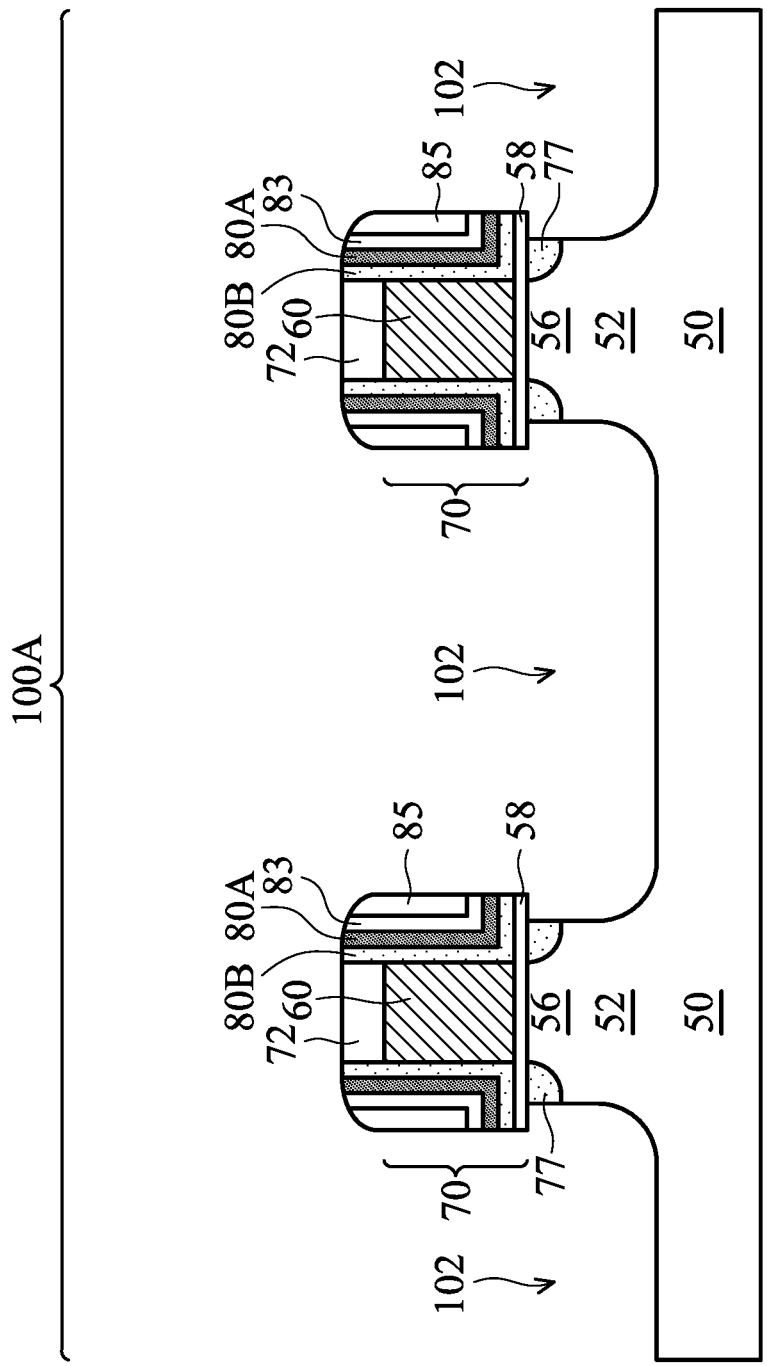
Figure 13C:
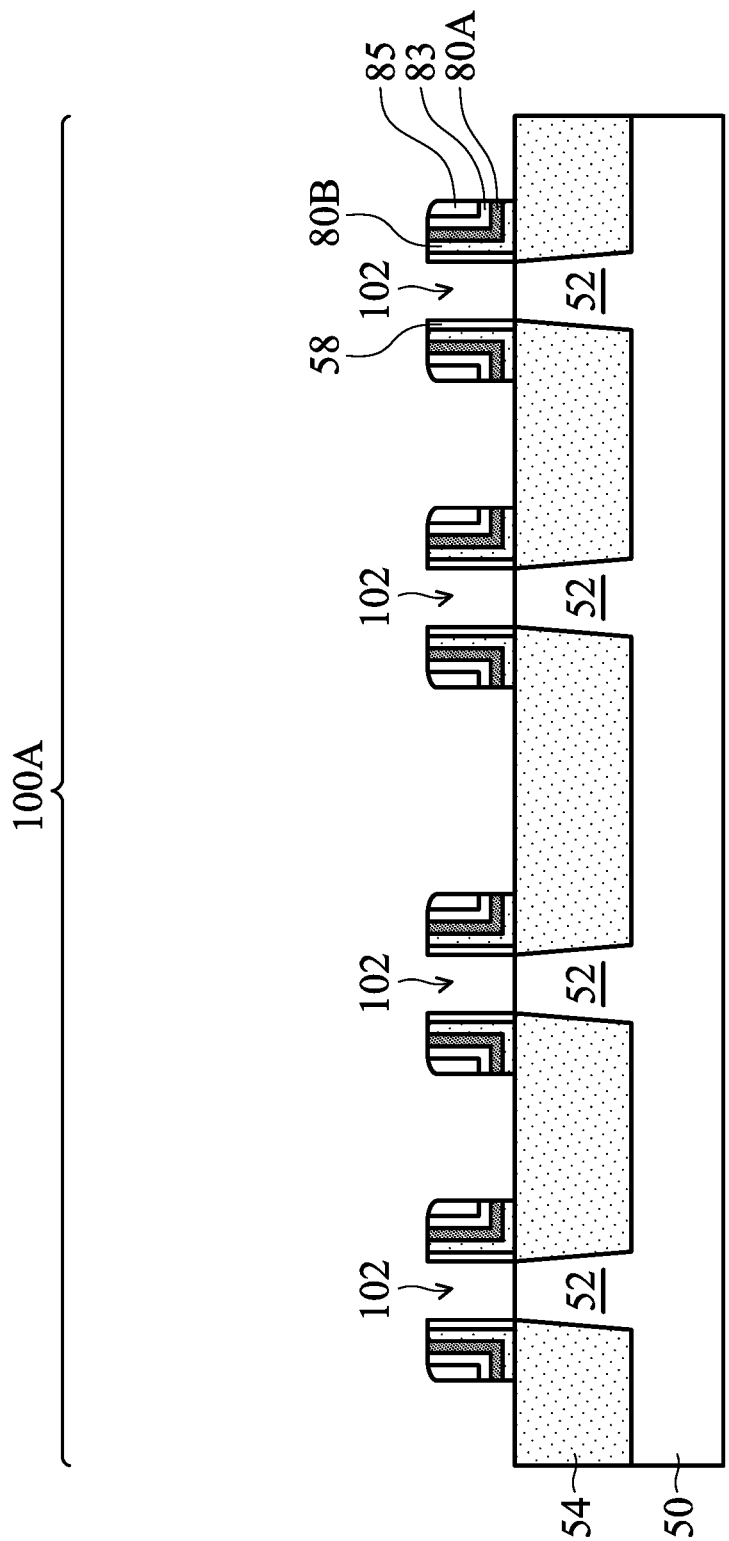

Referring to FIGS. 13A through 13C, source/drain regions of the fins 56 in the first region 100A are etched to form recesses 102. The etching may be performed in a manner that a recess 102 is formed between neighboring dummy gates 70. Any acceptable etching process may be used. In some embodiments, the recesses 102 may be etched to extend at least partially under a portion of the dummy gate dielectric 58, carbon-doped gate spacer 80B, carbon film 80A, second gate spacer 83, and third gate spacer 85. In other embodiments, the recesses 102 may not extend under any portions of the dummy gate dielectric 58, carbon-doped gate spacer 80B, carbon film 80A, second gate spacer 83, and third gate spacer 85. A portion of the fins 56 (see FIG. 13B) between adjacent ones of the recesses 102 and directly under the dummy gate 70 may provide a channel region of a finFET device.

Figure 14A:
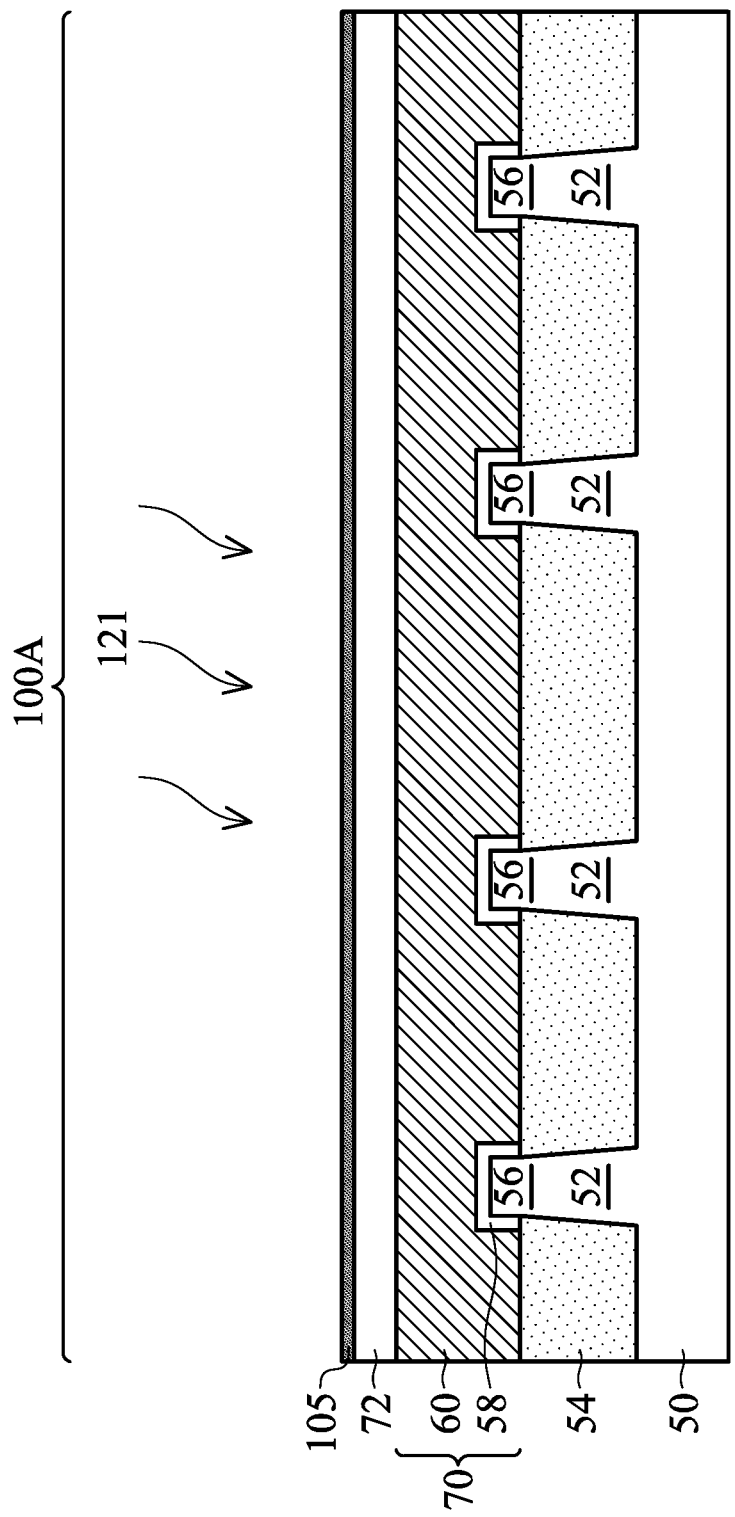
FIGS. 14A, 14B, and 14C are cross-sectional views of intermediate stages in the manufacture of a finFET device in accordance with some embodiments.
Figure 14B:
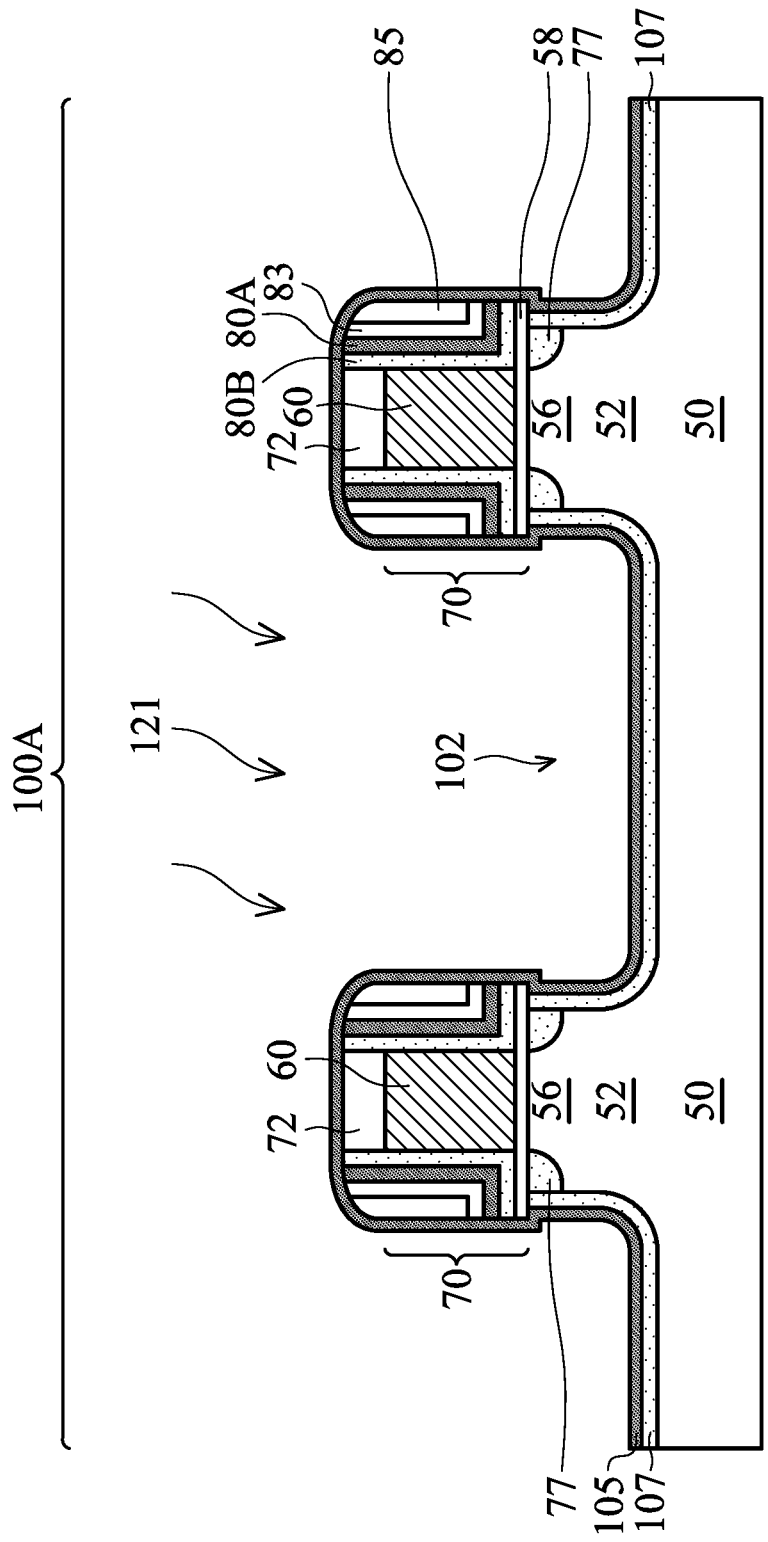
Figure 14C:
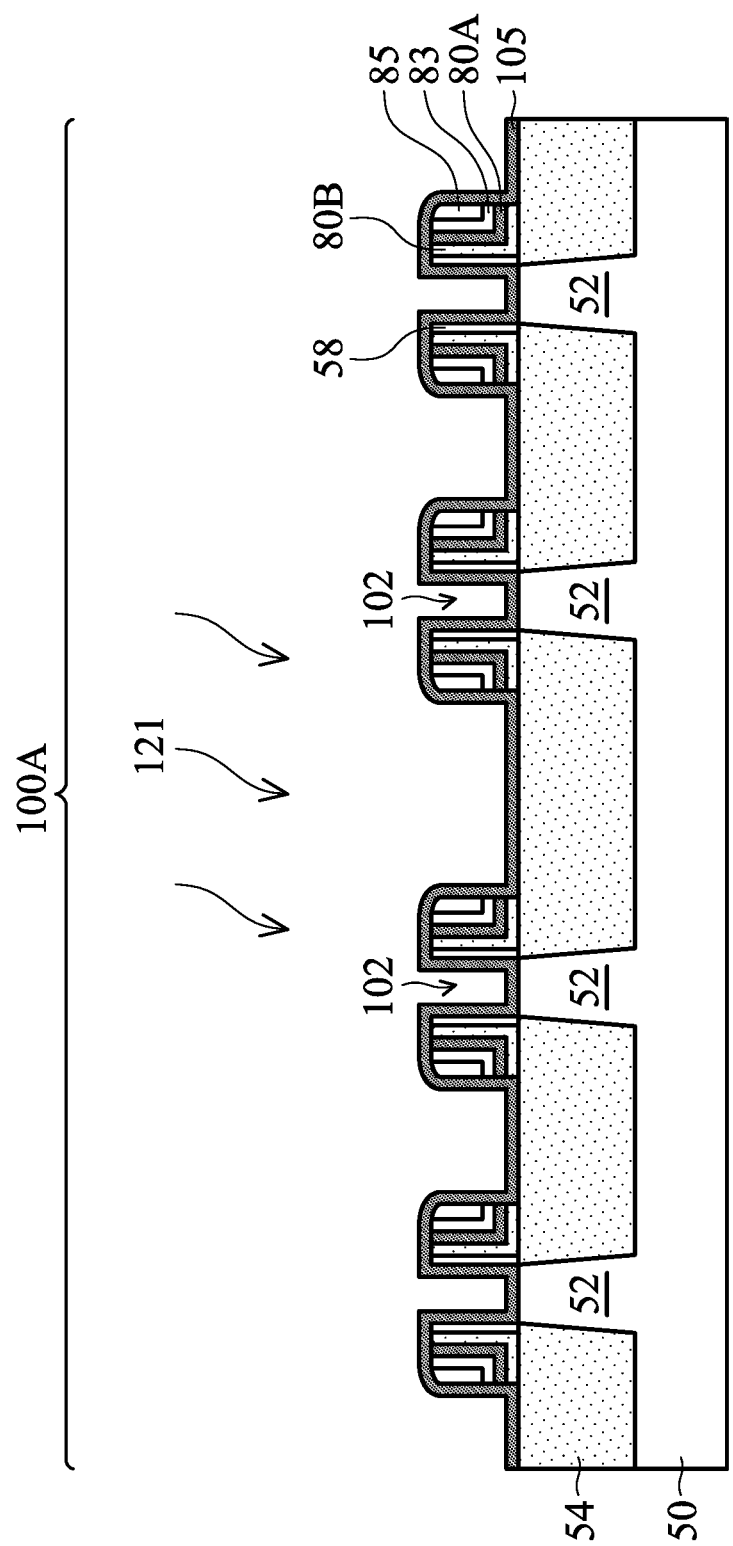

Next, as shown in FIGS. 14A through 14C, a carbon treatment 121 may be performed on the recesses 102.

Carbon treatment 121 may implant carbon dopants along sidewalls and a bottom surface of the recesses 102, thereby forming carbon-doped regions 107 in the recesses 102 along the fins 56, semiconductor strips 52, and substrate 50. In another embodiment, the carbon treatment 101 described above and/or the carbon treatment 121 may implant carbon dopants on various gate spacers (e.g., carbon-doped gate spacer 80B, carbon film 80A, second gate spacer 83, and third gate spacer 85), which may diffuse into channel regions of the finFET without forming the carbon-doped regions 107 along the sidewalls and the bottom surface of the recesses 102. In an embodiment, the carbon treatment 121 may simultaneously implant carbon dopants along sidewalls and a bottom surface of recesses 102 to form the carbon-doped regions 107 and various gate spacers, which may diffuse into channel regions of the FinFET. In an embodiment, the carbon treatment 121 forms the carbon-doped regions 107 without implanting carbon dopants on various gate spacers. For example, the carbon treatment 121 may be performed without performing the carbon treatment 101 as described above. The carbon-doped region 107 may include carbon as well as a material of the fins 56, semiconductor strips 52, and substrate 50 (e.g., Si, SiGe, combinations thereof, or the like). The carbon-doped regions 107 on sidewalls and a bottom surface of the recesses 102 may be used to reduce diffusion of dopants from subsequently formed epitaxial source/drain regions in recesses 102 (e.g., see FIGS. 16A through 16C). In some embodiments, reduced diffusion of dopants may be a result of interstitial reduction provided by the carbon-doped regions 107.

In some embodiments, carbon treatment 121 may be similar to carbon treatment 101 (see FIGS. 10A through 10D). For example, carbon treatment 121 may include placing a wafer on which the finFET 30 is being formed in a plasma chamber 202 on a wafer chuck under RF coil. Any suitable plasma chamber may be used. For example, the VARIAN VIISTA® PLAD from Applied Materials may be suitable for use in some embodiments. A carbon plasma conformal doping may be performed on the finFET 30 in the plasma chamber using a gas source and an RF coil that are configured to create carbon plasma in the plasma chamber. In some embodiments, the gas source generates a gas during the carbon plasma conformal doping. The gas may be a carbon hydride in some embodiments, such as $CH_4$, $C_2H_2$, $C_2H_4$, or $C_2H_6$, which may be applied at a dosage of about $5\times10^{13}$ cm$^{-2}$ to about $5\times10^{14}$ cm$^{-2}$ in the plasma chamber during carbon treatment 121. In some embodiments, a DC bias of about 0.5 kV to about 2 kV, a power range of about 650 W to about 900 W, a pressure of about 20 mT to about 80 mT, and a pulse width of about 20 μs to about 60 μs may be applied to the plasma chamber during carbon treatment 121. In an embodiment carbon plasma conformal doping process, plasma containing carbon ions is created in the plasma chamber 202. The carbon ions are targeted toward the finFET 30 and implanted in exposed surfaces of finFET 30 according to the process parameters of plasma chamber 202

In some embodiments, the use of a carbon plasma conformal doping of the recesses 102 may enable a more uniform doping in the resulting carbon-doped regions 107. For example, it may be possible to dope the recesses 102 using beamline implantation. However, due to high aspect ratios of some fins, a line of sight from the beamline to all areas of the recesses 102 may be unavailable. Therefore, a beamline implantation may result in a failure to dope some sections of the recesses 102, leading to a non-uniform doping of the carbon-doped regions 107 particularly for aspect ratios greater than about 10:1 for the fins 56. The use of a carbon plasma conformal doping of the recesses 102 may allow for a more uniform doping of the carbon-doped regions 107. For example, after carbon treatment 121 of the recesses 102, a carbon concentration in the recesses 102 may be substantially similar in different sections of the carbon-doped regions 107. For example, in an embodiment, a ratio of carbon concentrations of the carbon-doped regions 107 at the top of the fins 56 to carbon concentrations of the carbon-doped regions 107 at the sidewalls of the fins 56 to carbon concentrations of carbon-doped regions 107 at the bottom of the fins 56 may be in the range of about 1:0.65:0.65 to about 1:0.9:0.9.

In some embodiments, the use of carbon plasma conformal doping of the carbon-doped region 107 may further provide a high concentration of carbon with reduced surface damage to the underlying substrate 50, semiconductor strips 52, and/or fins 56. After the carbon treatment 121, the carbon-doped regions 107 may have increased amounts of carbon. For example, the concentration of carbon in the carbon-doped region 107 may be about $3\times10^{20}$ cm$^{-3}$ or greater in some embodiments. It has been observed that a carbon concentration in this range is sufficient to reduce diffusion of impurities from the epitaxial source/drain regions 82 into the fins 56.

After the carbon treatment 121, a thin film of carbon 105 may have built up on a surface of the recesses 102 to which the carbon plasma was incident during the carbon treatment 121. In some embodiments, the thin film of carbon 105 may further be deposited over dummy gate stacks 70 and along exposed surfaces of the carbon-doped gate spacer 80B, carbon film 80A, second gate spacer 83, and third gate spacer 85.

Figure 15A:
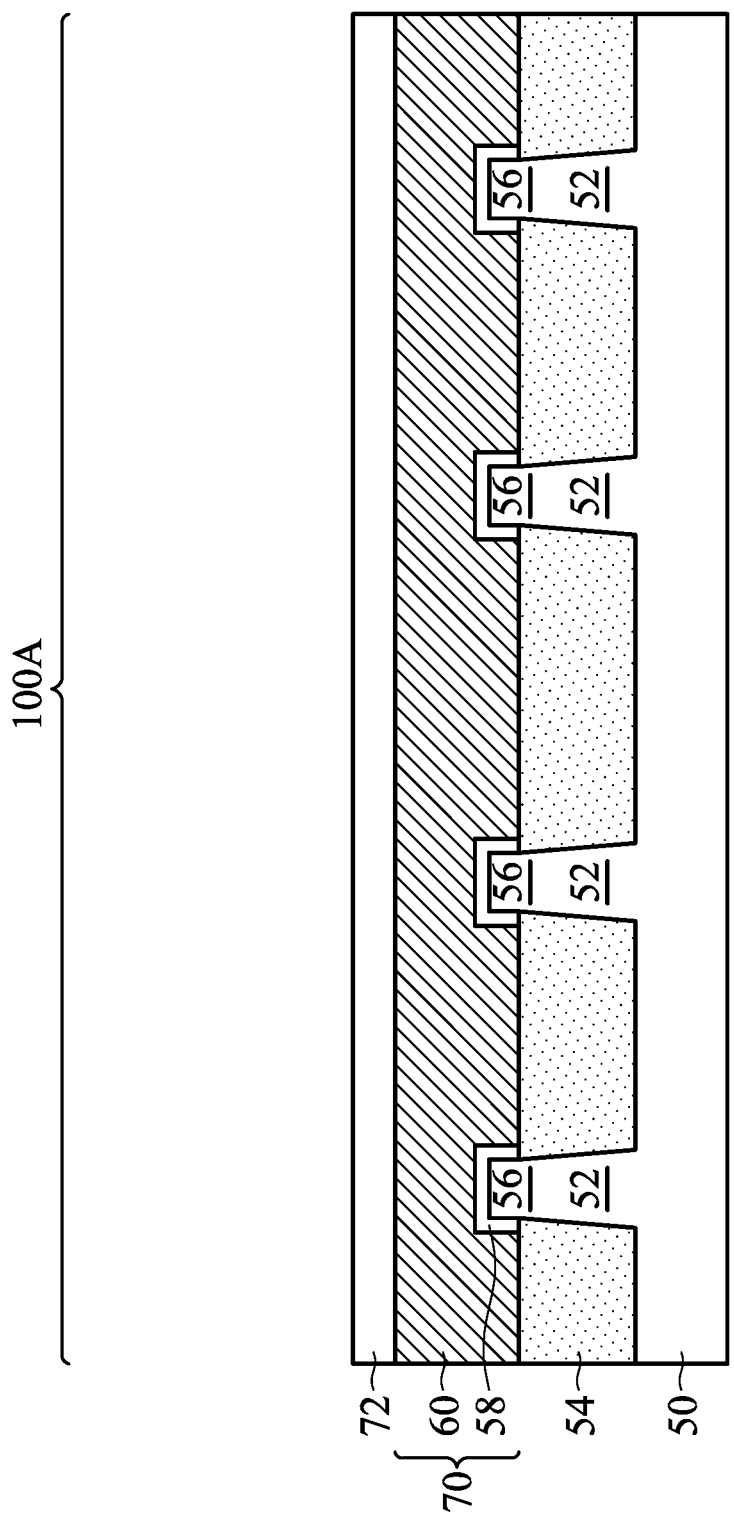
FIGS. 15A, 15B, and 15C are cross-sectional views of intermediate stages in the manufacture of a finFET device in accordance with some embodiments.
Figure 15B:
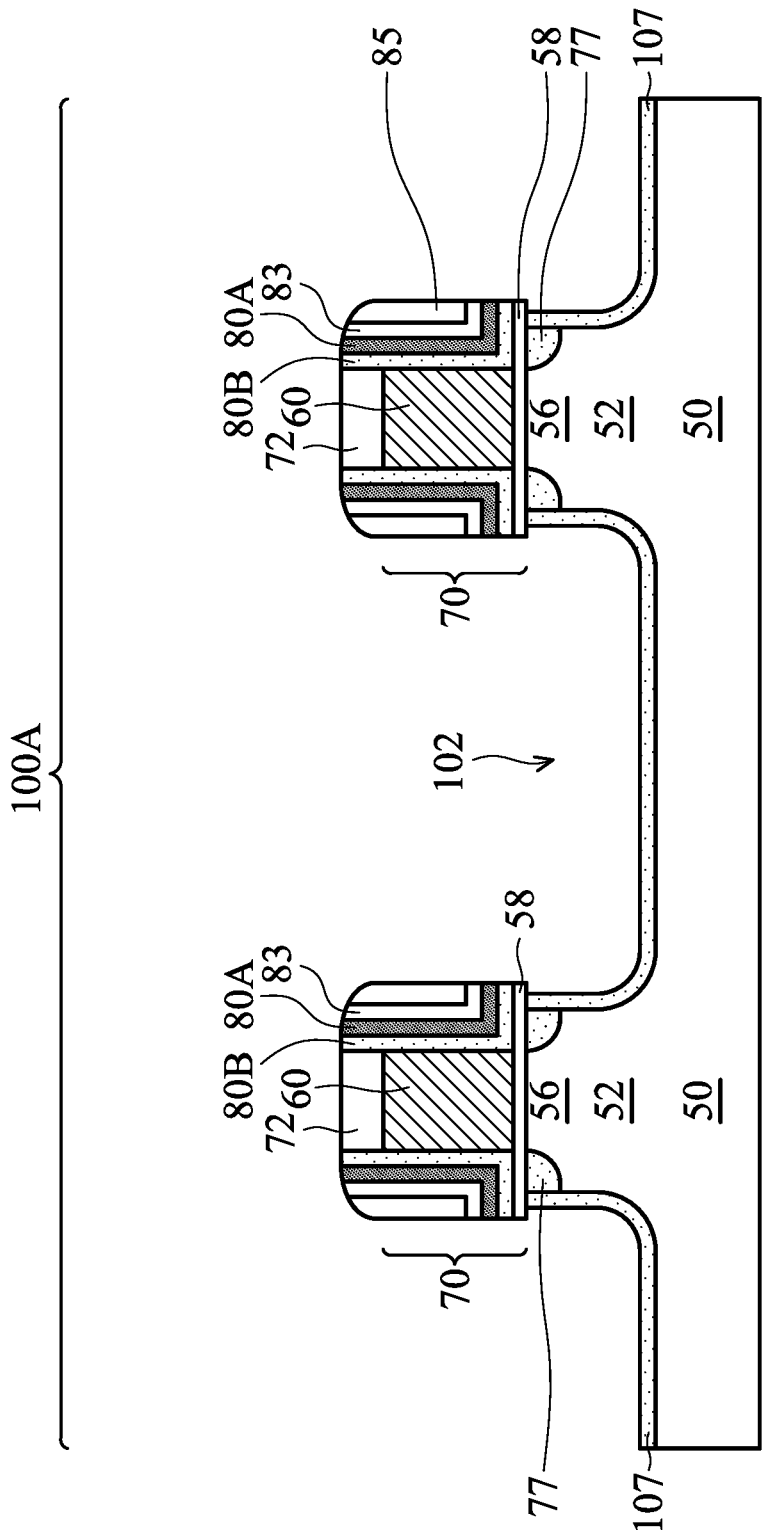
Figure 15C:
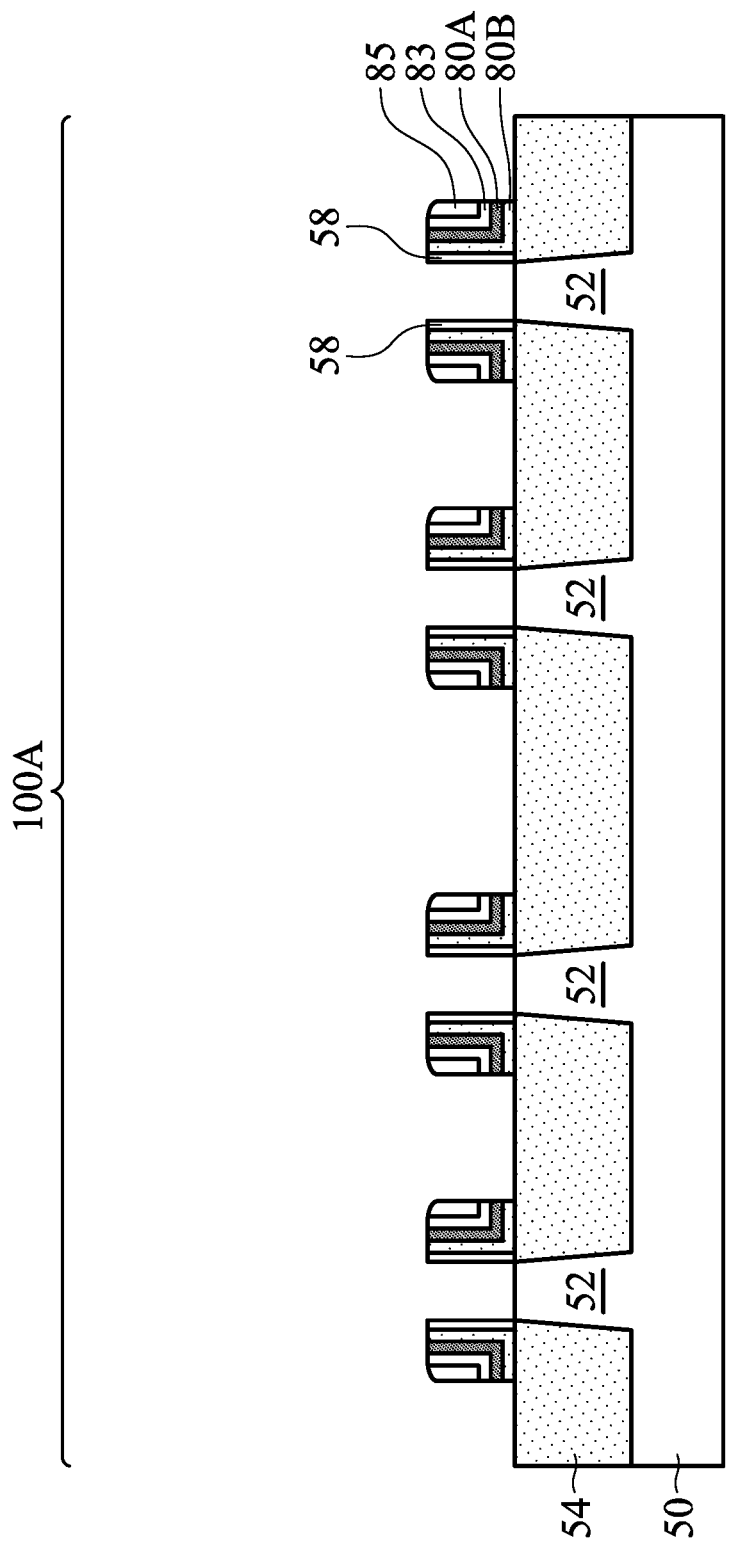

Subsequently, as illustrated by FIGS. 15A through 15C, a cleaning process may be used to remove the thin film of carbon 105. Any suitable cleaning process can be used. For example, a high temperature sulfuric-peroxide mixture (SPM) etching may be used to remove the thin film of carbon 105. The cleaning process may be performed at any suitable length, such as about 10 s to about 45 s in some embodiments. In other embodiments, the cleaning process may take a longer or shorter amount of time. In various embodiments, the thin film of carbon 105 may be removed without removing the carbon-doped regions 107 in the recesses 102.

Figure 16A:
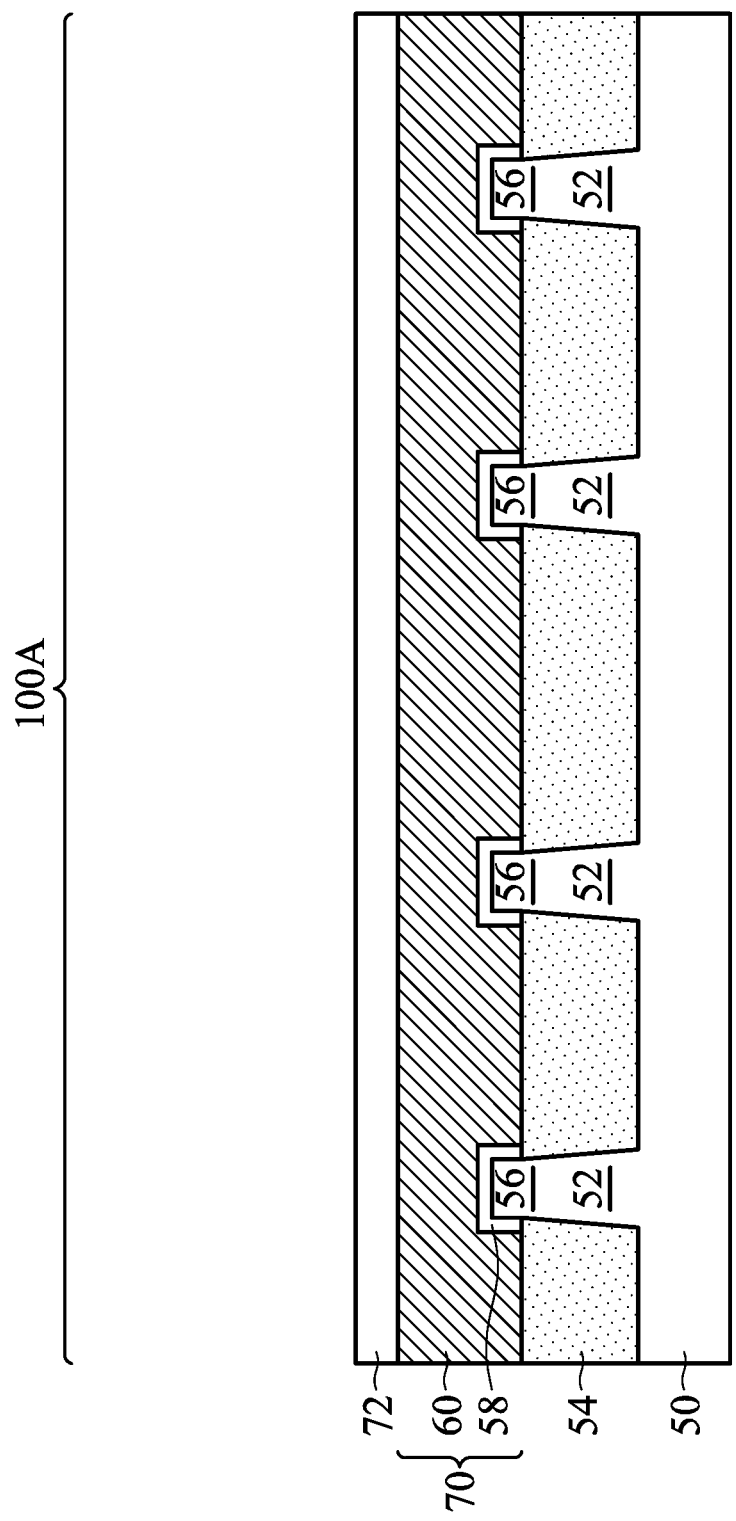
FIGS. 16A, 16B, and 16C are cross-sectional views of intermediate stages in the manufacture of a finFET device in accordance with some embodiments.
Figure 16B:
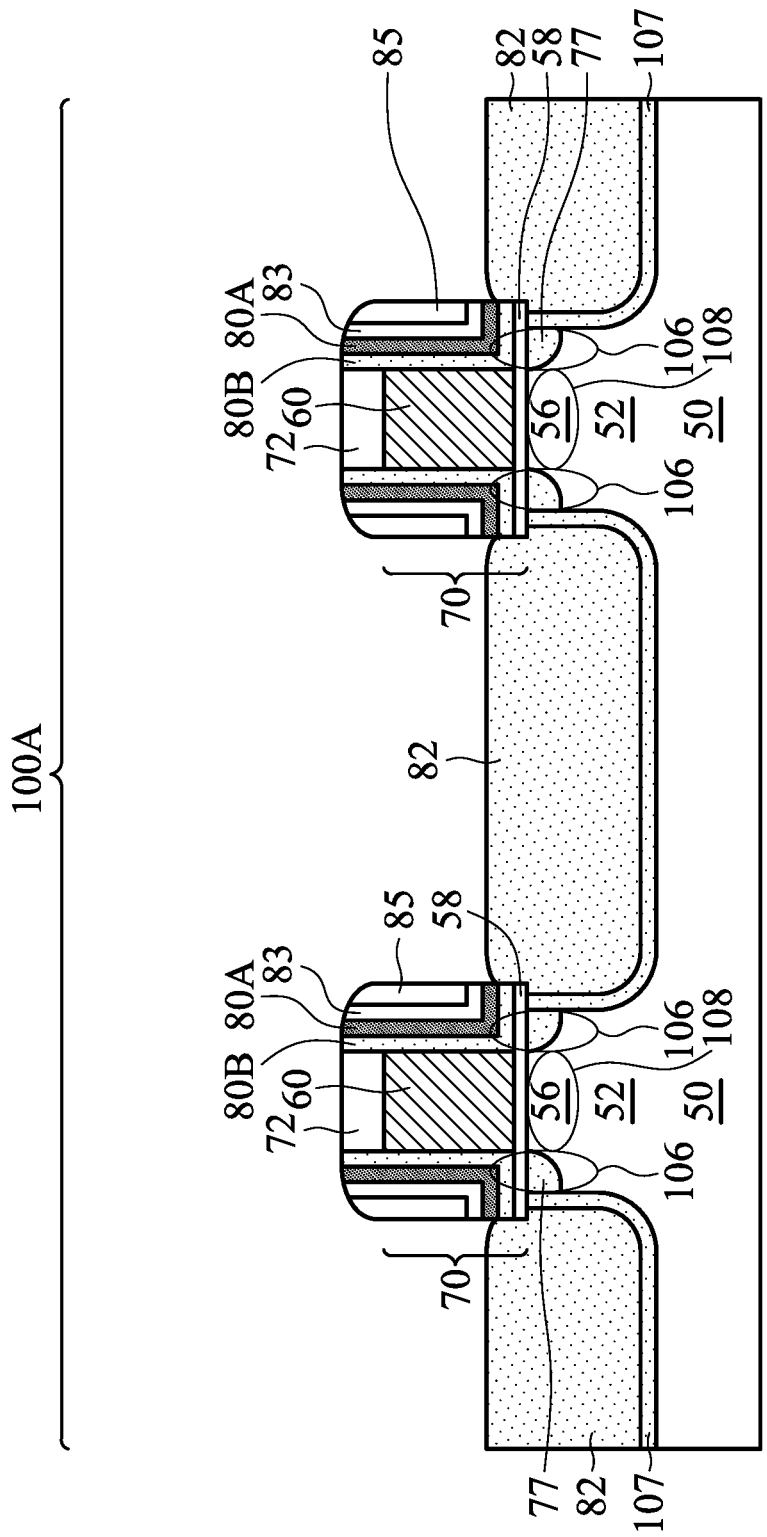
Figure 16C:
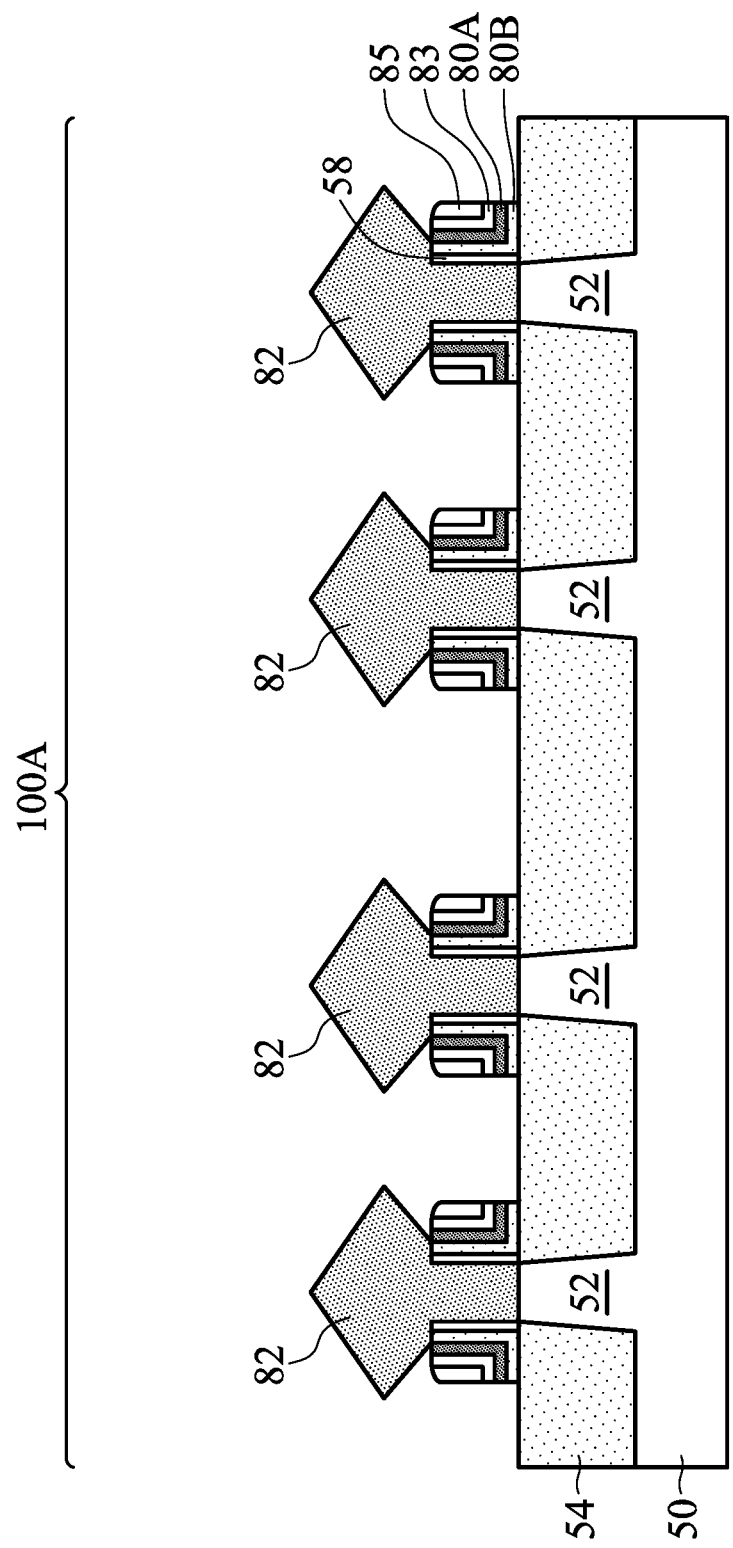
Figure 17:
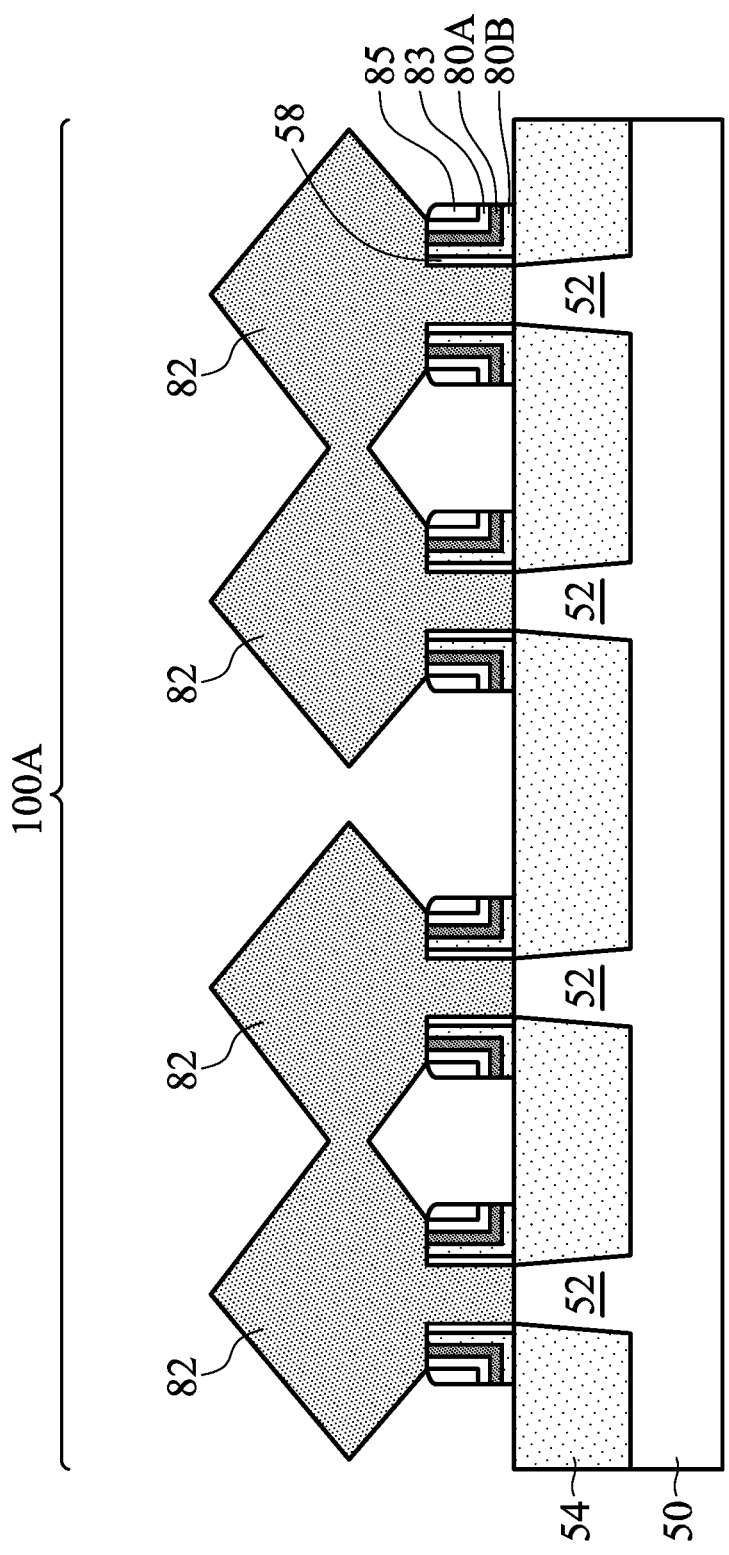
FIG. 17 is a cross-sectional view of an intermediate stage in the manufacture of a finFET device in accordance with some embodiments.

In FIGS. 16A through 16C, epitaxial source/drain regions 82 in the first region 100A are epitaxially grown in the recesses 102. The epitaxial source/drain regions 82 may include any acceptable material, such as any material that is appropriate for n-type finFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. The epitaxial source/drain regions 82 are formed in the fins 56 such that each dummy gate 70 is disposed between respective neighboring pairs of the epitaxial source/drain regions 82 (as depicted in FIG. 14B). In some embodiments, the epitaxial source/drain regions 82 may extend past fins 56 and into semiconductor strips 52.

The epitaxial source/drain regions 82 in the first region 100A may be implanted with dopants to form source/drain regions, similar to the process previously discussed for forming lightly doped source/drain regions. The epitaxial source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type impurities previously discussed. In other embodiments, the epitaxial source/drain regions 82 may be in situ doped during growth.

The carbon-doped regions 107 may be disposed along sidewalls and a bottom surface of the source/drain regions 82 and provide a barrier between the epitaxial source/drain regions 82 and the underlying substrate (e.g., the fins 56, the semiconductor strips 52, and the substrate 50). Furthermore, the carbon-doped regions 107 may completely cover a bottom surface of the epitaxial source/drain regions 82, and the carbon-doped regions 107 may completely encircle a bottom portion of the epitaxial source/drain regions 82 (e.g., portions of the epitaxial source drain regions 82 in the recesses 102) in a top-down view (not shown).

After the epitaxial source/drain regions 82 are implanted with dopants, an annealing may be performed. In some embodiments, the annealing may be performed at a temperature of about 1150° C. for about 1.4 ms to about 20 ms, such as about 3 ms, using a suitable milli-second anneal (MSA) process (e.g., using a micro-second anneal (μSSA) tool). The annealing may be part of the formation process of the epitaxial source/drain regions 82 in order to provide a more uniform distribution of dopants within the epitaxial source/drain regions 82. In some embodiments, the annealing may further cause carbon to diffuse from the carbon-doped gate spacer 80B and/or the thin carbon film 80A into peripheral regions of the fins 56 (e.g., in the LDD regions 77 and/or adjacent the channel regions of the fins 56) to form carbon-doped regions 106 as illustrated by FIG. 16B. In some embodiments, the annealing may be performed to form carbon-doped regions 106 in combination with the formation of the carbon-doped regions 107 or without the formation of the carbon-doped regions 107.

The carbon-doped regions 106 may be disposed between the epitaxial source/drain regions 82 and channel regions 108 (e.g., regions directly under the dummy gates 70) of the fins 56. In some embodiments, the dummy gates 70 may further extend along sidewalls of the channel regions 108 as illustrated by FIG. 16A. The carbon-doped regions 107 may also be disposed between the channel regions 108 of the fins 56 and the epitaxial source/drain regions 82. In some embodiments, a carbon concentration of carbon-doped regions 106 may or may not be equal to a carbon concentration of carbon-doped regions 107. For example, in an embodiment, a carbon concentration of the carbon-doped regions 106 may be less than a carbon concentration of the carbon-doped regions 107. In some embodiments, a concentration of carbon in carbon-doped regions 106 may be about $1\times10^{19}$ cm$^{-3}$ to about $5\times10^{19}$ cm$^{-3}$ while a concentration of carbon in carbon-doped region 107 may be about $3\times10^{20}$ cm$^{-3}$ or greater.

The distribution of carbon in carbon-doped regions 106/107 may be substantially uniform along a top surface, sidewalls, and bottoms of fins 56 due to the conformal plasma doping processes used to form carbon-doped regions 106/107 as described above. For example, in an embodiment, a ratio of carbon concentrations of the carbon-doped regions 107 at the top of the fins 56 to carbon concentrations of the carbon-doped regions 107 at the sidewalls of the fins 56 to carbon concentrations of carbon-doped regions 107 at the bottom of the fins 56 may be about in the range of about 1:0.65:0.65 to about 1:0.9:0.9.

It has been observed that carbon-dopants inhibit (or at least reduce) diffusion of dopants (e.g., n-type impurities) from the epitaxial source/drain regions 82 into the channel regions 108 of the fins 56. Thus, in various embodiments, by disposing one or more carbon-doped regions (e.g., regions 106 and 107) between the epitaxial source/drain regions 82 and the channel regions 108 of the fins 56, undesired diffusion of dopants (e.g., n-type impurities) from the epitaxial source/drain regions 82 can be reduced. For example, in experimental data comparing embodiments having carbon-doped regions 106 and/or 107 to embodiments without carbon-doped regions 106 and/or 107, it has been observed that the diffusion distance of dopants from the epitaxial source/drain regions 82 can be reduced by at least about 1 nm. Furthermore, by reducing diffusion from the epitaxial source/drain regions 82 one or more of the following non-limiting advantages can be achieved: reducing short channel effects, reducing parasitic capacitance (e.g., reduce gate-to-source parasitic capacitance and/or gate-to-drain parasitic capacitance), reducing leakage, and improving switching speeds of the resulting finFET device. For example, an improvement of about 3% to about 6% in switching speed has been observed in devices having carbon-doped regions separating source/drain and channel regions compared to devices without such carbon-doped regions.

FIGS. 16A through 16C depict embodiments of epitaxial source/drain regions 82 in which each source/drain region 82 is physically separate from adjacent source/drain regions 82. In some embodiments, two or more adjacent source/drain regions 82 may be merged. An embodiment of a finFET having merged source/drain regions is depicted in FIG. 17, which is taken along the C-C cross-section of FIG. 1. In FIG. 17, two adjacent source/drain regions 82 are merged. In some embodiments, more than two adjacent source/drain regions 82 may be merged.

FIGS. 18A through 22 depict the formation of epitaxial source/drain regions in second region 100B. During the formation of the epitaxial source/drain region in second region 100B, e.g., the PMOS region, the first region 100A, e.g., the NMOS region may be masked (not shown).

Figure 18A:
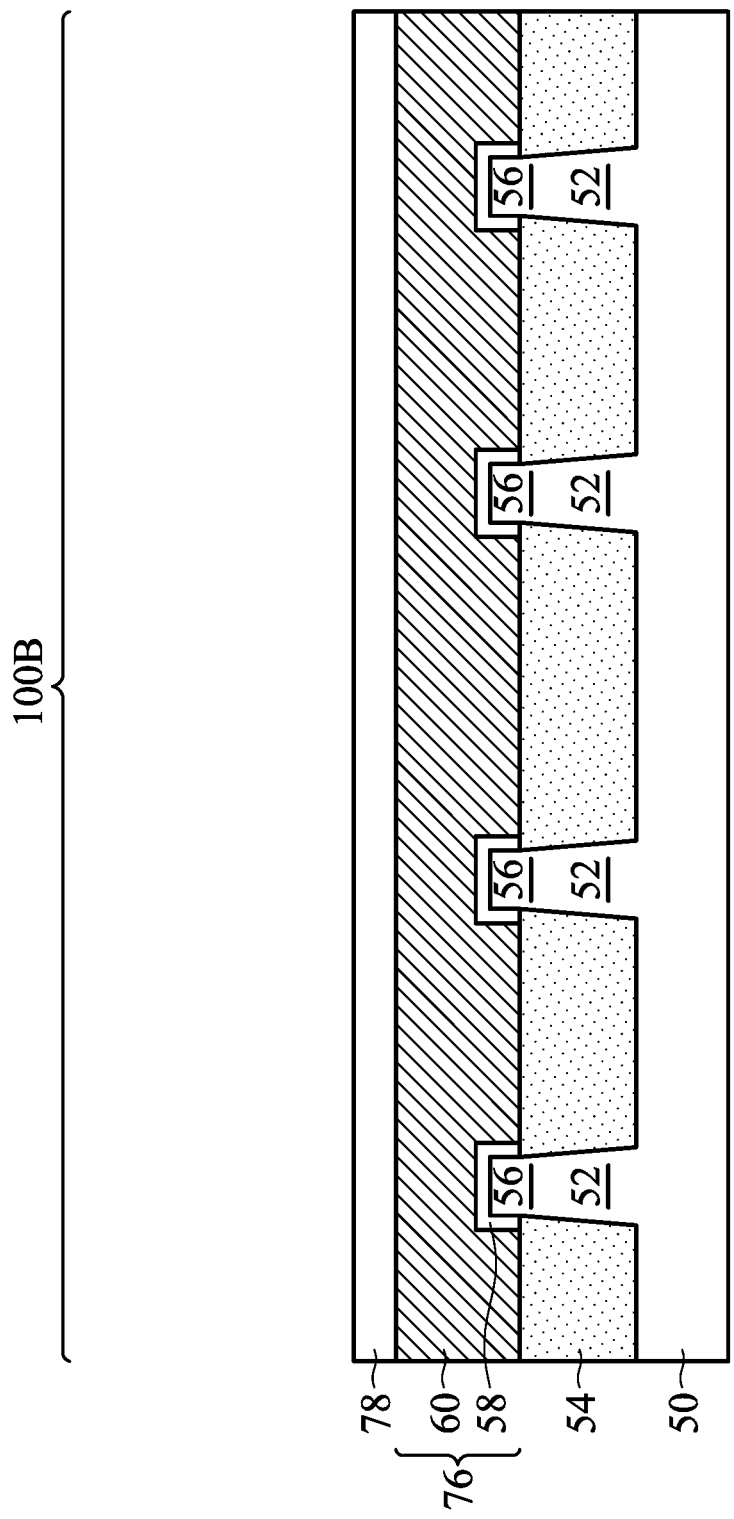
FIGS. 18A, 18B, and 18C are cross-sectional views of intermediate stages in the manufacture of a finFET device in accordance with some embodiments.
Figure 18B:
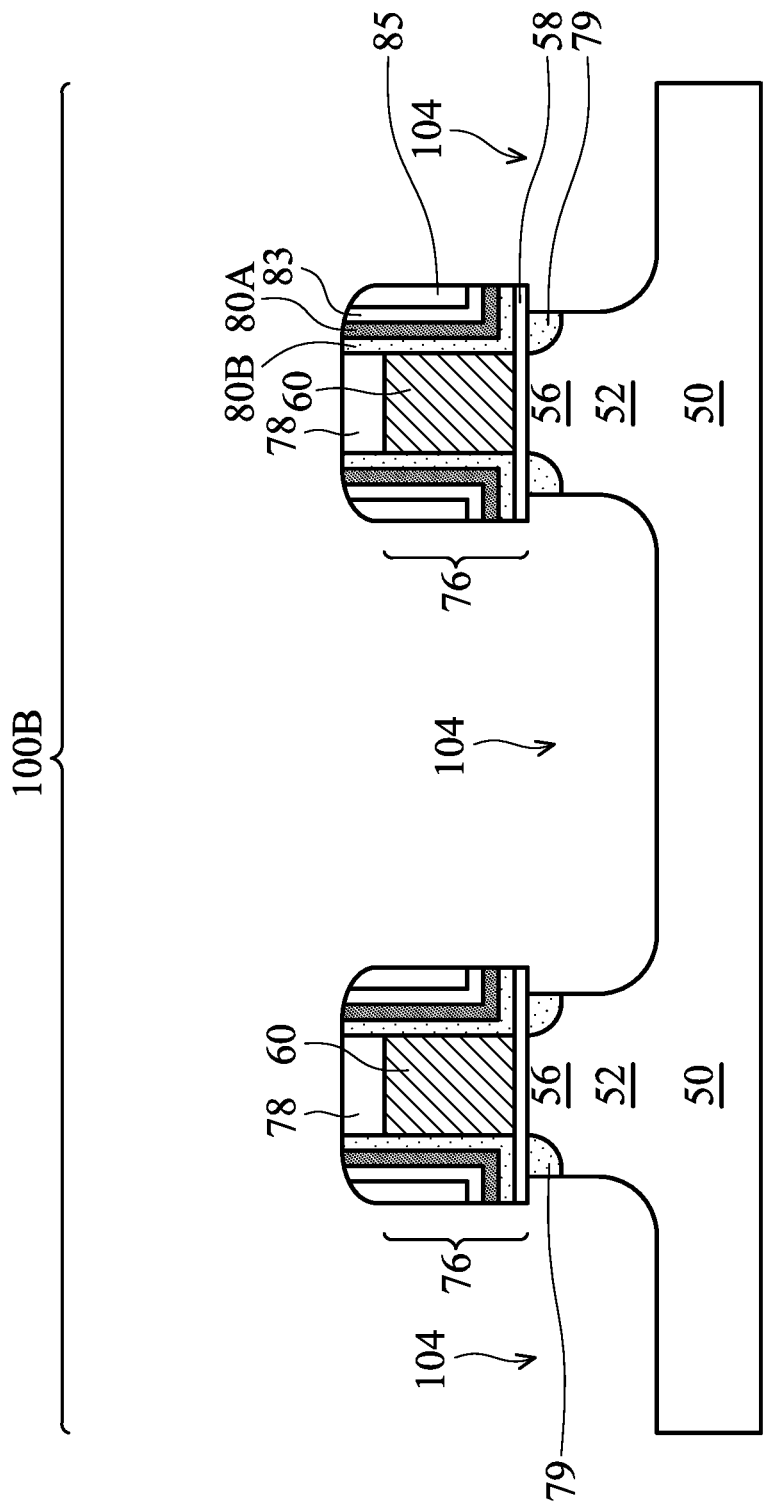
Figure 18C:
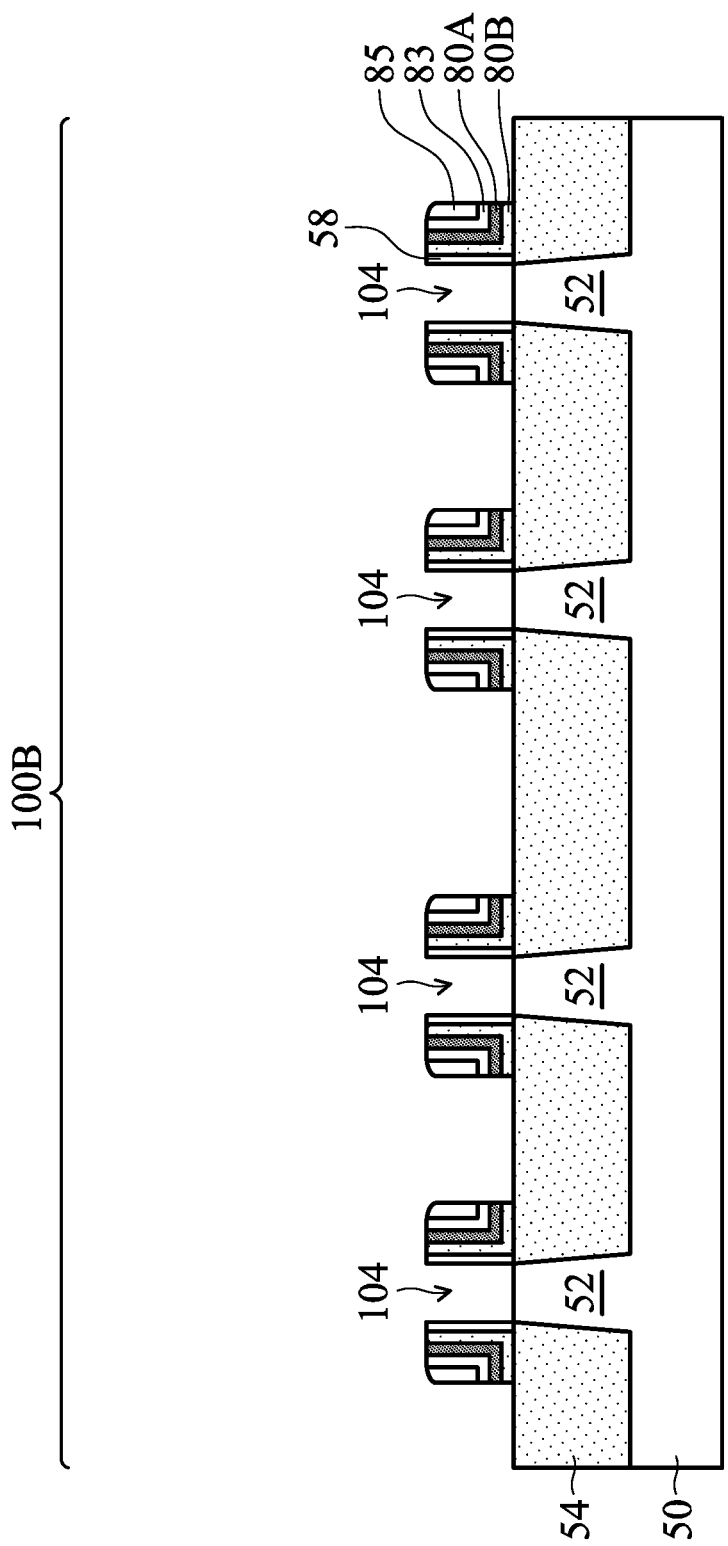

Referring to FIGS. 18A through 18C, source/drain regions of the fins 56 in the second region 100B are etched to form recesses 104. The etching may be performed in a manner that a recess 104 is formed between neighboring dummy gates 76. Any acceptable etching process may be used. In some embodiments, the recesses 104 may be etched to extend at least partially under a portion of the dummy gate dielectric 58, carbon-doped gate spacer 80B, carbon film 80A, second gate spacer 83, and third gate spacer 85. In other embodiments, the recesses 104 may not extend under any portions of the dummy gate dielectric 58, carbon-doped gate spacer 80B, carbon film 80A, second gate spacer 83, and third gate spacer 85. A portion of the fins 56 (see FIG. 18B) between adjacent ones of the recesses 104 and directly under the dummy gate 76 may provide a channel region of a finFET device.

Figure 19A:
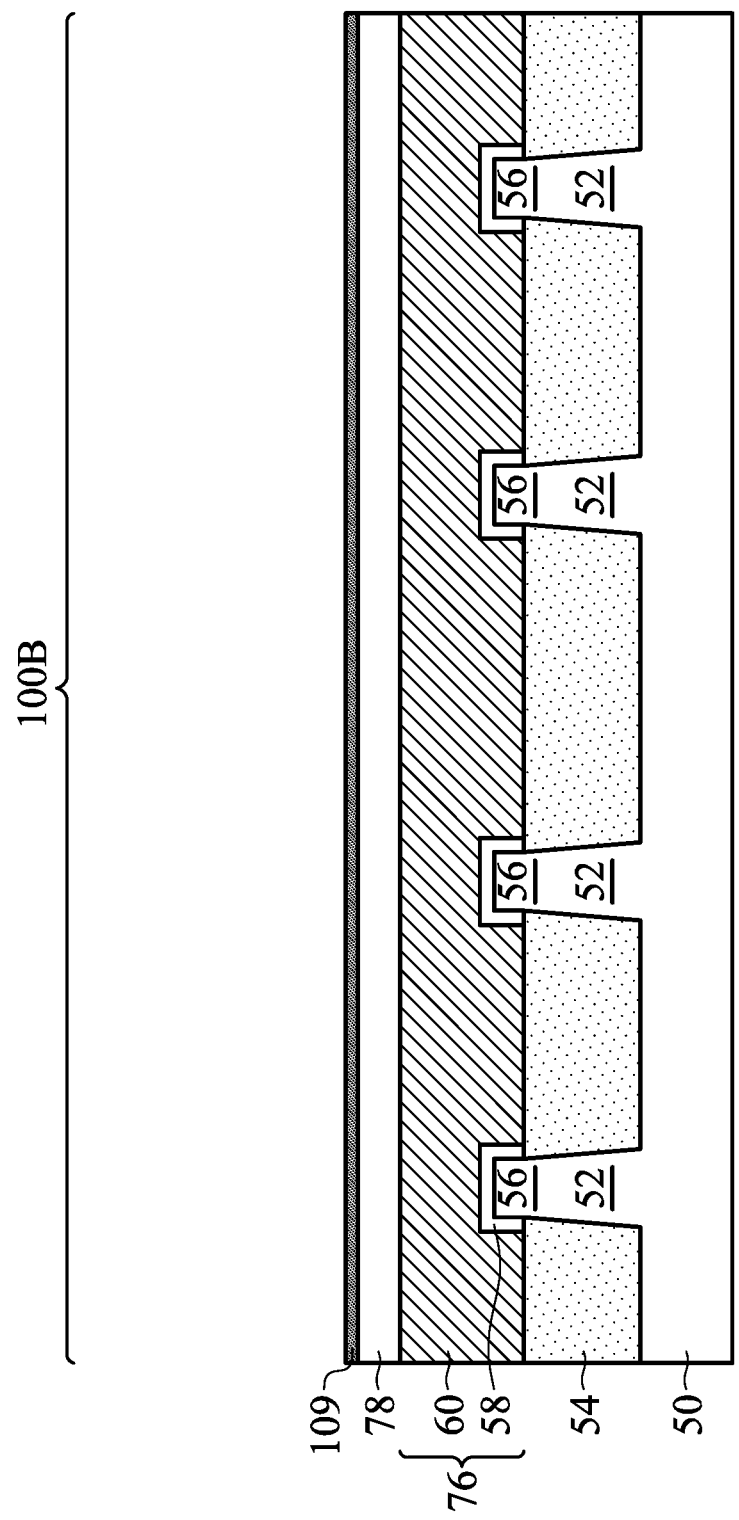
FIGS. 19A, 19B, and 19C are cross-sectional views of intermediate stages in the manufacture of a finFET device in accordance with some embodiments.
Figure 19B:
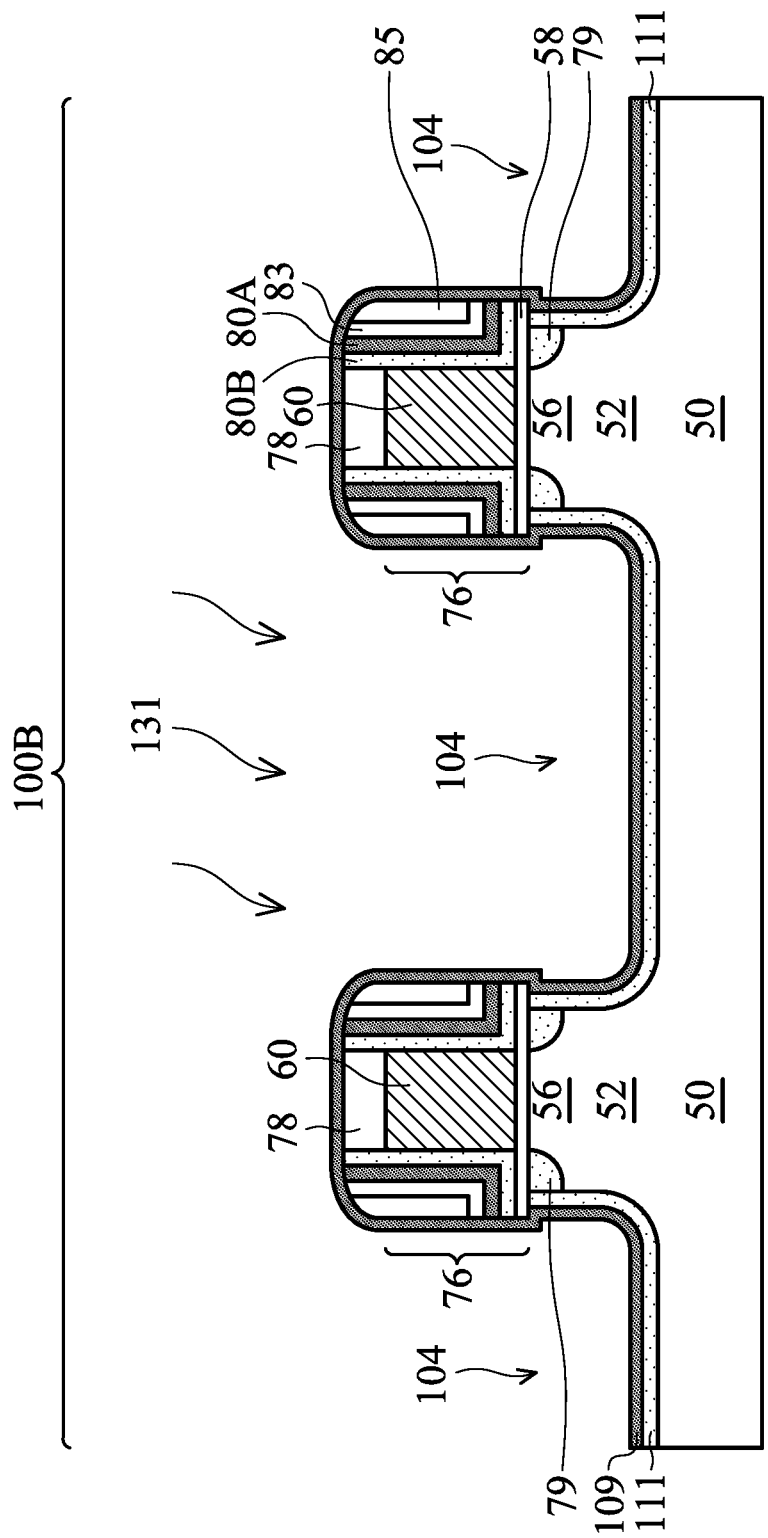
Figure 19C:
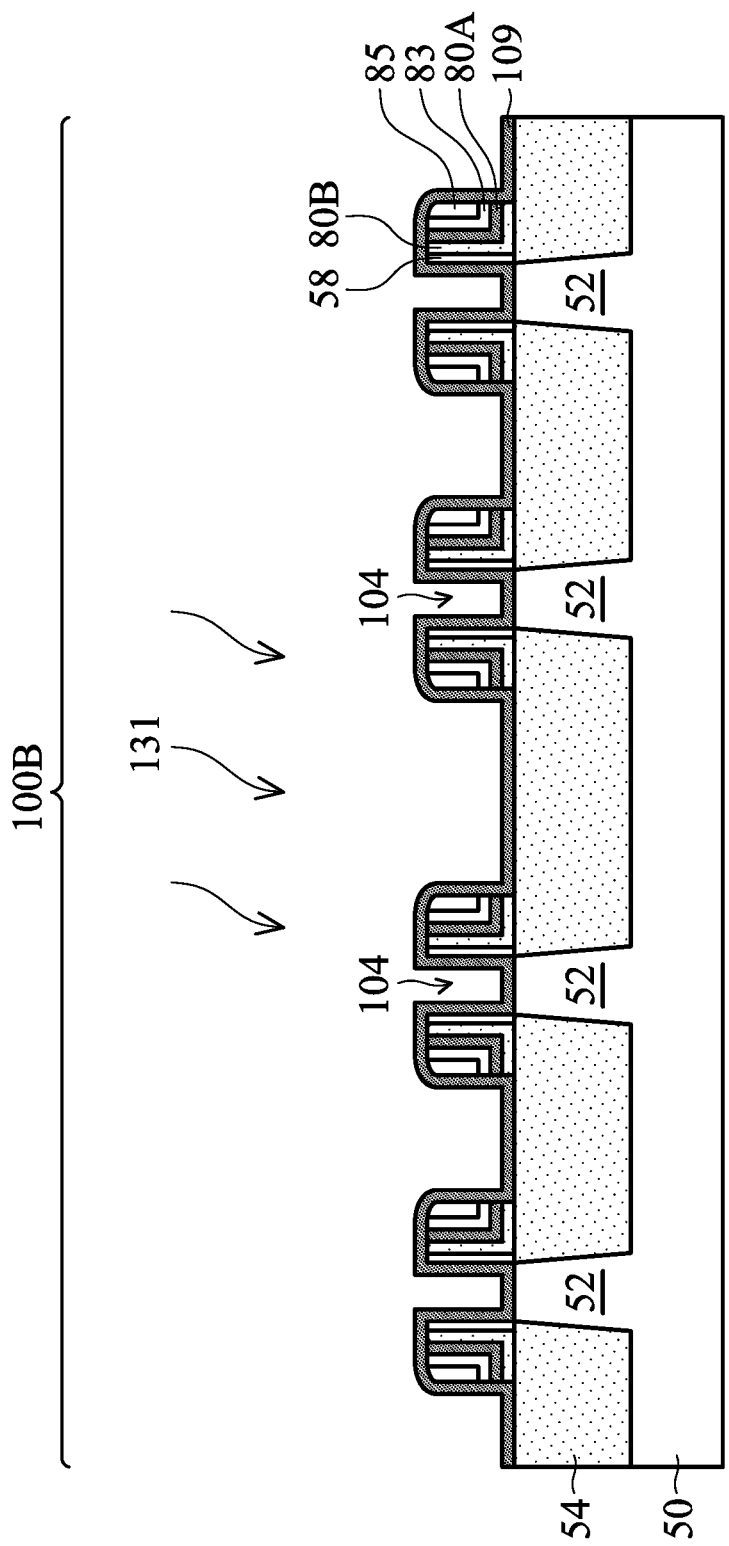

Next, as shown in FIGS. 19A through 19C, a carbon treatment 131 may be performed on the recesses 104. Carbon treatment 131 may implant carbon dopants along sidewalls and a bottom surface of the recesses 104, thereby forming carbon-doped regions 111 in the recesses 104 along the fins 56, semiconductor strips 52, and substrate 50. In another embodiment, the carbon treatment 101 described above and/or the carbon treatment 131 may implant carbon dopants on various gate spacers (e.g., carbon-doped gate spacer 80B, carbon film 80A, second gate spacer 83, and third gate spacer 85), which may diffuse into channel regions of the finFET without forming the carbon-doped regions 111 along the sidewalls and the bottom surface of the recesses 104. In an embodiment, the carbon treatment 131 may simultaneously implant carbon dopants along sidewalls and a bottom surface of recesses 104 to form the carbon-doped regions in and on various gate spacers, which may diffuse into channel regions of the FinFET. In an embodiment, the carbon treatment 131 forms the carbon-doped regions 111 without implanting carbon dopants on various gate spacers. For example, the carbon treatment 131 may be performed without performing the carbon treatment 101 as described above. The carbon-doped region 111 may include carbon as well as a material of the fins 56, semiconductor strips 52, and substrate 50 (e.g., Si, SiGe, combinations thereof, or the like). The carbon-doped regions 111 on sidewalls and a bottom surface of the recesses 104 may be used to reduce diffusion of dopants from subsequently formed epitaxial source/drain regions in recesses 104 (e.g., see FIGS. 21A through 21C). In some embodiments, reduced diffusion of dopants may be a result of interstitial reduction provided by the carbon-doped regions 111.

In some embodiments, carbon treatment 131 may be similar to carbon treatment 101 (see FIGS. 10A through 10D) and carbon treatment 121 (see FIGS. 14A through 14C). For example, carbon treatment 131 may include placing a wafer on which the finFET 30 is being formed in a plasma chamber 202 on a wafer chuck under RF coil. Any suitable plasma chamber may be used. For example, the VARIAN VIISTA® PLAD from Applied Materials may be suitable for use in some embodiments. A carbon plasma conformal doping may be performed on the finFET 30 in the plasma chamber using a gas source and an RF coil that are configured to create carbon plasma in the plasma chamber. In some embodiments, the gas source generates a gas during the carbon plasma conformal doping. The gas may be a carbon hydride in some embodiments, such as $CH_4$, $C_2H_2$, $C_2H_4$, or $C_2H_6$, which may be applied at a dosage of about $5 \times 10^{13}$ $cm^{-2}$ to about $5 \times 10^{14}$ $cm^{-2}$ in the plasma chamber during carbon treatment 131. In some embodiments, a DC bias of about 0.5 kV to about 2 kV, a power range of about 650 W to about 900 W, a pressure of about 20 mT to about 80 mT, and a pulse width of about 20 µs to about 60 µs may be applied to the plasma chamber during carbon treatment 131. In an embodiment carbon plasma conformal doping process, plasma containing carbon ions is created in the plasma chamber 202. The carbon ions are targeted toward the finFET 30 and implanted in exposed surfaces of finFET 30 according to the process parameters of plasma chamber 202

In some embodiments, the use of a carbon plasma conformal doping of the recesses 104 may enable a more uniform doping in the resulting carbon-doped regions 111. For example, it may be possible to dope the recesses 104 using beamline implantation. However, due to high aspect ratios of some fins, a line of sight from the beamline to all areas of the recesses 104 may be unavailable. Therefore, a beamline implantation may result in a failure to dope some sections of the recesses 104, leading to a non-uniform doping of the carbon-doped regions 111 particularly for aspect ratios greater than about 10:1 for the fins 56. The use of a carbon plasma conformal doping of the recesses 104 may allow for a more uniform doping of the carbon-doped regions 111. For example, after carbon treatment 131 of the recesses 104, a carbon concentration in the recesses 104 may be substantially similar in different sections of the carbon-doped regions 111. For example, in an embodiment, a ratio of carbon concentrations of the carbon-doped regions 111 at the top of the fins 56 to carbon concentrations of the carbon-doped regions 111 at the sidewalls of the fins 56 to carbon concentrations of carbon-doped regions 111 at the bottom of the fins 56 may be in the range of about 1:0.65: 0.65 to about 1:0.9:0.9.

In some embodiments, the use of carbon plasma conformal doping of the carbon-doped regions 111 may further provide a high concentration of carbon with reduced surface damage to the underlying substrate 50, semiconductor strips 52, and/or fins 56. After the carbon treatment 131, the carbon-doped regions 111 may have increased amounts of carbon. For example, the concentration of carbon in the carbon-doped region 111 may be about $3 \times 10^{20}$ $cm^{-3}$ or greater in some embodiments. It has been observed that a carbon concentration in this range is sufficient to reduce diffusion of impurities from the epitaxial source/drain regions 84 into the fins 56.

After the carbon treatment 131, a thin film of carbon 109 may have built up on a surface of the recesses 104 to which the carbon plasma was incident during the carbon treatment 131. In some embodiments, the thin film of carbon 109 may further be deposited over dummy gate stacks 70 and along exposed surfaces of the carbon-doped gate spacer 80B, carbon film 80A, second gate spacer 83, and third gate spacer 85 in the second region 100B.

Figure 20A:
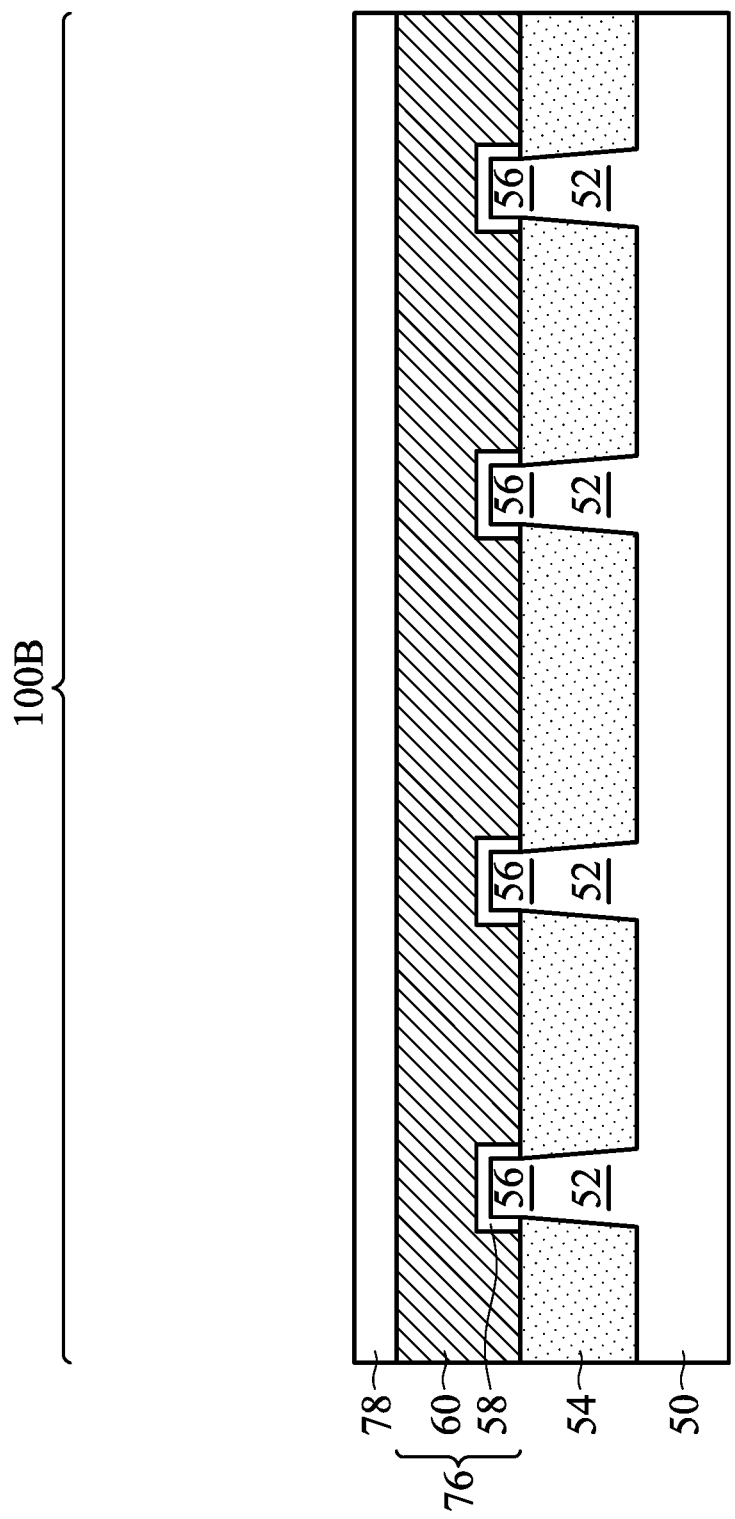
FIGS. 20A, 20B, and 20C are cross-sectional views of intermediate stages in the manufacture of a finFET device in accordance with some embodiments.
Figure 20B:
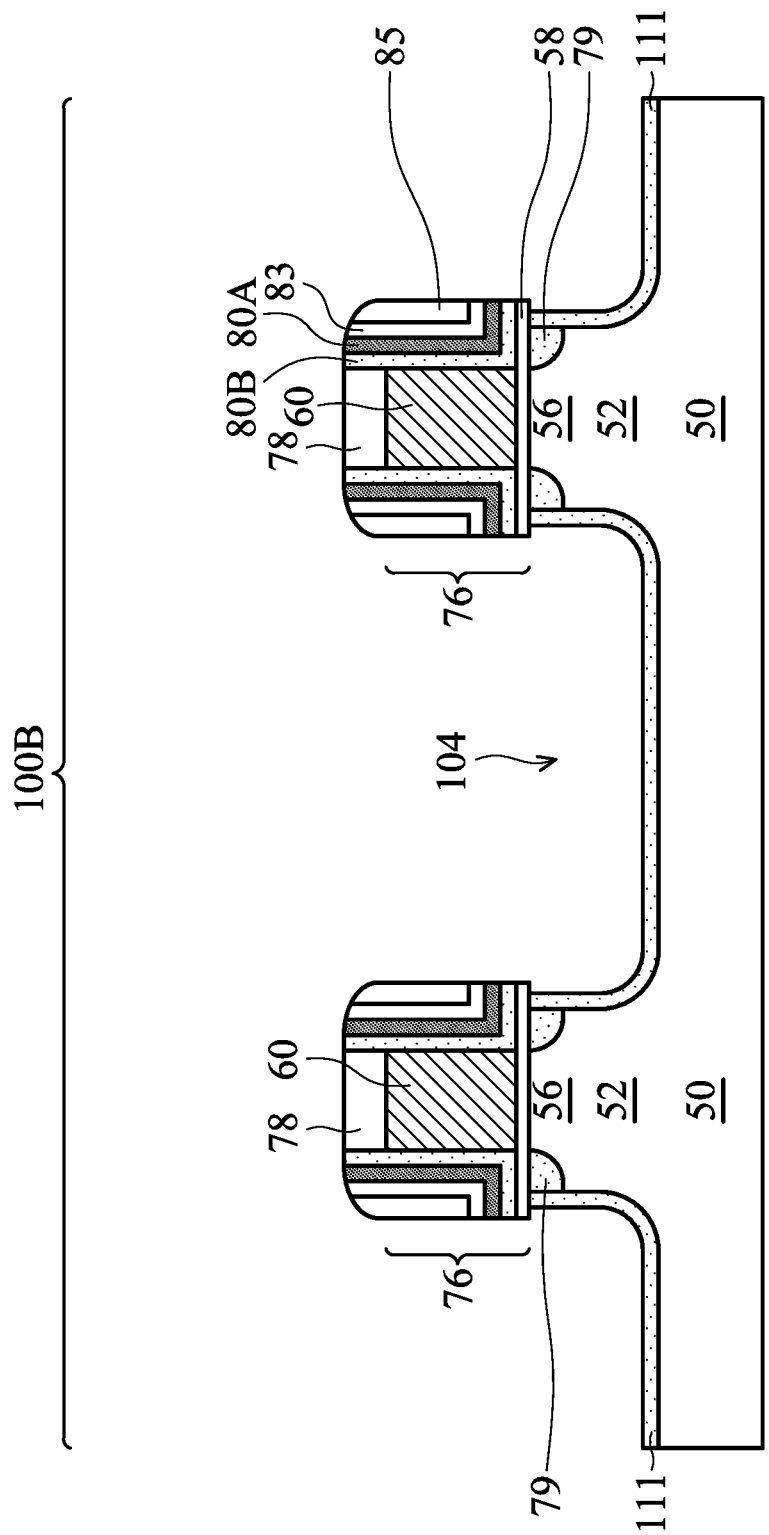
Figure 20C:
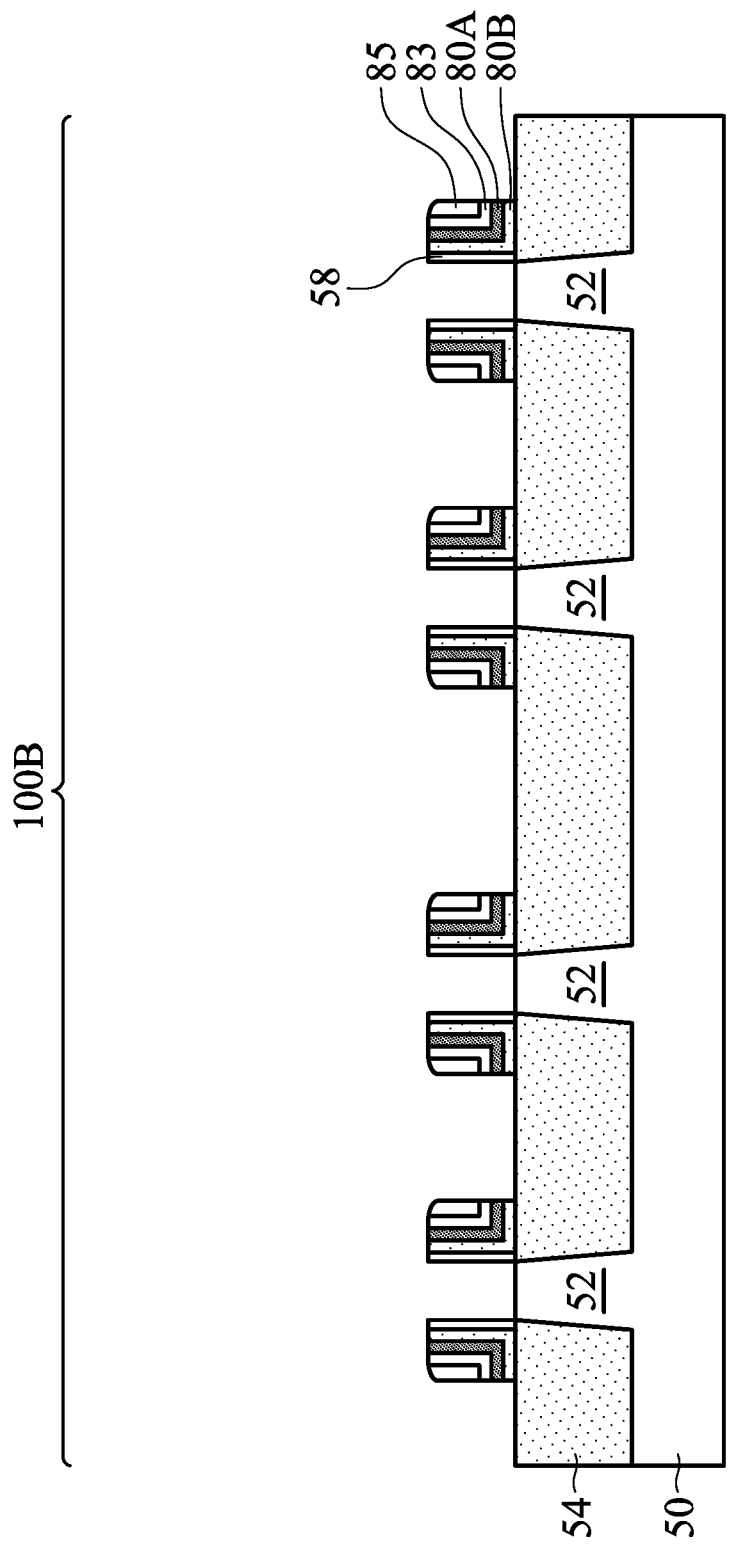

Subsequently, as illustrated by FIGS. 20A through 20C, a cleaning process may be used to remove the thin film of carbon 109. Any suitable cleaning process can be used. For example, a high temperature sulfuric-peroxide mixture (SPM) etching may be used to remove the thin film of carbon 109. The cleaning process may be performed at any suitable length, such as about 10 s to about 45 s in some embodiments. In other embodiments, the cleaning process may take a longer or shorter amount of time. In various embodiments, the thin film of carbon 109 may be removed without removing the carbon-doped regions 111 in the recesses 104.

Figure 21A:
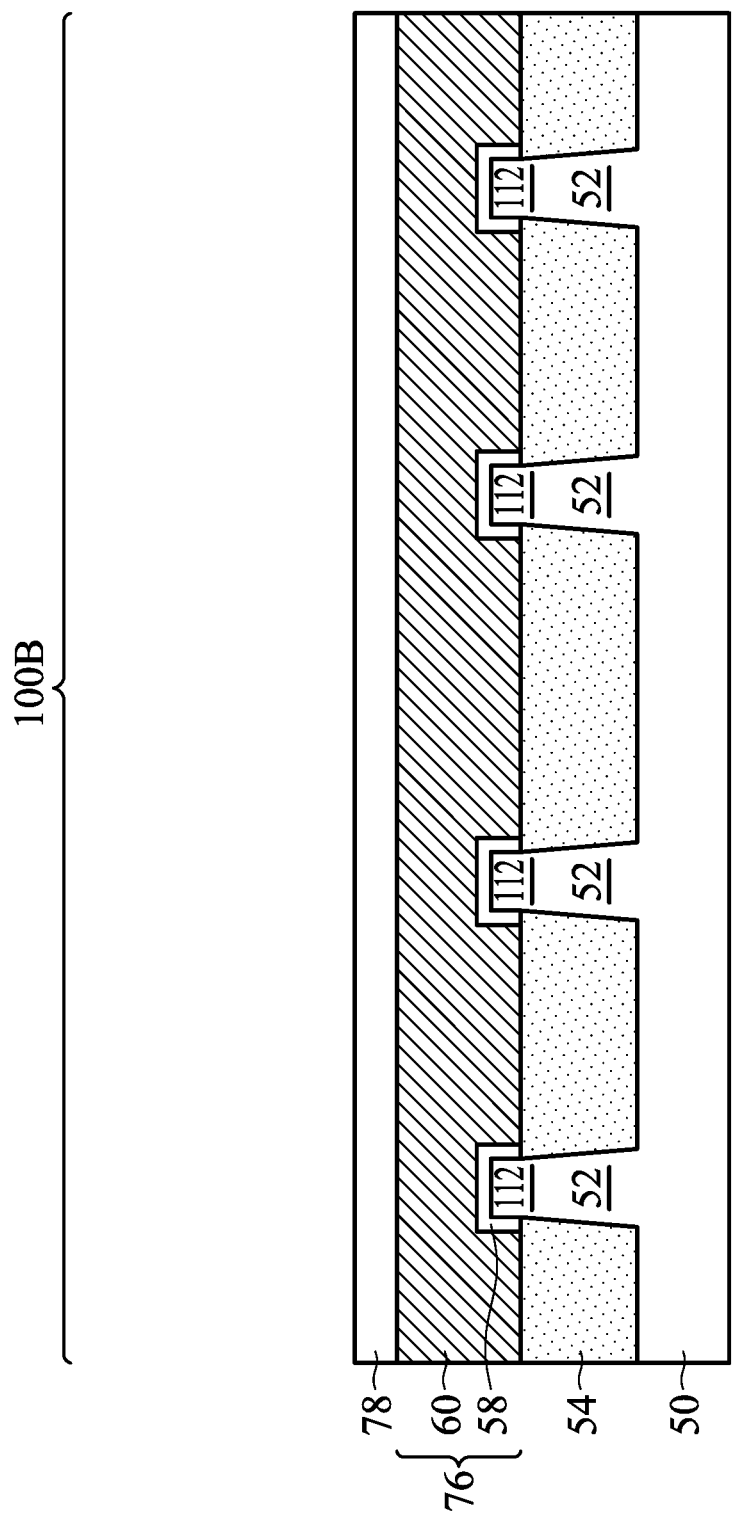
FIGS. 21A, 21B, and 21C are cross-sectional views of intermediate stages in the manufacture of a finFET device in accordance with some embodiments.
Figure 21B:
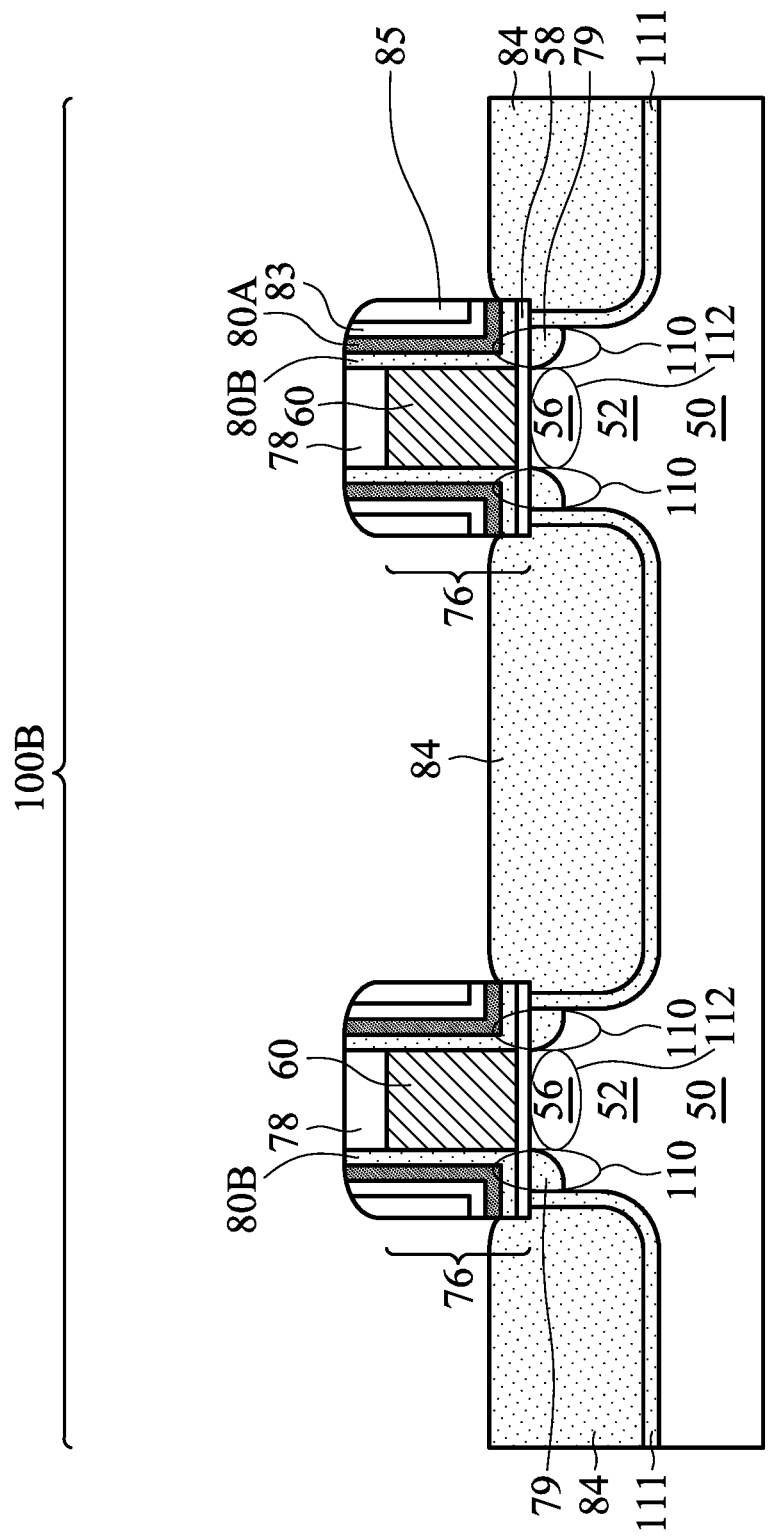
Figure 21C:
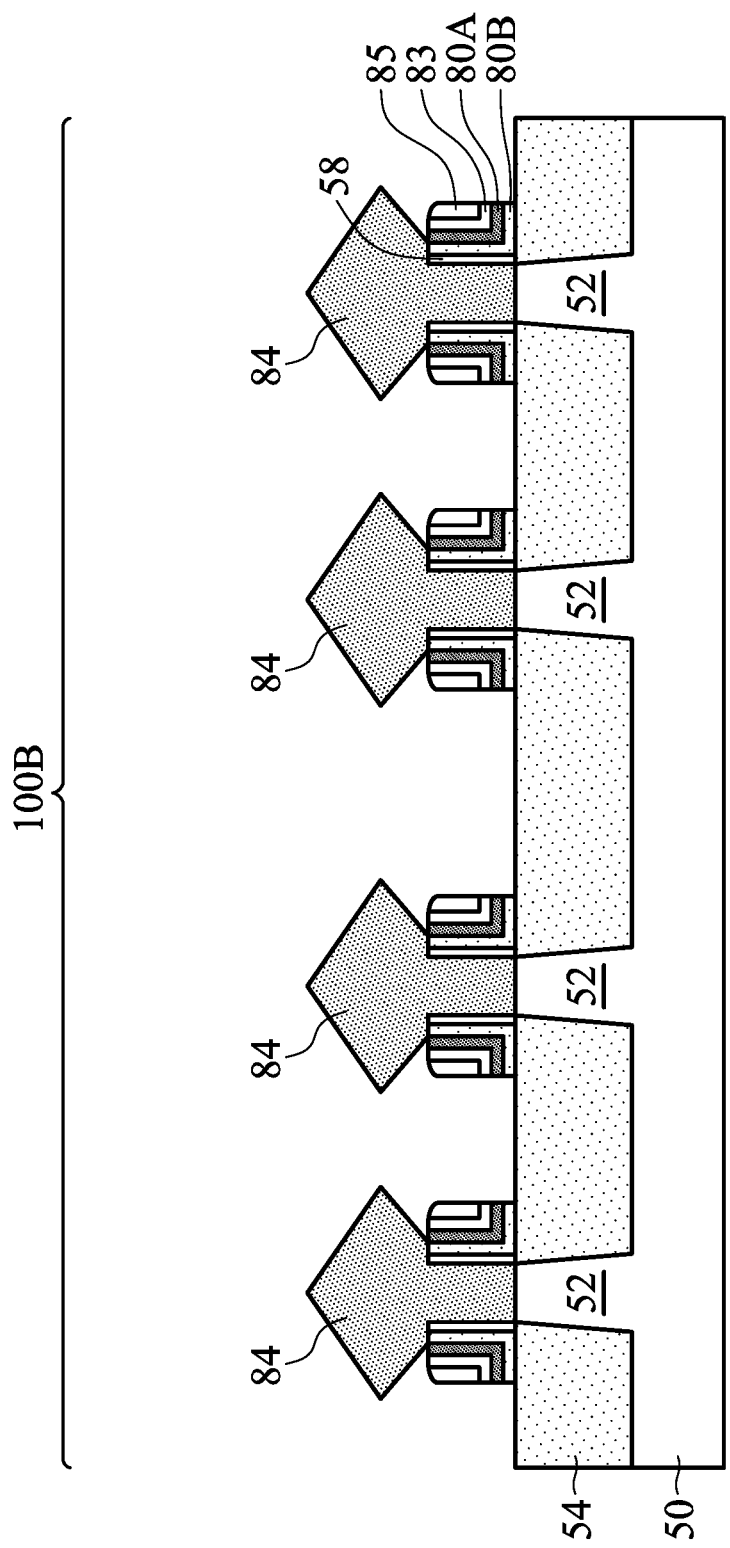
Figure 22:
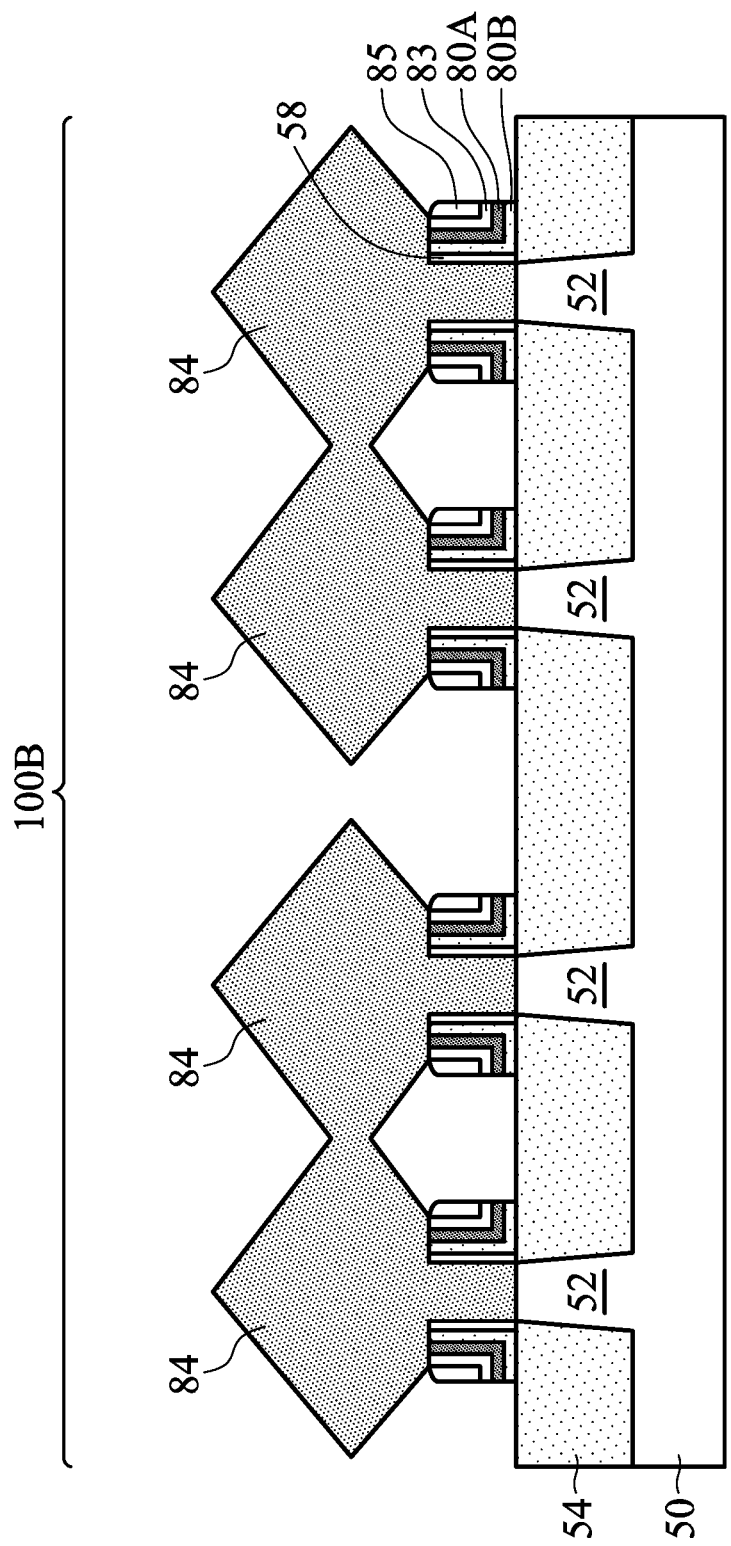
FIG. 22 is a cross-sectional view of an intermediate stage in the manufacture of a finFET device in accordance with some embodiments.

In FIGS. 21A through 21C, epitaxial source/drain regions 84 in the second region 100B are epitaxially grown in the recesses 104. The epitaxial source/drain regions 84 may include any acceptable material, such as material that is appropriate for p-type finFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. In the second region 100B, epitaxial source/drain regions 84 are formed in the fins 56 such that each dummy gate 76 is disposed between respective neighboring pairs of the epitaxial source/drain regions 84. In some embodiments epitaxial source/drain regions 84 may extend may fins 56 and into the semiconductor strips 52.

The epitaxial source/drain regions 84 in the second region 100B may be implanted with dopants to form source/drain regions, similar to the process previously discussed for forming lightly doped source/drain regions. The epitaxial source/drain regions 84 may have an impurity concentration of in a range from about $10^{19}$ $cm^{-3}$ to about $10^{21}$ $cm^{-3}$. The p-type impurities for source/drain regions in the second region 100B, e.g., the PMOS region, may be any of the p-type impurities previously discussed. In other embodiments, the epitaxial source/drain regions 84 may be in situ doped during growth.

The carbon-doped regions 111 may be disposed along sidewalls and a bottom surface of the source/drain regions 84 and provide a barrier between the epitaxial source/drain regions 84 and the underlying substrate (e.g., the fins 56, the semiconductor strips 52, and the substrate 50). Furthermore, the carbon-doped regions 111 may completely cover a bottom surface of the epitaxial source/drain regions 84, and the carbon-doped regions 111 may completely encircle a bottom portion of the epitaxial source/drain regions 84 (e.g., portions of the epitaxial source drain regions 84 in the recesses 104) in a top-down view (not shown).

After the epitaxial source/drain regions 84 are implanted with dopants, an annealing may be performed. In some embodiments, the annealing may be performed at a temperature of about 1150° C. for about for about 1.4 ms to about 20 ms, such as about 3 ms, using a suitable MSA process (e.g., using μSSA tool). The annealing may be part of the formation process of the epitaxial source/drain regions 84 in order to provide a more uniform distribution of dopants within the epitaxial source/drain regions 84. In some embodiments, the annealing may further cause carbon to diffuse from the carbon-doped gate spacer 80B and/or the thin carbon film 80A into peripheral of the fins 56 to form carbon-doped regions 110 as illustrated by FIG. 21B. In some embodiments, the annealing may be performed to form carbon-doped regions 110 in combination with the formation of the carbon-doped regions 111 or without the formation of the carbon-doped regions 111.

The carbon-doped regions 110 may be disposed between the epitaxial source/drain regions 84 and channel regions 112 of the fins 56 (e.g., regions of the fins 56 directly under the dummy gates 76). The carbon-doped regions 111 may also be disposed between the channel regions 112 of the fins 56 and the epitaxial source/drain regions 84. In some embodiments, a carbon concentration of carbon-doped regions 110 may or may not be equal to a carbon concentration of carbon-doped regions 111. For example, in an embodiment, a carbon concentration of the carbon-doped regions 110 may be less than a carbon concentration of the carbon-doped regions 111. In some embodiments, a concentration of carbon in carbon-doped regions 110 may be about $1 \times 10^{19}$ cm$^{-3}$ to about $5 \times 10^{19}$ cm$^{-3}$ while a concentration of carbon in carbon-doped region 111 may be about $3 \times 10^{20}$ cm$^{-3}$ or greater.

In some embodiments, the dummy gates 76 may further extend along sidewalls of the channel regions 112 as illustrated by FIG. 21A. The distribution of carbon in carbon-doped regions 111/110 may be substantially uniform along a top surface, sidewalls, and bottoms of fins 56 due to the conformal plasma doping processes used to form carbon-doped regions 111/110 as described above. For example, in an embodiment, a ratio of carbon concentrations of the carbon-doped regions 111/110 at the top of the fins 56 to carbon concentrations of the carbon-doped regions 111/110 at the sidewalls of the fins 56 to carbon concentrations of carbon-doped regions 111/110 at the bottom of the fins 56 may be in the range of about 1:0.65:0.65 to about 1:0.9:0.9.

It has been observed that carbon-dopants inhibit (or at least reduce) diffusion of dopants (e.g., p-type impurities) from the epitaxial source/drain regions 84 into the channel regions 112 of the fins 56. Thus, in various embodiments, by disposing one or more carbon-doped regions (e.g., regions 110 and 111) between the epitaxial source/drain regions 84 and the channel regions 112 of the fins 56, undesired diffusion of dopants (e.g., p-type impurities) from the epitaxial source/drain regions 84 can be reduced. For example, in experimental data comparing embodiments having carbon-doped regions 110 and/or 111 to embodiments without carbon-doped regions 110 and/or 111, it has been observed that the diffusion distance of dopants from the epitaxial source/drain regions 84 can be reduced by at least about 1 nm. Furthermore, by reducing diffusion from the epitaxial source/drain regions 84 one or more of the following non-limiting advantages can be achieved: reducing short channel effects, reducing parasitic capacitance (e.g., reduce gate-to-source parasitic capacitance and/or gate-to-drain parasitic capacitance), reducing leakage, and improving switching speeds of the resulting finFET device. For example, an improvement of about 3% to about 6% in switching speed has been observed in devices having carbon-doped regions separating source/drain and channel regions compared to devices without such carbon-doped regions.

Although the annealing process to form carbon-doped regions 110 is illustrated as being separate from the annealing process to form carbon-doped regions 106, in other embodiments, a single annealing may be performed to simultaneously form carbon-doped regions 110 and 106. For example, in an embodiment, a single annealing process is performed after the epitaxial source/drain regions 82 and 84 are formed. In such embodiments, the single annealing may cause diffusion of carbon from the carbon-doped gate spacer 80B into the underlying fins 56 to simultaneously form carbon-doped regions 106 in the first region 100A as well as carbon-doped regions 110 in the second region 100B.

FIGS. 21A through 21C depict embodiments of epitaxial source/drain regions 84 in which each source/drain region 84 is physically separate from adjacent source/drain regions 84. In some embodiments, two or more adjacent source/drain regions 84 may be merged. An embodiment of a finFET having merged source/drain regions is depicted in FIG. 22, which is taken along the C-C cross-section of FIG. 1. In FIG. 22, two adjacent source/drain regions 84 are merged. In some embodiments, more than two adjacent source/drain regions 84 may be merged.

Figure 23A:
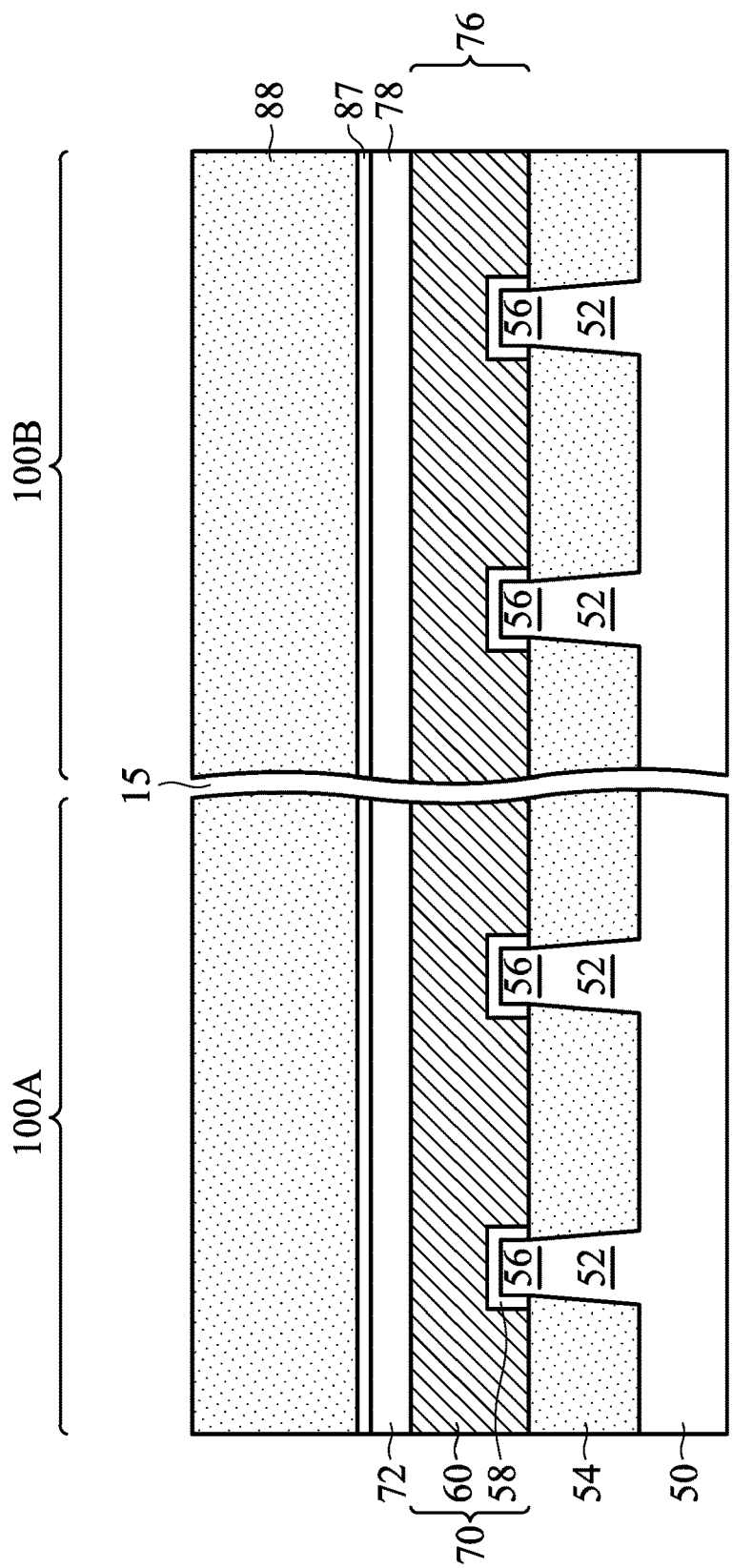
FIGS. 23A, 23B, and 23C are cross-sectional views of intermediate stages in the manufacture of a finFET device in accordance with some embodiments.
Figure 23B:
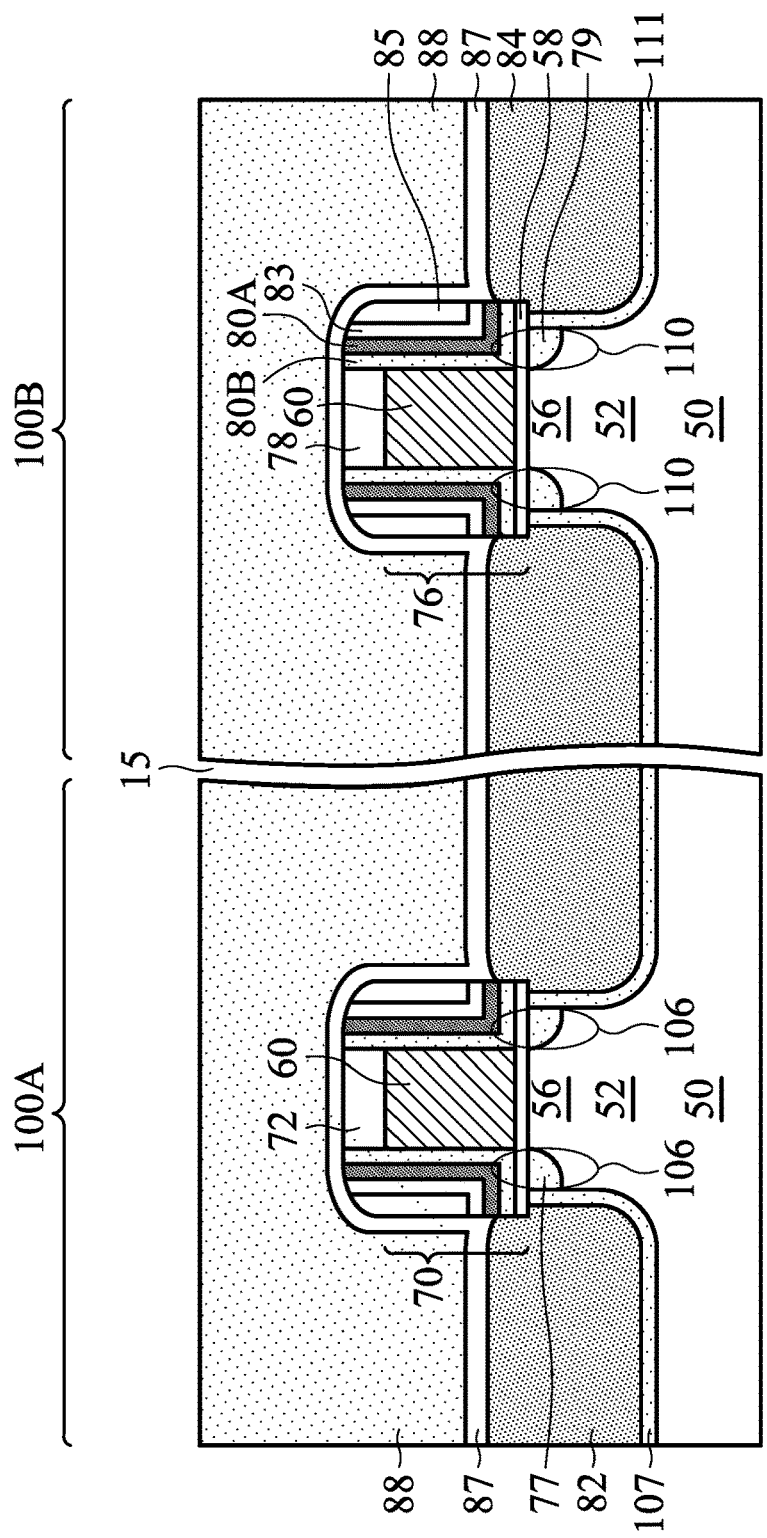
Figure 23C:
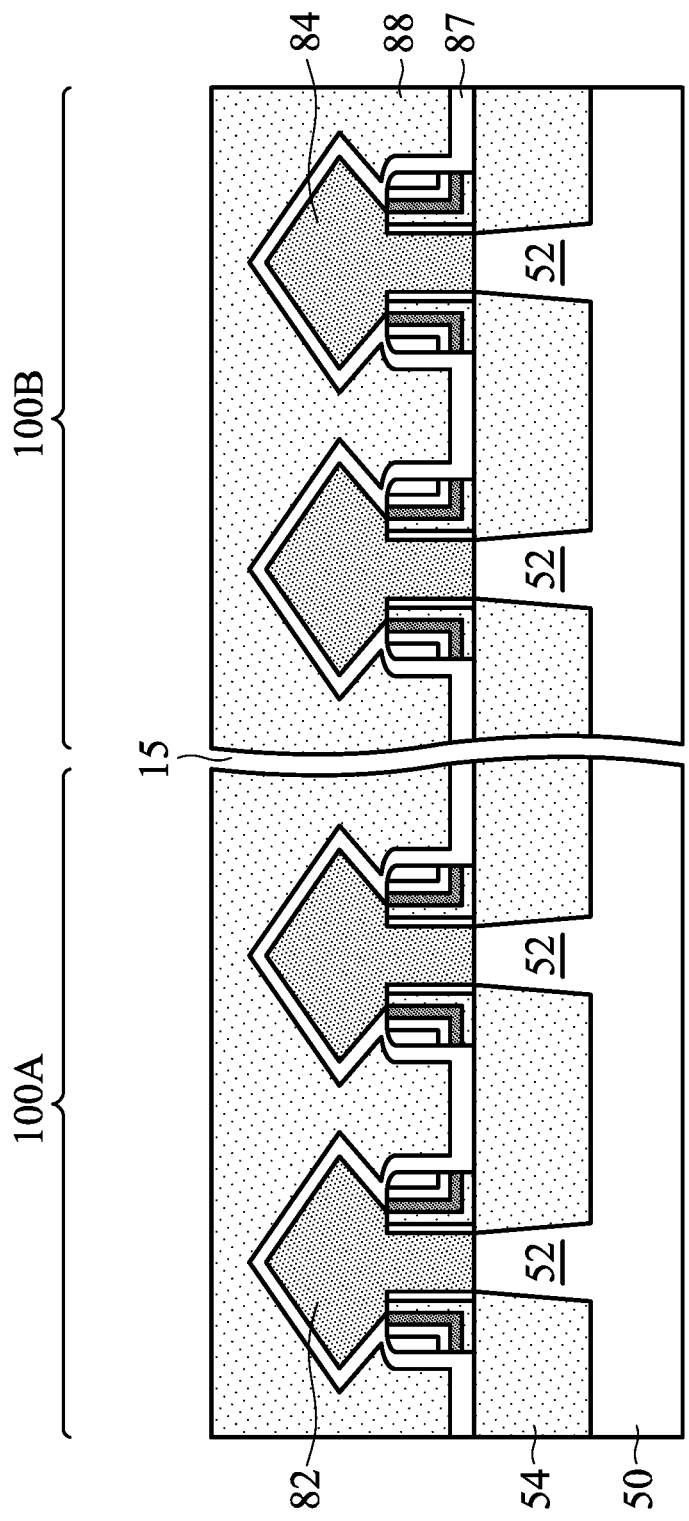

In FIGS. 23A through 23C, an etch stop layer 87 and an intermediate layer dielectric (ILD) 88 are deposited over the structure illustrated in FIGS. 13A-C through 18. In an embodiment, the ILD 88 is a flowable film formed by a flowable CVD. In some embodiments, the ILD 88 is formed of a dielectric material such as Phospho-SilicateGlass (PSG), Boro-Silicate Glass (BSG), Boron-Doped Phospho-Silicate Glass (BPSG), undoped Silicate Glass (USG), or the like, and may be deposited by any suitable method, such as CVD, or PECVD.

Figure 24A:
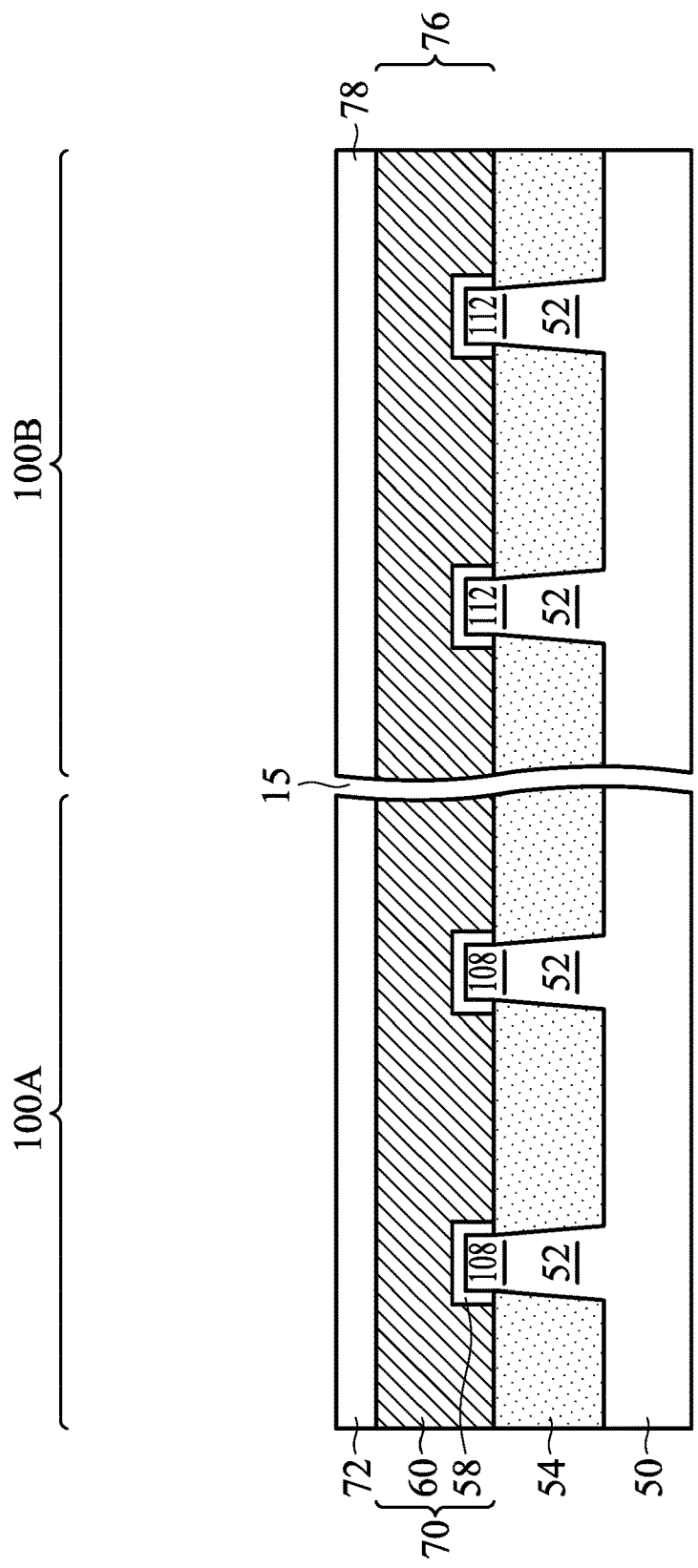
FIGS. 24A, 24B, and 24C are cross-sectional views of intermediate stages in the manufacture of a finFET device in accordance with some embodiments.
Figure 24B:
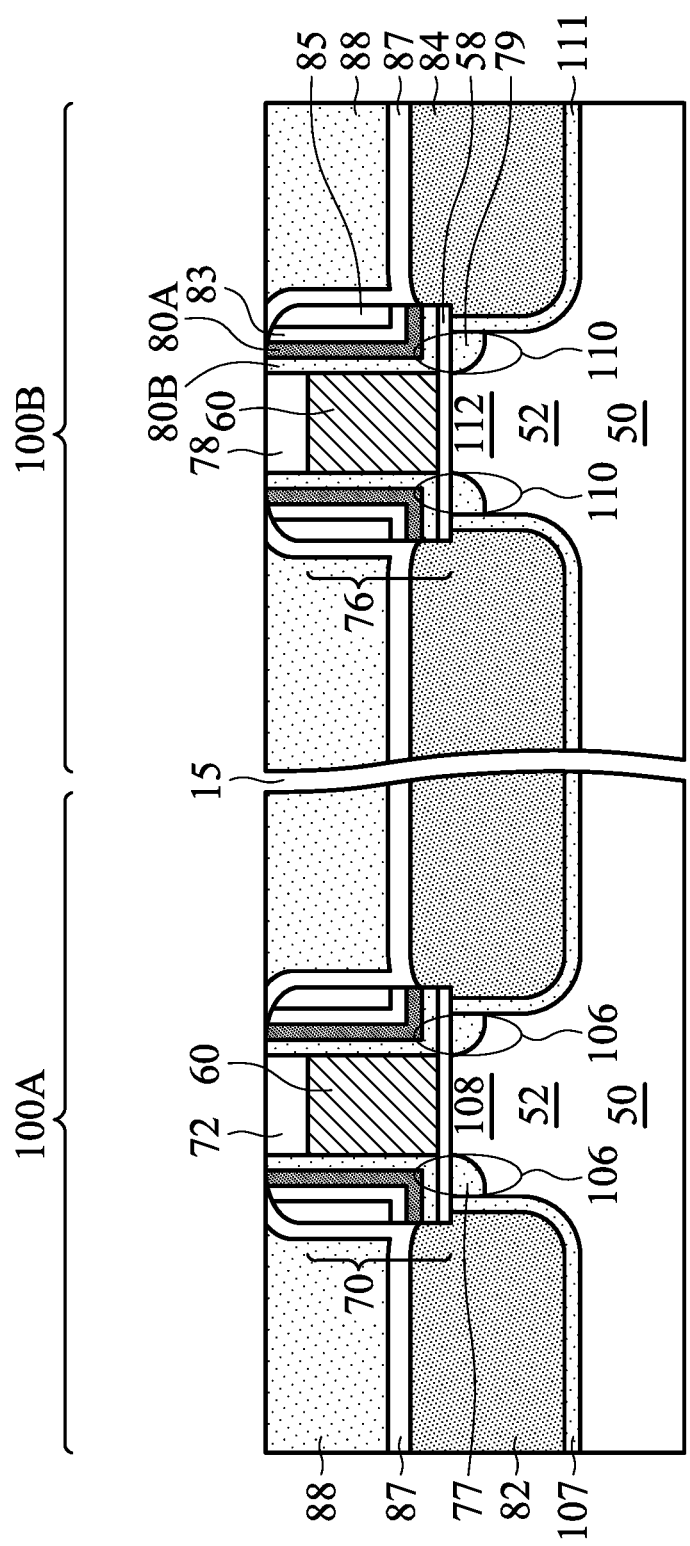
Figure 24C:
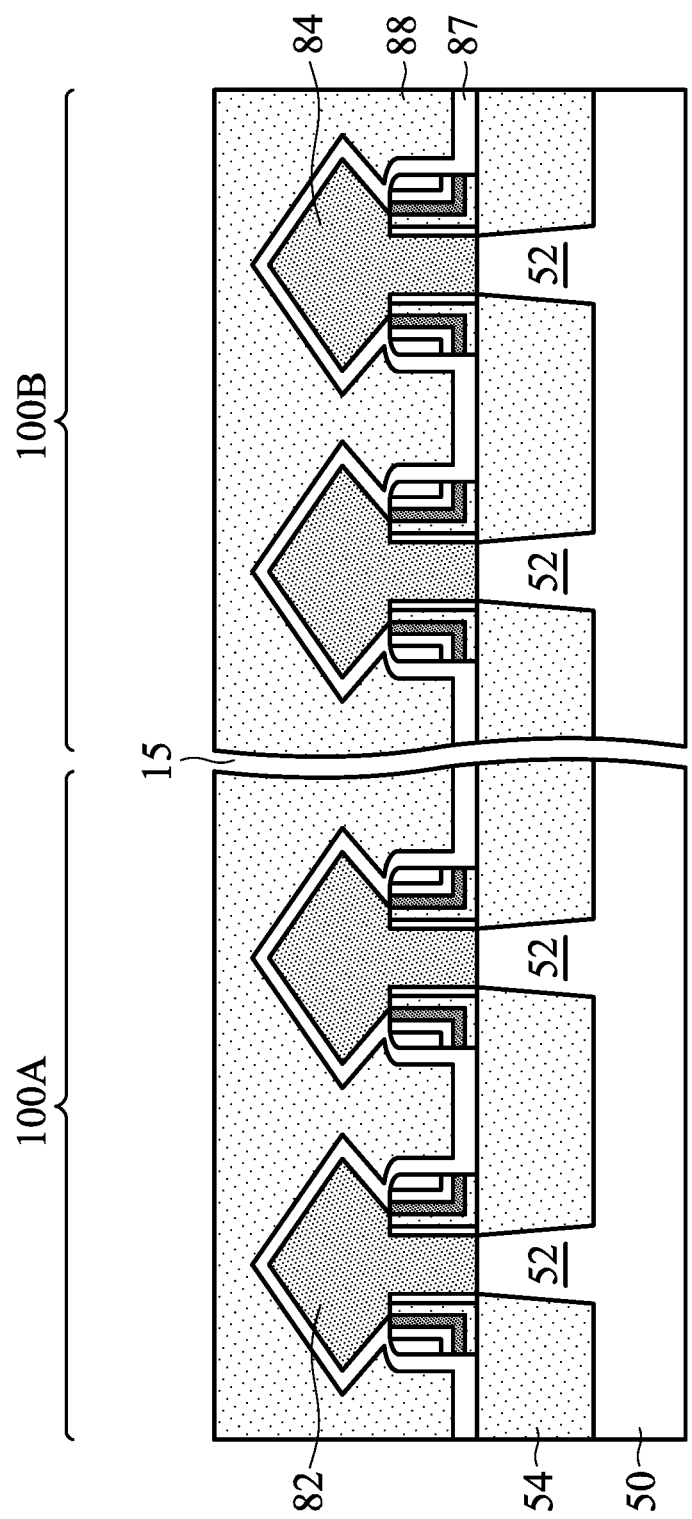

In FIGS. 24A through 24C, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may remove the masks 72 and 78 or portions thereof. In other embodiments, masks 72 and 78 may be removed before ILD 88 is deposited.

Figure 25A:
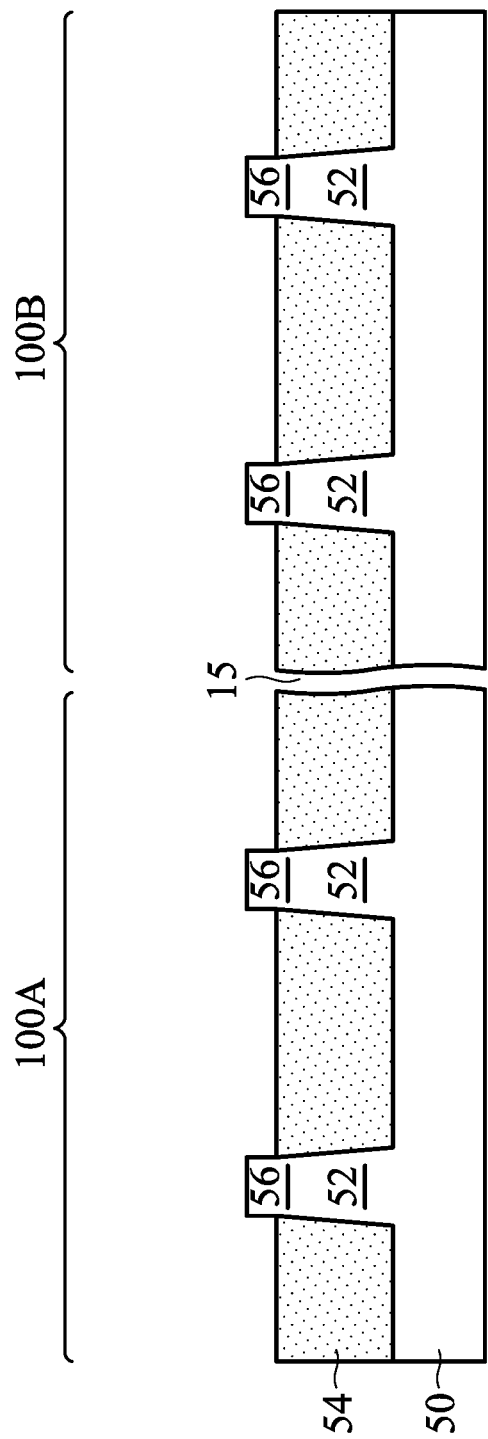
FIGS. 25A, 25B, and 25C are cross-sectional views of intermediate stages in the manufacture of a finFET device in accordance with some embodiments.
Figure 25B:
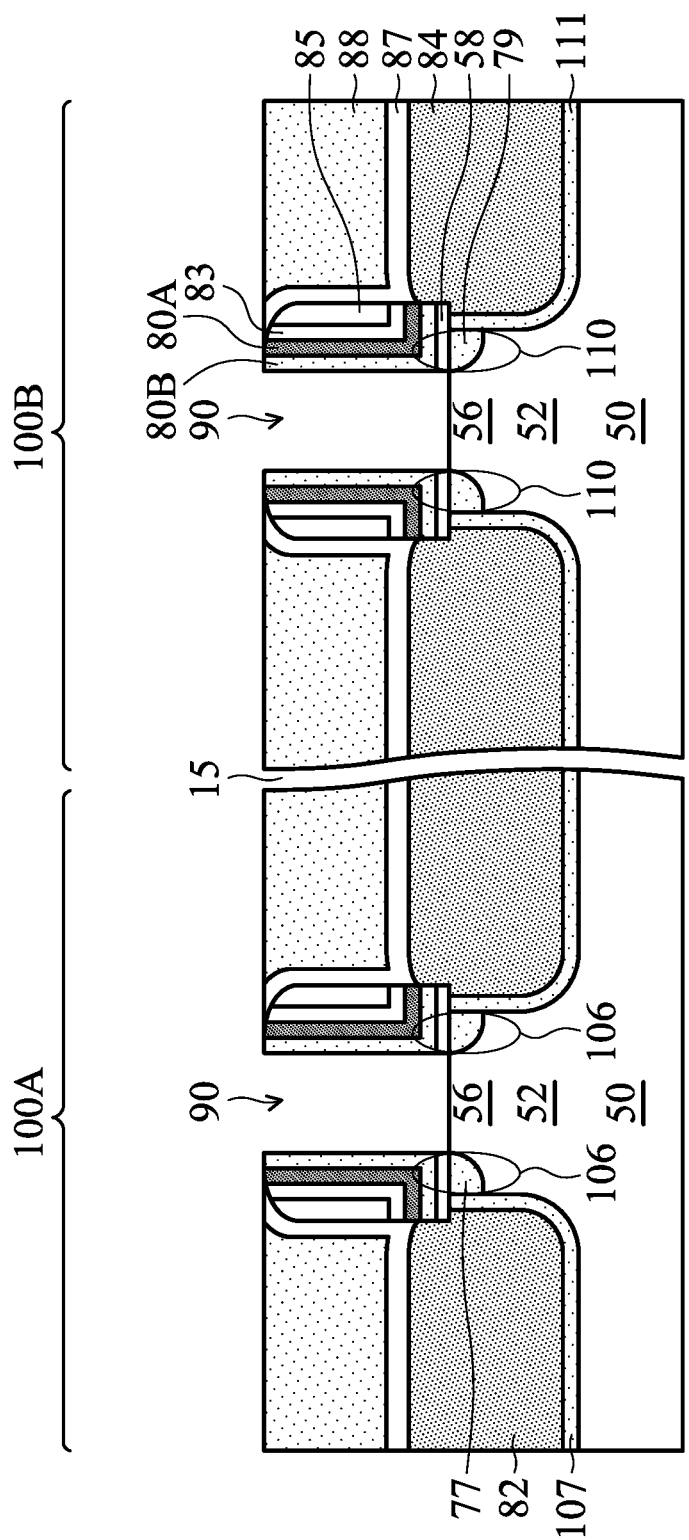
Figure 25C:
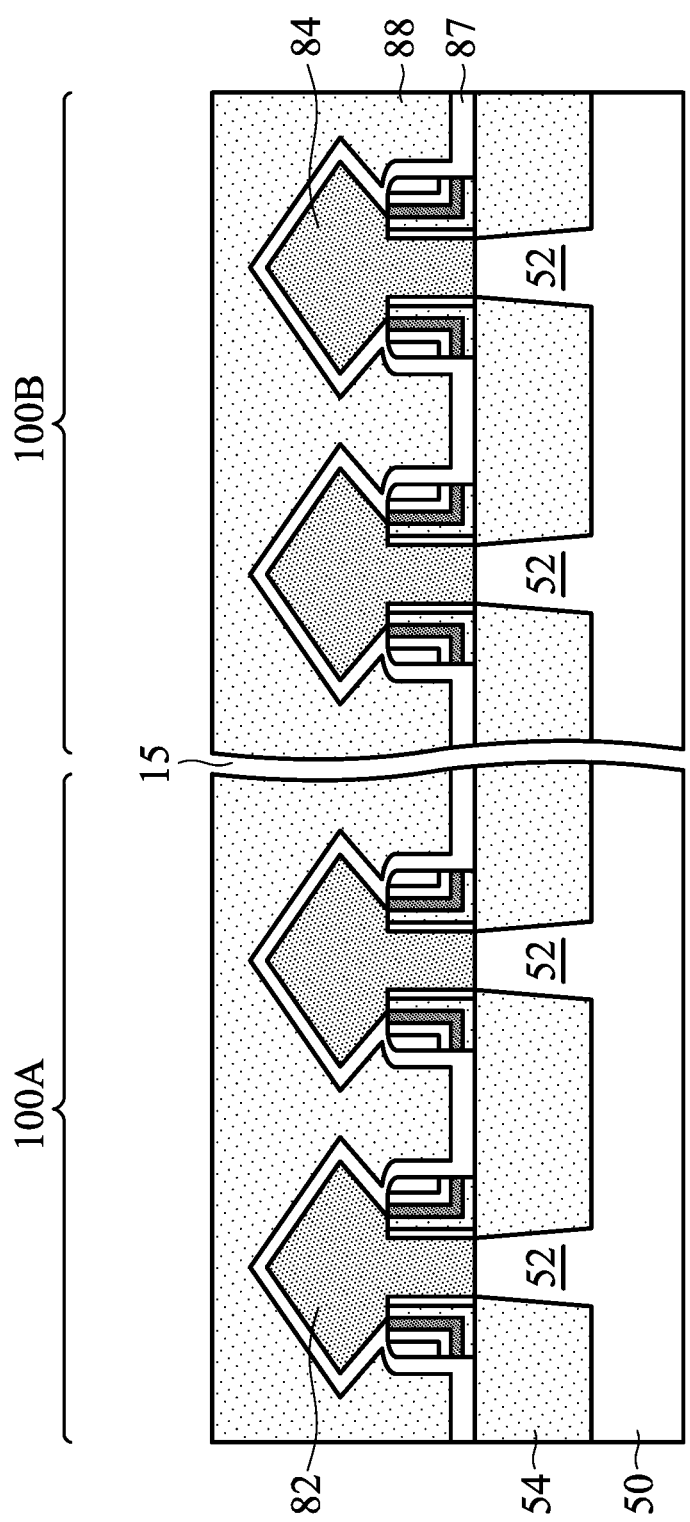

In FIGS. 25A through 25C, remaining portions of masks 72 and 78 and the dummy gates 70 and 76 are removed in an etching step(s), so that recesses 90 are formed. Each recess 90 exposes a channel region (e.g., the channel regions 108 and 112) of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 may then be removed after the removal of the dummy gates 70 and 76.

As discussed earlier, the carbon treatment 101 that was performed on first gate spacer 80 may strengthen carbon-doped first gate spacer 80 and create a thin carbon film 80A over first gate spacer 80. The carbon treatment 101 may help to protect epitaxial source/drain regions 82 and 84 during the removal of dummy gates 70 and 76, depicted in FIGS. 24A through 24C. For example, in some embodiments the dummy gates 70 and 76 are removed using a wet clean that utilizes a wet cleaning chemical, such as NH$_4$OH. Without carbon treatment 101, the wet cleaning chemical may penetrate through first gate spacer 80, second gate spacer 83 and third gate spacer 85 and damage epitaxial source/drain regions 82 and 84. Carbon treatment 101 may prevent or reduce damage to epitaxial source/drain regions 82 and 84 caused by a penetration of a wet cleaning chemical through the gate spacers. Therefore, in some embodiments, the source/drain regions may be free from defects or may have reduced defects as compared to a finFET that is formed using similar processes but without carbon treatment 101 on a gate spacer.

Figure 26A:
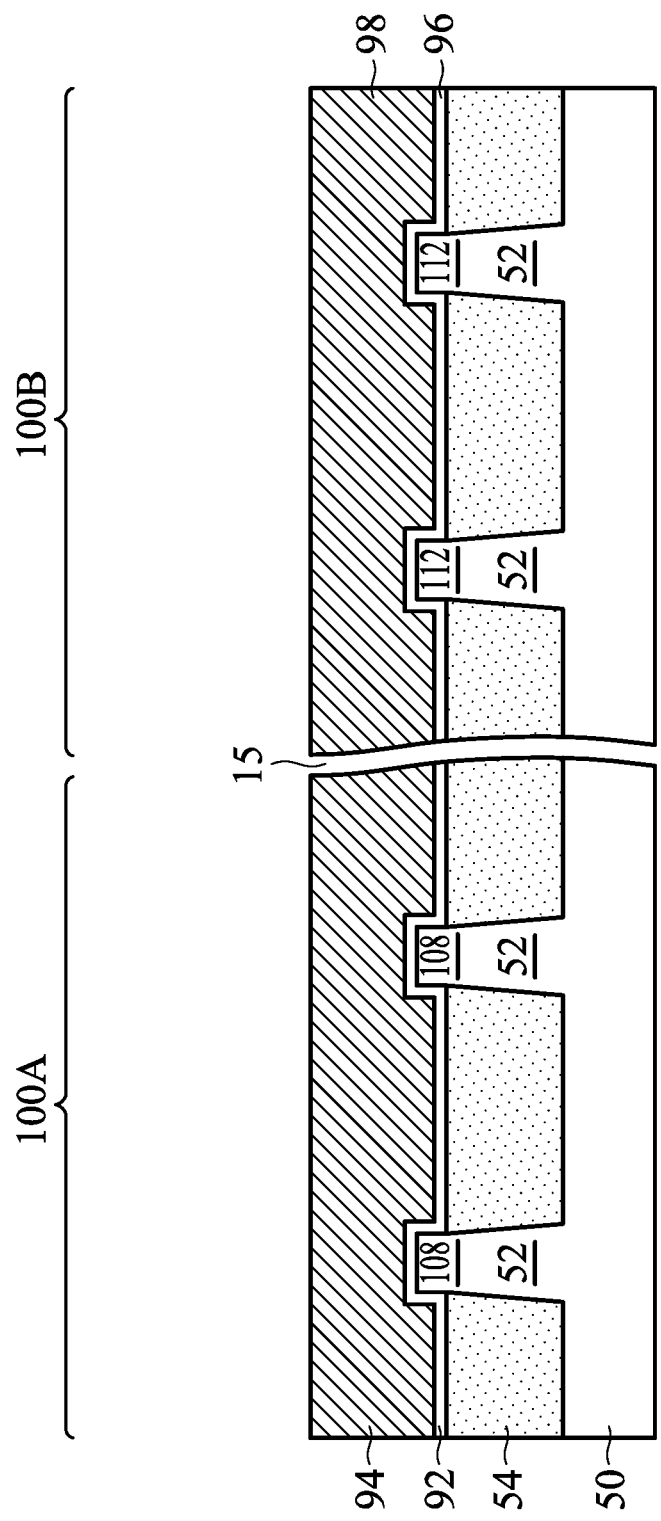
FIGS. 26A, 26B, and 26C are cross-sectional views of intermediate stages in the manufacture of a finFET device in accordance with some embodiments.
Figure 26B:
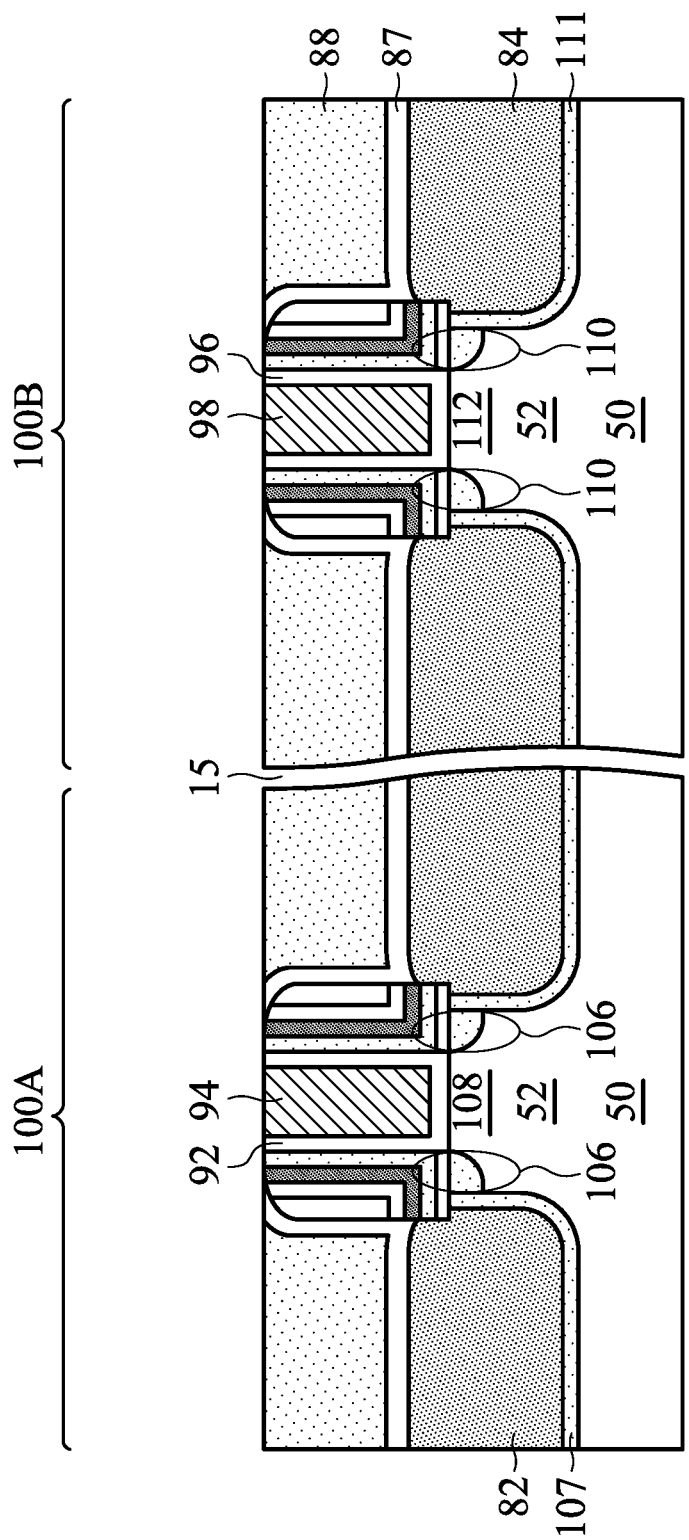
Figure 26C:
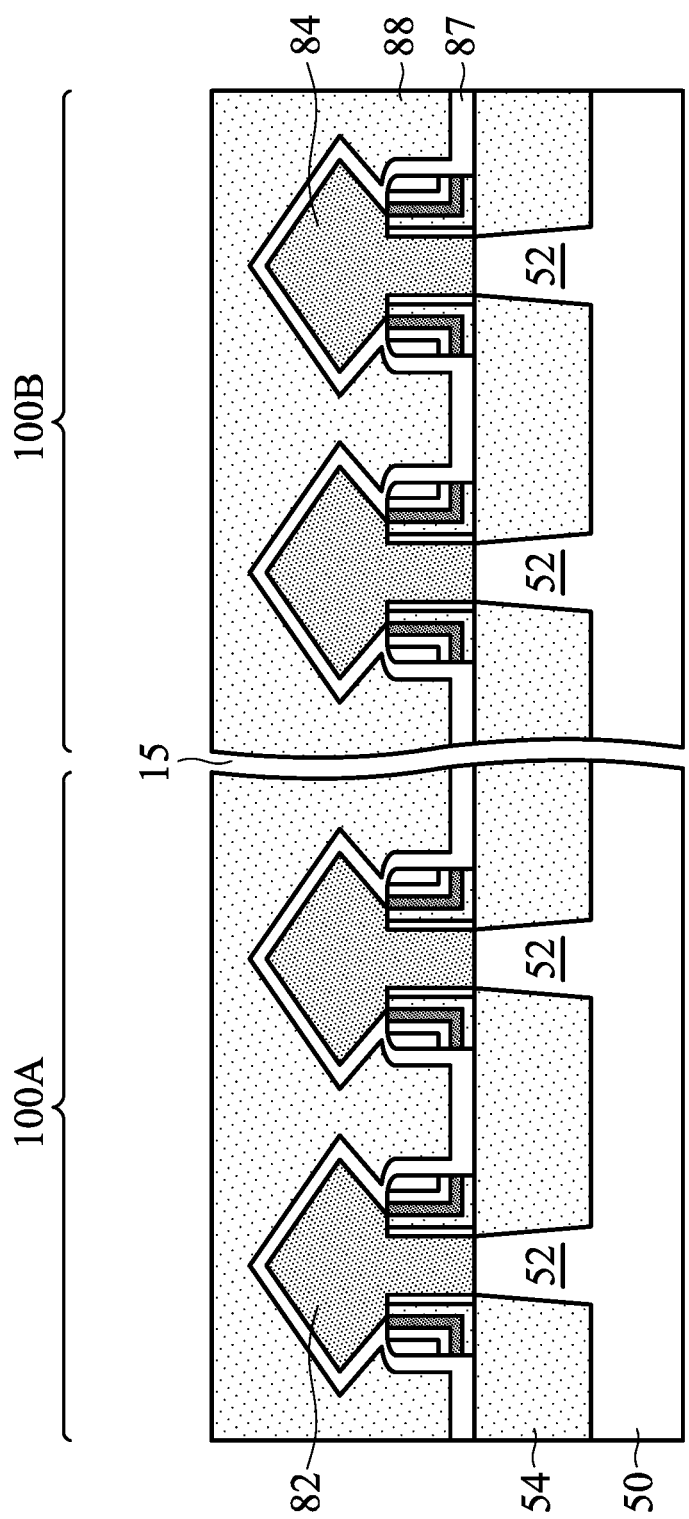

In FIGS. 26A through 26C, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multilayers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. In some embodiments, gate electrodes 94 and 98 may each include one or more barrier layers, work function layers, and/or work function tuning layers to tune the work function of the gate electrodes 94 and 98. After the filling of gate electrodes 94 and 98, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting finFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 28:
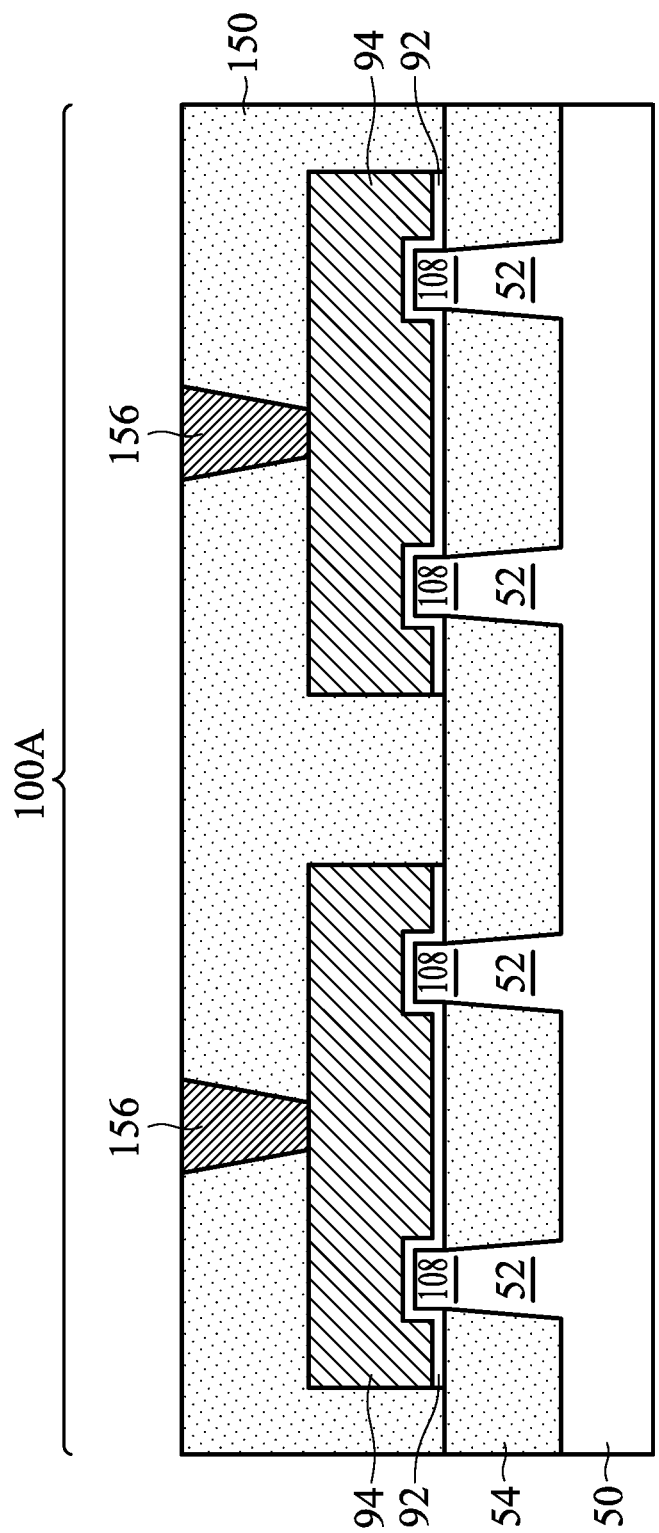
FIGS. 28 and 29 are cross-sectional views of intermediate stages in the manufacture of a finFET device in accordance with some embodiments
Figure 29:
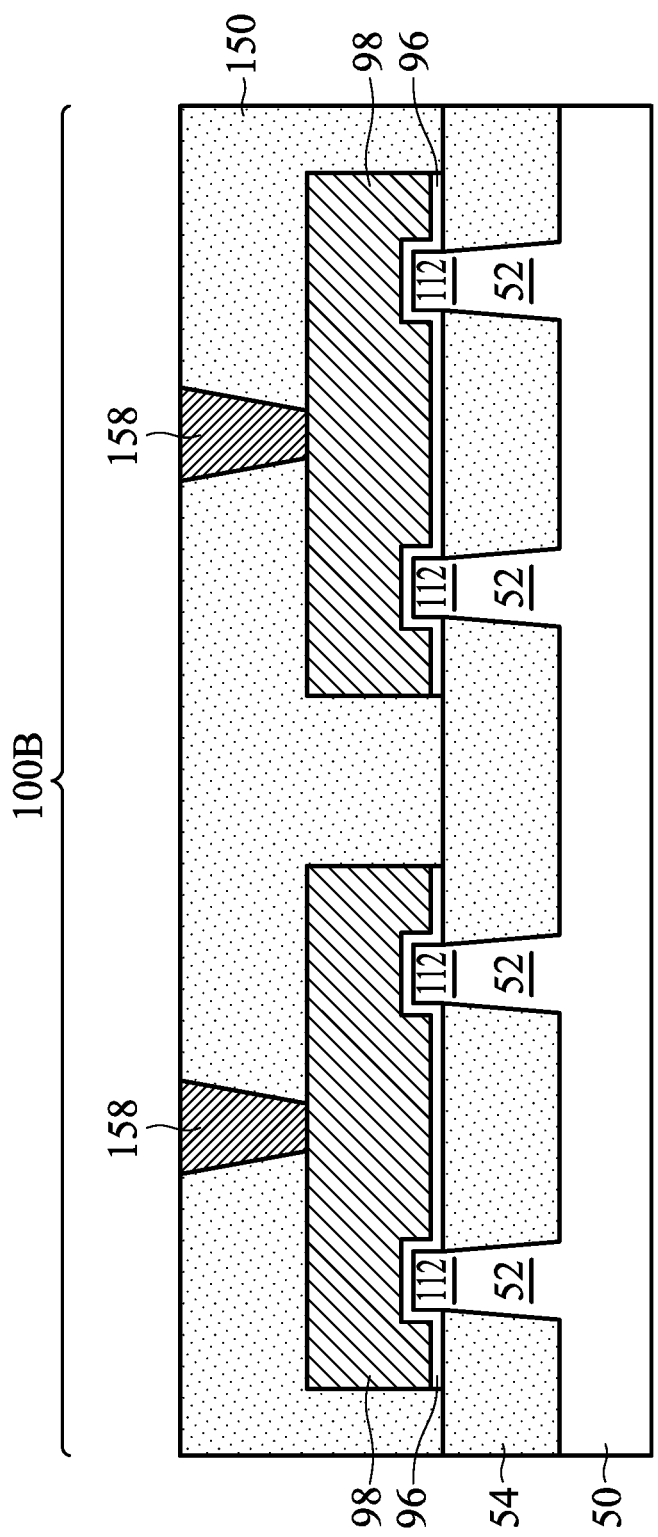

Furthermore, gate electrode 94 and gate dielectric layer 92 may be physically separated from gate stacks of adjacent finFET devices in region 100A (see e.g., FIG. 28). Similarly, gate electrode 98 and gate dielectric layer 96 may be physically separated from gate stacks of adjacent finFET devices in region 100B (see e.g., FIG. 29). In some embodiments, gate electrodes 94/98 and gate dielectric layers 92/96 may be formed to have a same pattern as dummy gate stacks 70/76 (see FIG. 7A). In such embodiments, gate electrodes 94/98 and gate dielectric layers 92/96 may be physically separated from adjacent gate stacks because dummy gate stacks 70/76 were previously patterned to be physically separated from adjacent dummy gate stacks as discussed above with respect to FIG. 7A. In other embodiments, a combination of photolithography and etching may be employed to pattern gate electrodes 94/98 and gate dielectric layers 92/96 after deposition.

Figure 27A:
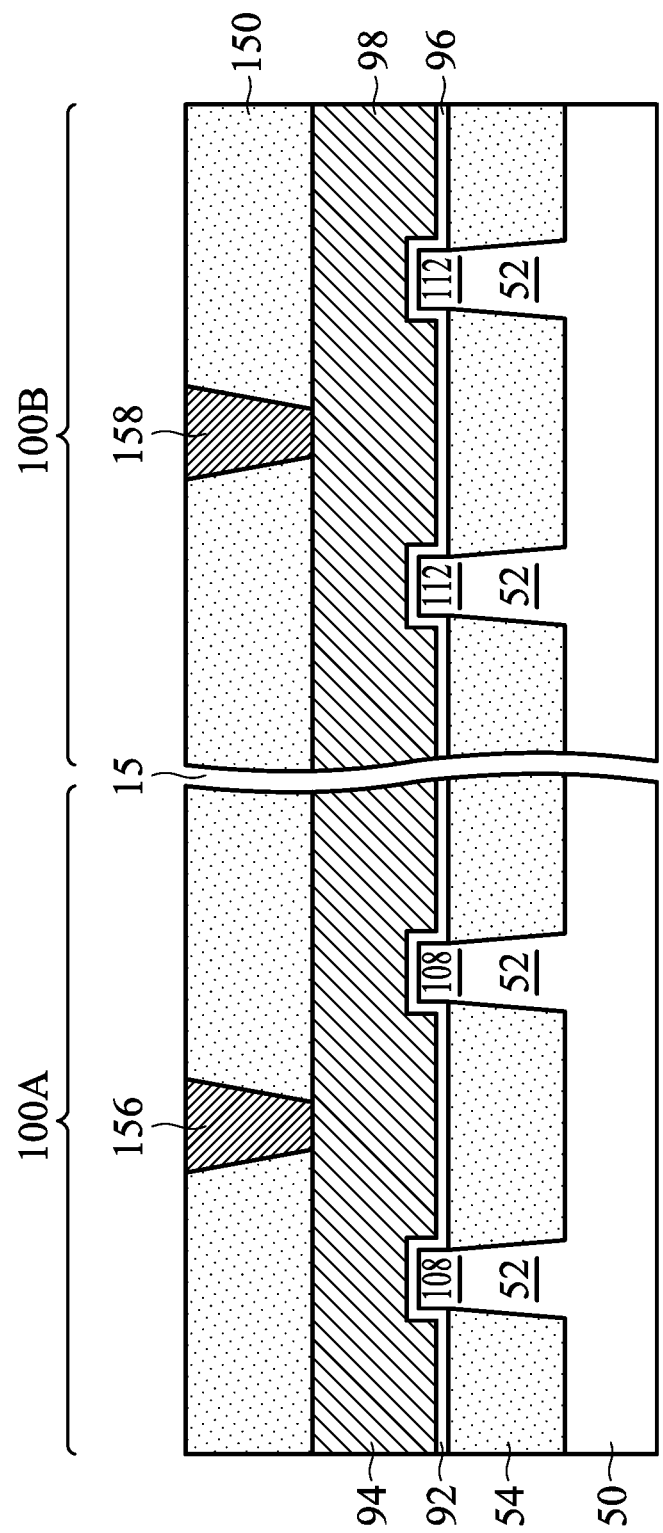
FIGS. 27A and 27B are cross-sectional views of intermediate stages in the manufacture of a finFET device in accordance with some embodiments.
Figure 27B:
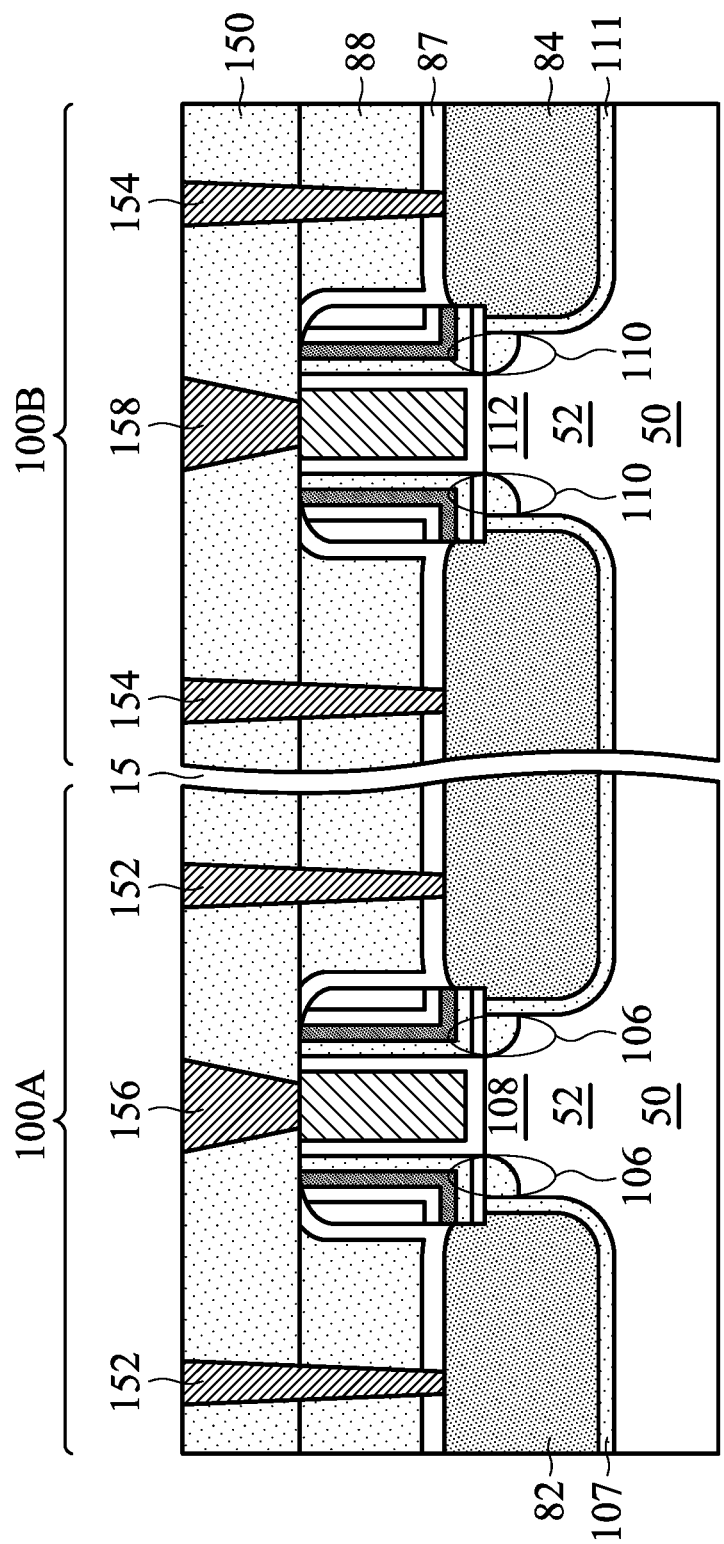

In FIGS. 27A through 27B, an ILD 150 is deposited over ILD 88. Further illustrated in FIGS. 27A through 27C, contacts 152 and 154 are formed through ILD 150 and ILD 88 and contacts 156 and 158 are formed through ILD 150. In an embodiment, the ILD 150 is a flowable film formed by a flowable CVD method. In some embodiments, the ILD 150 is formed of a dielectric material such as PSG, BSG, BPSG, USG, or the like, and may be deposited by any suitable method, such as CVD and PECVD. Openings for contacts 152 and 154 are formed through the ILDs 88 and 150. Openings for contacts 156 and 158 are formed through the ILD 150. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 150. The remaining liner and conductive material form contacts 152 and 154 in the openings. An anneal process may be performed to form a silicide at the interface between the epitaxial source/drain regions 82 and 84 and the contacts 152 and 154, respectively. Contacts 152 are physically and electrically coupled to the epitaxial source/drain regions 82, contacts 154 are physically and electrically coupled to the epitaxial source/drain regions 84, contact 156 is physically and electrically coupled to the gate electrode 94, and contact 158 is physically and electrically coupled to the gate electrode 98.

While contacts 152 and 154 are depicted in FIG. 27B in a same cross-section as contacts 156 and 158, this depiction is for purposes of illustration and in some embodiments contacts 152 and 154 are disposed in different cross-sections from contacts 156 and 158.

As discussed herein, a carbon treatment is performed on a gate spacer and/or along sidewalls and a bottom surface of one or more source/drain recesses. The carbon treatment may include conformal carbon plasma doping of the one or more gate spacers and/or along sidewalls and a bottom surface of one or more source/drain recesses. Thus, various embodiment methods may help provide carbon-doped regions disposed between and separating a channel region of a finFET device from an epitaxial source/drain region. The carbon doped region may help inhibit diffusion of impurities (e.g., n-type or p-type dopants) from the source/drain regions into the channel region and/or the underlying bulk substrate. Thus, device performance (e.g., AC electrical performance, such as switching speed, parasitic capacitance, reduced short channel effects, reduced leakage, or the like) can be improved. For example, by inhibiting diffusion of impurities, defects at source/drain and channel junctions can be reduced, which reduces the probability of leakage paths particularly in finely pitched devices. Furthermore, carbon-doping of gate spacers may further increase the etch selectivity of the spacer relative a dummy gate during gate replacement processes, which may result in fewer spacer defects and increased yield.

In accordance with an embodiment, a method includes depositing a dummy gate over and along sidewalls of a fin extending upwards from a semiconductor substrate, forming a first gate spacer along a sidewall of the dummy gate, and plasma-doping the first gate spacer with carbon to form a carbon-doped gate spacer. The method further includes forming a source/drain region adjacent a channel region of the fin and diffusing carbon from the carbon-doped gate spacer into a first region of the fin to provide a first carbon-doped region. The first carbon-doped region is disposed between at least a portion of the source/drain region and the channel region of the fin.

In accordance with an embodiment, a method includes forming a dummy gate stack over and along sidewalls of a channel region of a semiconductor fin, etching a recess in the semiconductor fin, carbon doping sidewalls and a bottom surface of the recess to provide a first carbon-doped region in the semiconductor fin, and epitaxially growing an epitaxial source/drain region in the recess. The first carbon-doped region is disposed between a sidewall of the epitaxial source/drain region in the recess and the channel region of the semiconductor fin.

In accordance with an embodiment, a fin field effect transistor (finFET) device includes a fin extending upwards from a semiconductor substrate, a gate stack over and along sidewalls of a channel region of the fin, a source/drain region adjacent the fin, and a gate spacer disposed along a sidewall of the gate stack. The finFET device further includes a first carbon-doped region disposed along a bottom surface and a sidewall of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a dummy gate over and along sidewalls of a fin extending upwards from a semiconductor substrate;
forming a first gate spacer along a sidewall of the dummy gate;
plasma-doping the first gate spacer with carbon to form a carbon-doped gate spacer;
forming a source/drain region adjacent a channel region of the fin; and
diffusing carbon from the carbon-doped gate spacer into a first region of the fin to provide a first carbon-doped region, wherein the first carbon-doped region is disposed between at least a portion of the source/drain region and the channel region of the fin.

2. The method of claim 1, wherein forming the source/drain region comprises etching a second region of the fin to provide a recess adjacent the first region of the fin, wherein the method further comprises plasma-doping the recess with carbon to form a second carbon-doped region along sidewalls and a bottom surface of the recess.

3. The method of claim 2, wherein plasma-doping the recess with carbon further deposits a carbon film along the sidewalls and over the bottom surface of the recess, and wherein the method further comprises removing the carbon film using a cleaning process.

4. The method of claim 2 further comprising after plasma-doping the recess, epitaxially growing the source/drain region in the recess, wherein the second carbon-doped region is disposed along sidewalls and a bottom surface of the source/drain region.

5. The method of claim 1, wherein diffusing carbon from the carbon-doped gate spacer into the first region comprises annealing the carbon-doped gate spacer.

6. The method of claim 5, wherein diffusing carbon from the carbon-doped gate spacer into the first region comprises annealing the carbon-doped gate spacer after forming the source/drain region.

7. The method of claim 1 further comprising replacing the dummy gate with a functional gate stack disposed over and along sidewalls of the channel region of the fin.

8. The method of claim 1 further comprising forming a lightly-doped drain region at an upper surface of the first region, wherein the method further comprises diffusing the carbon from the carbon-doped gate spacer into the lightly-doped drain region so that the first carbon-doped region is at least partially disposed in the lightly-doped drain region.

9. A method comprising:
forming a dummy gate stack over and along sidewalls of a channel region of a semiconductor fin;
etching a recess in the semiconductor fin;
carbon doping sidewalls and a bottom surface of the recess to provide a first carbon-doped region in the semiconductor fin, wherein carbon doping the sidewalls and the bottom surface of the recess comprises a carbon plasma doping process; and
epitaxially growing a source/drain region in the recess, wherein the first carbon-doped region is disposed between a sidewall of the source/drain region in the recess and the channel region of the semiconductor fin.

10. The method of claim 9, wherein the first carbon-doped region is disposed along the sidewall and a bottom surface of the source/drain region.

11. The method of claim 9, wherein carbon doping the sidewalls and the bottom surface of the recess deposits a carbon film along the sidewalls and the bottom surface of the recess.

12. The method of claim 11 further comprising prior to epitaxially growing the source/drain region in the recess, removing the carbon film.

13. The method of claim 9 further comprising:
depositing a spacer over and along sidewalls of the dummy gate stack; and
carbon plasma doping the spacer to form a carbon-doped spacer along sidewalls of the dummy gate stack and over the semiconductor fin.

14. The method of claim 13 further comprising annealing the carbon-doped spacer to diffuse carbon into the semiconductor fin and provide a second carbon-doped region, wherein the second carbon-doped region is disposed between the channel region and the sidewall of the source/drain region.

15. The method of claim 14, wherein annealing the carbon-doped spacer is performed after epitaxially growing the source/drain region, wherein the second carbon-doped region is further disposed between the first carbon-doped region and the channel region.

16. A method of forming a fin field effect transistor (finFET) device, the method comprising:
  patterning a fin extending upwards from a semiconductor substrate;
  forming a first gate stack over and along sidewalls of a channel region of the fin;
  depositing a first gate spacer layer along a sidewall of the first gate stack;
  diffusing carbon from the first gate spacer layer into the channel region of the fin;
  patterning a recess adjacent the channel region;
  carbon doping a sidewall of the recess;
  epitaxially growing a source/drain region in the recess; and
  replacing the first gate stack with a second gate stack.

17. The method of claim 16 further comprising carbon doping the first gate spacer layer after depositing the first gate spacer layer along the sidewall of the first gate stack.

18. The method of claim 16, wherein carbon doping the sidewall of the recess deposits a carbon film along the sidewall of the recess, and wherein the method further comprises removing the carbon film.

19. The method of claim 16 further comprising carbon doping a bottom surface of the recess simultaneously with carbon doping the sidewall of the recess.

20. The method of claim 11, wherein the carbon plasma doping process deposits the carbon film along the sidewalls and the bottom surface of the recess.

\* \* \* \* \*